United States Patent
Yoneda et al.

(10) Patent No.: US 9,685,476 B2
(45) Date of Patent: Jun. 20, 2017

(54) IMAGING DEVICE AND ELECTRONIC DEVICE

(71) Applicant: Semiconductor Energy Laboratory Co., Ltd., Atsugi-shi, Kanagawa-ken (JP)

(72) Inventors: Seiichi Yoneda, Isehara (JP); Takuro Ohmaru, Kasuya (JP); Yuki Okamoto, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/083,755

(22) Filed: Mar. 29, 2016

(65) Prior Publication Data

US 2016/0293655 A1    Oct. 6, 2016

(30) Foreign Application Priority Data

Apr. 3, 2015   (JP) ................. 2015-076420

(51) Int. Cl.
*H01L 27/146*    (2006.01)
*H01L 29/786*    (2006.01)
*H01L 31/0272*    (2006.01)

(52) U.S. Cl.
CPC .. *H01L 27/14643* (2013.01); *H01L 27/14614* (2013.01); *H01L 27/14616* (2013.01); *H01L 27/14636* (2013.01); *H01L 27/14641* (2013.01); *H01L 27/14665* (2013.01); *H01L 29/7869* (2013.01); *H01L 31/0272* (2013.01)

(58) Field of Classification Search
CPC .. H01L 27/146; H01L 29/786; H01L 31/0272
See application file for complete search history.

(56) References Cited

U.S. PATENT DOCUMENTS

| | | | |
|---|---|---|---|
| 7,663,165 | B2 | 2/2010 | Mouli |
| 7,674,650 | B2 | 3/2010 | Akimoto et al. |
| 7,732,819 | B2 | 6/2010 | Akimoto et al. |
| 7,910,490 | B2 | 3/2011 | Akimoto et al. |
| 7,932,521 | B2 | 4/2011 | Akimoto et al. |

(Continued)

FOREIGN PATENT DOCUMENTS

| | | |
|---|---|---|
| JP | 2007-096055 A | 4/2007 |
| JP | 2007-123861 A | 5/2007 |
| JP | 2011-119711 A | 6/2011 |

*Primary Examiner* — Julia Slutsker
*Assistant Examiner* — Dmitriy Yemelyanov
(74) *Attorney, Agent, or Firm* — Robinson Intellectual Property Law Office; Eric J. Robinson

(57) ABSTRACT

To provide an imaging device capable of high-speed reading. The imaging device includes a photodiode, a first transistor, a second transistor, a third transistor, and a fourth transistor. The back gate electrode of the first transistor is electrically connected to a wiring that can supply a potential higher than a source potential of the first transistor and a potential lower than the source potential of the first transistor. The back gate electrode of the second transistor is electrically connected to a wiring that can supply a potential higher than a source potential of the second transistor. The back gate electrode of the third transistor is electrically connected to a wiring that can supply a potential higher than a source potential of the third transistor and a potential lower than the source potential of the third transistor.

21 Claims, 39 Drawing Sheets

(56) References Cited

U.S. PATENT DOCUMENTS

| | | |
|---|---|---|
| 8,274,077 B2 | 9/2012 | Akimoto et al. |
| 8,378,391 B2 | 2/2013 | Koyama et al. |
| 8,466,463 B2 | 6/2013 | Akimoto et al. |
| 8,581,170 B2 | 11/2013 | Kurokawa |
| 8,586,905 B2 | 11/2013 | Kurokawa |
| 8,629,069 B2 | 1/2014 | Akimoto et al. |
| 8,669,550 B2 | 3/2014 | Akimoto et al. |
| 8,790,959 B2 | 7/2014 | Akimoto et al. |
| 8,796,069 B2 | 8/2014 | Akimoto et al. |
| 8,916,869 B2 | 12/2014 | Koyama et al. |
| 9,024,248 B2 | 5/2015 | Kurokawa |
| 9,099,562 B2 | 8/2015 | Akimoto et al. |
| 9,117,713 B2 | 8/2015 | Koyama |
| 9,236,408 B2 | 1/2016 | Yamazaki |
| 9,331,112 B2 | 5/2016 | Koyama et al. |
| 9,443,893 B2 | 9/2016 | Yamazaki |
| 9,524,993 B2 | 12/2016 | Kurokawa |
| 2008/0308805 A1 | 12/2008 | Akimoto et al. |
| 2010/0279474 A1* | 11/2010 | Akimoto ............. H01L 29/7869 438/158 |
| 2011/0058116 A1* | 3/2011 | Yamazaki ........... H01L 27/1225 349/43 |
| 2011/0104851 A1 | 5/2011 | Akimoto et al. |
| 2011/0121290 A1 | 5/2011 | Akimoto et al. |
| 2014/0061739 A1 | 3/2014 | Kurokawa |
| 2014/0246670 A1 | 9/2014 | Koyama |
| 2015/0048366 A1 | 2/2015 | Koyama et al. |
| 2015/0060675 A1* | 3/2015 | Akimoto ........... H01L 27/14663 250/361 R |
| 2015/0236061 A1 | 8/2015 | Kurokawa |
| 2016/0104734 A1 | 4/2016 | Hirose et al. |
| 2016/0233252 A1 | 8/2016 | Koyama et al. |

\* cited by examiner

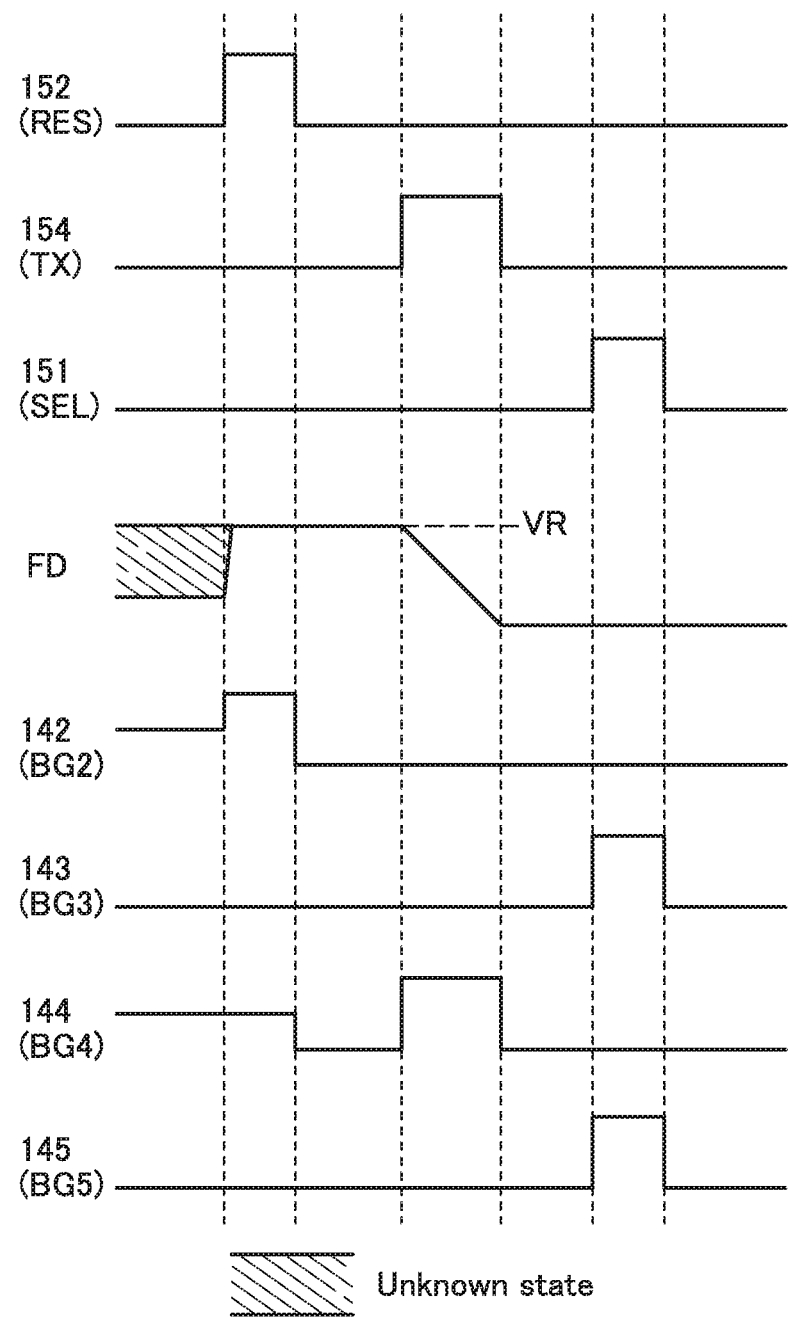

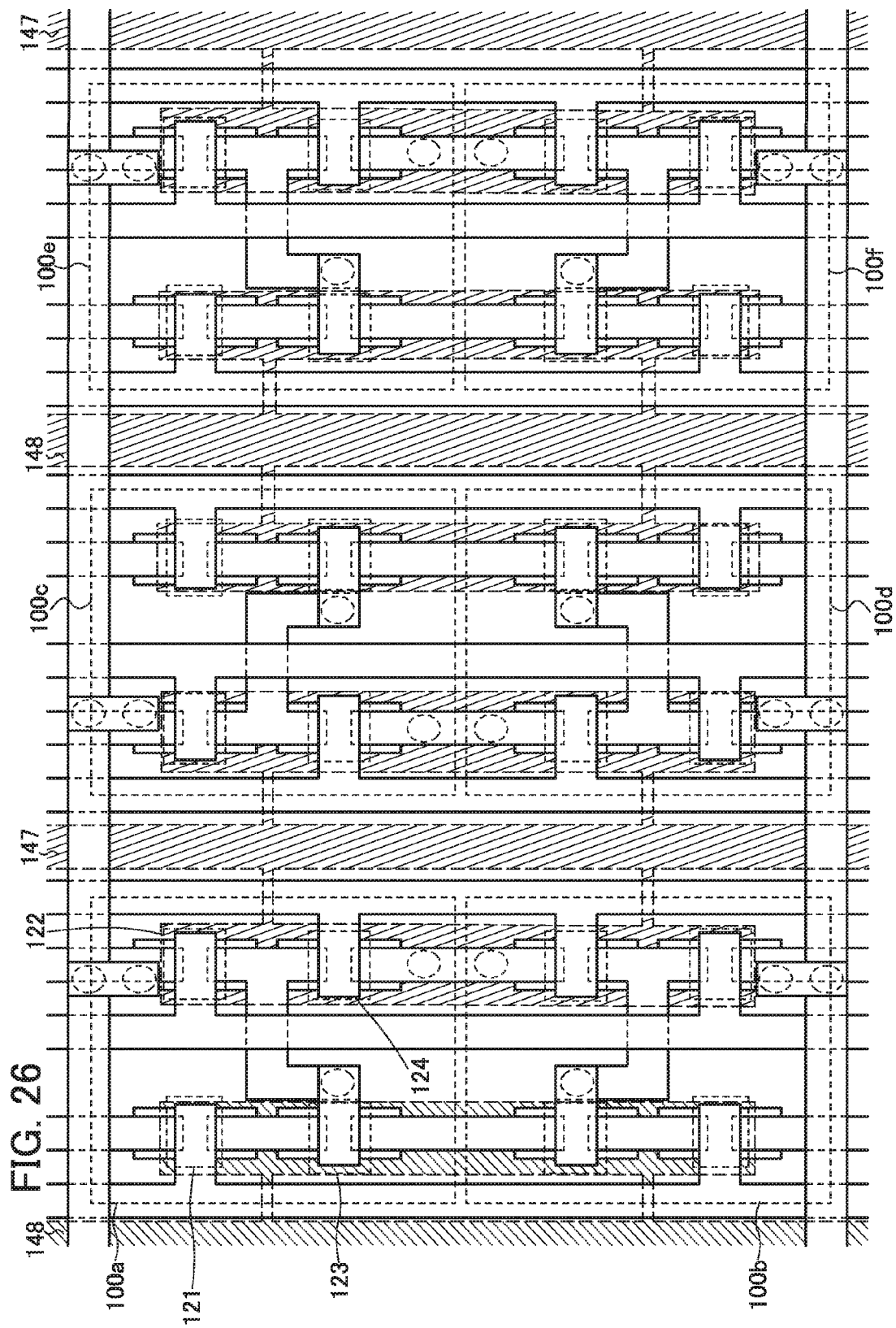

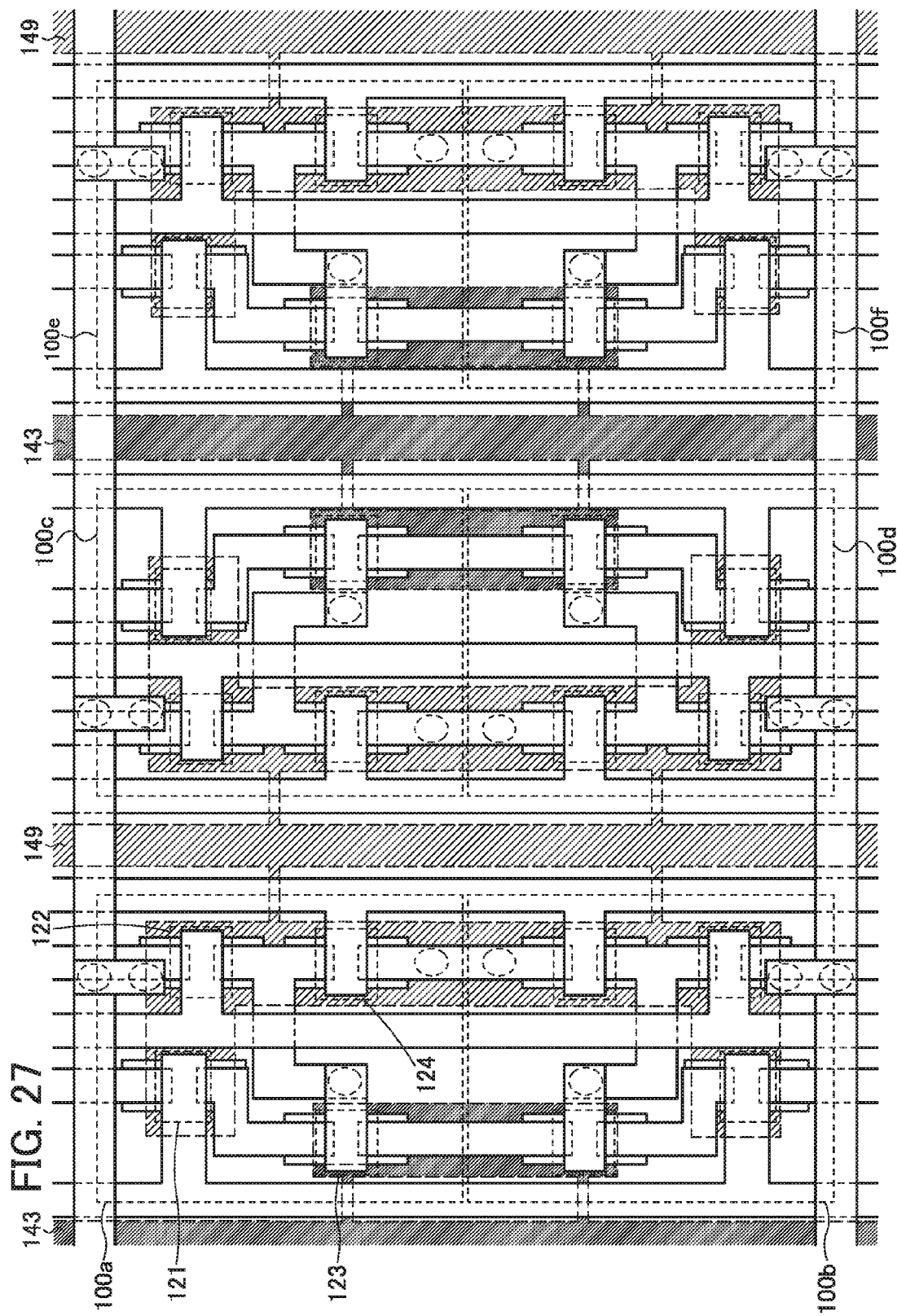

FIG. 29A1
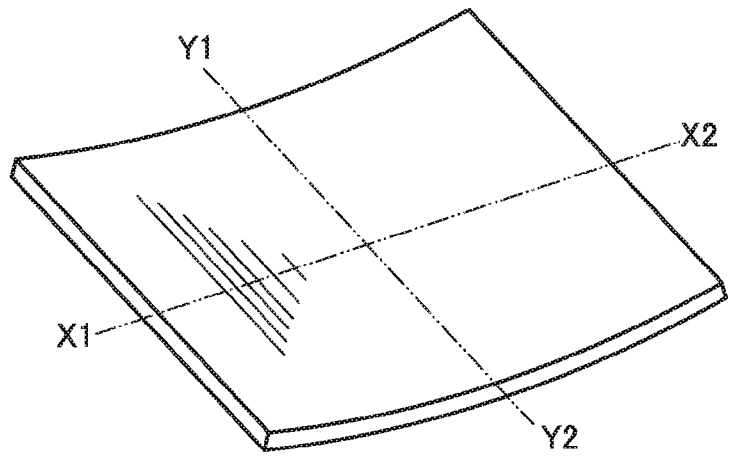
FIG. 29A2
FIG. 29A3
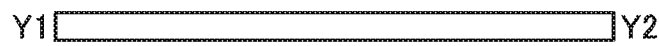
FIG. 29B1
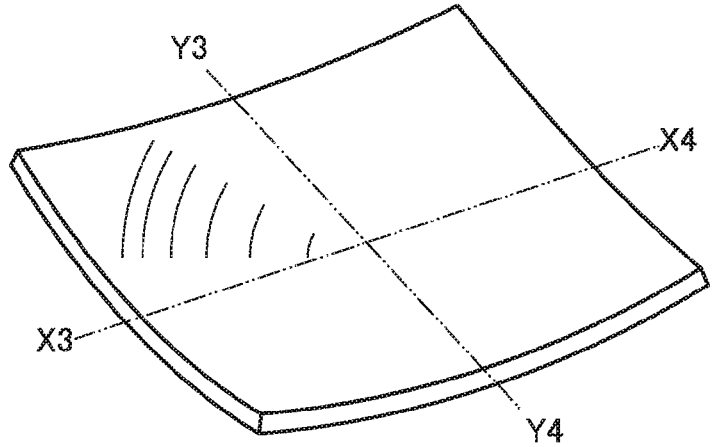
FIG. 29B2
FIG. 29B3

IMAGING DEVICE AND ELECTRONIC DEVICE

BACKGROUND OF THE INVENTION

1. Field of the Invention

One embodiment of the present invention relates to an imaging device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, an imaging device, a method for driving any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a storage device, a display device, an imaging device, or an electronic device includes a semiconductor device.

2. Description of the Related Art

A technique by which transistors are formed using semiconductor thin films formed over a substrate having an insulating surface has been attracting attention. The transistor is used in a wide range of electronic devices such as an integrated circuit (IC) or an image display device (also simply referred to as a display device). As semiconductor thin films applicable to the transistors, silicon-based semiconductor materials have been widely used, but oxide semiconductors have been attracting attention as alternative materials.

For example, a technique for forming a transistor using zinc oxide or an In—Ga—Zn-based oxide semiconductor as an oxide semiconductor is disclosed (see Patent Documents 1 and 2).

Patent Document 3 discloses that a transistor including an oxide semiconductor and having an extremely low off-state current is used in at least part of a pixel circuit and a transistor including a silicon semiconductor with which a complementary metal oxide semiconductor (CMOS) circuit can be formed is used in a peripheral circuit, whereby an imaging device with high-speed operation and a long signal holding period can be manufactured.

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2011-119711

SUMMARY OF THE INVENTION

As the number of pixels in an imaging device has been increased and high-speed frame rate has been required, the necessity of high-speed reading of pixel data has been increasing. Furthermore, an imaging device with low power consumption has been desired.

An object of one embodiment of the present invention is to provide an imaging device that is suitable for high-speed operation. Another object of one embodiment of the present invention is to provide an imaging device with a long signal holding period. Another object of one embodiment of the present invention is to provide an imaging device with a low power consumption. Another object of one embodiment of the present invention is to provide an imaging device with high definition. Another object of one embodiment of the present invention is to provide an imaging device with high sensitivity. Another object of one embodiment of the present invention is to provide an imaging device with a wide dynamic range. Another object of one embodiment of the present invention is to provide an imaging device with high resolution. Another object of one embodiment of the present invention is to provide an imaging device formed at low cost. Another object of one embodiment of the present invention is to provide an imaging device with high reliability. Another object of one embodiment of the present invention is to provide a novel imaging device and the like. Another object of one embodiment of the present invention is to provide a novel semiconductor device and the like.

Note that the descriptions of these objects do not disturb the existence of other objects. In one embodiment of the present invention, there is no need to achieve all the objects. Objects other than the above objects will be apparent from and can be derived from the descriptions of the specification, the drawings, the claims, and the like.

One embodiment of the present invention is an imaging device including a plurality of pixels each including a photodiode, a first transistor, a second transistor, a third transistor, and a fourth transistor. One of a source electrode and a drain electrode of the first transistor is electrically connected to one electrode of the photodiode. The other of the source electrode and the drain electrode of the first transistor is electrically connected to a gate electrode of the second transistor and one of a source electrode and a drain electrode of the third transistor. One of a source electrode and a drain electrode of the second transistor is electrically connected to one of a source electrode and a drain electrode of the fourth transistor.

The first transistor, the second transistor, and the third transistor each include a back gate electrode. The back gate electrode of the first transistor is electrically connected to a wiring that can switch and supply a potential higher than a source potential of the first transistor and a potential lower than the source potential of the first transistor. The back gate electrode of the third transistor is electrically connected to a wiring that can switch and supply a potential higher than a source potential of the third transistor and a potential lower than the source potential of the third transistor. The back gate electrode of the second transistor is electrically connected to a wiring that can supply a potential higher than a source potential of the second transistor.

The back gate electrodes of the first transistor and the third transistor may be electrically connected to a first wiring, and the back gate electrode of the second transistor may be electrically connected to a second wiring. The first wiring may be shared among the pixels arranged in the same row or column and the pixels arranged in one of the two adjacent rows or columns. The second wiring may be shared among the pixels arranged in the same row or column and the pixels arranged in one of the two adjacent rows or columns.

The first wiring may be shared among the pixels arranged in the same row or column and the pixels which are arranged in one of the two adjacent rows or columns and provided on a side which is not interposed between the second transistors when seen from above or below. The second wiring may be shared among the pixels arranged in the same row or column and the pixels which are arranged in one of the two adjacent rows or columns and provided on a side which is not interposed between the first transistors and between the third transistors when seen from above or below.

The fourth transistor may include a back gate electrode. The back gate electrode may be electrically connected to a wiring that can supply a potential higher than a source potential of the fourth transistor.

The back gate electrodes of the first transistor and the third transistor may be electrically connected to the first wiring, and the back gate electrodes of the second transistor and the fourth transistor may be electrically connected to the second wiring. The first wiring may be shared among the pixels arranged in the same row or column and the pixels arranged in one of the two adjacent rows or columns. The second wiring may be shared among the pixels arranged in the same row or column and the pixels arranged in one of the two adjacent rows or columns.

The first wiring may be shared among the pixels arranged in the same row or column and the pixels which are arranged in one of the two adjacent rows or columns and provided on a side which is not interposed between the second transistors and between the fourth transistors when seen from above or below. The second wiring may be shared among the pixels arranged in the same row or column and the pixels which are arranged in one of the two adjacent rows or columns and provided on a side which is not interposed between the first transistors and between the third transistors when seen from above or below.

The back gate electrodes of the first transistor, the third transistor, and the fourth transistor may be electrically connected to the first wiring, and the back gate electrode of the second transistor may be electrically connected to the second wiring. The first wiring may be shared among the pixels arranged in the same row or column and the pixels arranged in one of the two adjacent rows or columns. The second wiring may be shared among the pixels arranged in the same row or column and the pixels arranged in one of the two adjacent rows or columns.

The first wiring may be shared among the pixels arranged in the same row or column and the pixels which are arranged in one of the two adjacent rows or columns and provided on a side which is not interposed between the second transistors when seen from above or below. The second wiring may be shared among the pixels arranged in the same row or column and the pixels which are arranged in one of the two adjacent rows or columns and provided on a side which is not interposed between the first transistors, between the third transistors, and between the fourth transistors when seen from above or below.

The fifth transistor may be included. One of a source electrode and a drain electrode of the fifth transistor may be electrically connected to the other of the source electrode and the drain electrode of the second transistor. The fifth transistor may include a back gate electrode. The back gate electrode may be electrically connected to a wiring that can supply a potential higher than a source potential of the fifth transistor.

The first to fifth transistors may each include an active layer including an oxide semiconductor.

Selenium may be used for a photoelectric conversion film of the photodiode.

Another embodiment of the present invention is an electronic device including the imaging device and a display device.

According to one embodiment of the present invention, an imaging device that is suitable for high-speed operation can be provided. An imaging device with a long signal holding period can be provided. An imaging device with low power consumption can be provided. An imaging device with high definition can be provided. An imaging device with high sensitivity can be provided. An imaging device with a wide dynamic range can be provided. An imaging device with high resolution can be provided. An imaging device which is formed at low cost can be provided. An imaging device with high reliability can be provided. A novel imaging device and the like can be provided. A novel semiconductor device and the like can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIG. 9 is a timing chart showing the operation of a pixel circuit.

FIG. 26 is a top view illustrating an imaging device.

FIG. 27 is a top view illustrating an imaging device.

FIGS. 29A1, 29A2, 29A3, 29B1, 29B2, and 29B3 illustrate bent imaging devices.

DETAILED DESCRIPTION OF THE INVENTION

Figure 1:
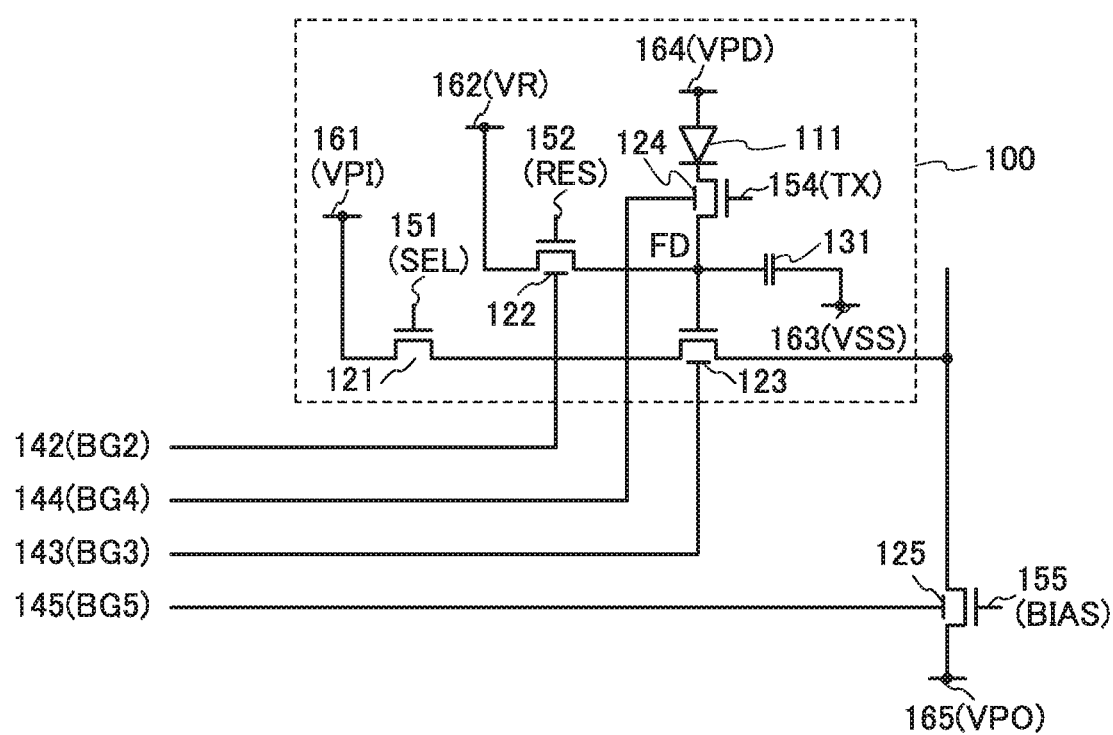
FIG. 1 is a circuit diagram of a pixel included in an imaging device.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of embodiments below. Note that in structures of the present invention described below, the same portions or portions having similar functions are denoted by the same reference numerals in different drawings, and description thereof is not repeated in some cases. It is also to be noted that the same components are denoted by different hatching patterns in different drawings, or the hatching patterns are omitted in some cases.

For example, in this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

Here, X and Y each denote an object (e.g., a device, an element, a circuit, a line, an electrode, a terminal, a conductive film, a layer, or the like).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up dc-dc converter, or a step-down dc-dc converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path", and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path." Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that one embodiment of the present invention is not limited to these expressions that are just examples. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that the terms "film" and "layer" can be interchanged with each other. For example, the term "conductive layer" can be changed into the term "conductive film" in some cases. Also, the term "insulating layer" can be changed into the term "insulating film" in some cases.

Note that functions of the "source" or "drain" of a transistor may be switched in the case where transistors of different polarities are employed or in the case where the direction of a current flow changes in a circuit operation, for example. Therefore, the terms "source" and "drain" can be replaced with each other in this specification. In addition, the term "electrode" and "electrode layer" can be replaced with the term "wiring".

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. A term "perpendicular" indicates that an angle formed between two straight lines is greater than or equal to 80° and less than or equal to 100°, and accordingly includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

Embodiment 1

In this embodiment, a circuit configuration of an imaging device of one embodiment of the present invention, and a method for driving the imaging device will be described with reference to drawings.

In the imaging device of one embodiment of the present invention, transistors included in pixels each include a back gate electrode. A potential applied to the back gate electrode is controlled in each pixel. That is, different potentials can be applied to the back gate electrodes of the transistors. The potential applied to the back gate electrode in each transistor can be changed in accordance with the on/off state of each transistor, for example. In the case of an n-channel transistor, for example, a positive potential is applied to the back gate electrode in an on state, and a negative potential is applied to the back gate electrode in an off state. Thus, the threshold voltage can be controlled, so that both high-speed operation and a long signal holding period can be achieved. Note that in this specification, a positive potential may be higher than a source potential of each transistor. A negative potential may be lower than a source potential of each transistor. Accordingly, in some cases, a positive potential and a negative potential do not become positive and negative, respectively.

FIG. 1 is a circuit diagram illustrating a pixel 100 that can be used for an imaging device of one embodiment of the present invention. The pixel 100 includes a photodiode 111, a transistor 121, a transistor 122, a transistor 123, a transistor 124, and a storage capacitor 131. The above components are electrically connected to a variety of wirings. The transistors 122 to 124 and a transistor 125 each include a back gate electrode.

The transistor 121 can function as a selection transistor. The transistor 122 can function as a reset transistor. The transistor 123 can function as an amplifier transistor. The transistor 124 can function as a transfer transistor.

Note that the transistor 125 is provided outside the pixel 100. The transistor 125 can function as a bias transistor.

Here, one of an anode and a cathode of the photodiode 111 is electrically connected to one of a source electrode and a drain electrode of the transistor 124, and a gate electrode of the transistor 123 is electrically connected to the other of the source electrode and the drain electrode of the transistor 124. One of a source electrode and a drain electrode of the transistor 122 and one electrode of the storage capacitor 131 are electrically connected to the gate electrode of the transistor 123. One of a source electrode and a drain electrode of the transistor 121 is electrically connected to one of a source electrode and a drain electrode of the transistor 123, and one of a source electrode and a drain electrode of the transistor 125 is electrically connected to the other of the source electrode and the drain electrode of the transistor 123.

A gate electrode of the transistor 121 can be electrically connected to a wiring 151 (SEL). A gate electrode of the transistor 122 can be electrically connected to a wiring 152 (RES). A gate electrode of the transistor 124 can be electrically connected to a wiring 154 (TX). A gate electrode of the transistor 125 can be electrically connected to a wiring 155 (BIAS).

In this specification, a node to which the one of the source electrode and the drain electrode of the transistor 122, the gate electrode of the transistor 123, the other of the source electrode and the drain electrode of the transistor 124, and the one electrode of the storage capacitor 131 are electrically connected is referred to as a signal charge storage portion (FD).

The other of the source electrode and the drain electrode of the transistor 121 can be electrically connected to a wiring 161 (VPI). The other of the source electrode and the drain electrode of the transistor 122 can be electrically connected to a wiring 162 (VR). The other electrode of the storage capacitor 131 can be electrically connected to a wiring 163 (VSS). The other of the anode and the cathode of the photodiode 111 can be electrically connected to a wiring 164 (VPD). The other of the source electrode and the drain electrode of the transistor 125 can be electrically connected to a wiring 165 (VPO). FIG. 1 illustrates a case where the wiring 164 (VPD) is electrically connected to the anode of the photodiode 111. In this case, the potential VR is set higher than the potential VPD. Note that a configuration in which any of the potentials of the wirings 161, 162, 163, 164, and 165 is set to a ground potential can be also employed.

A wiring 142 (BG2) is electrically connected to a back gate electrode of the transistor 122. A wiring 143 (BG3) is electrically connected to a back gate electrode of the transistor 123. A wiring 144 (BG4) is electrically connected to a back gate electrode of the transistor 124. A wiring 145 (BG5) is electrically connected to a back gate electrode of the transistor 125. With the above structure, different potentials can be supplied to the back gate electrodes of the transistors 122, 123, 124, and 125.

Figure 2A:
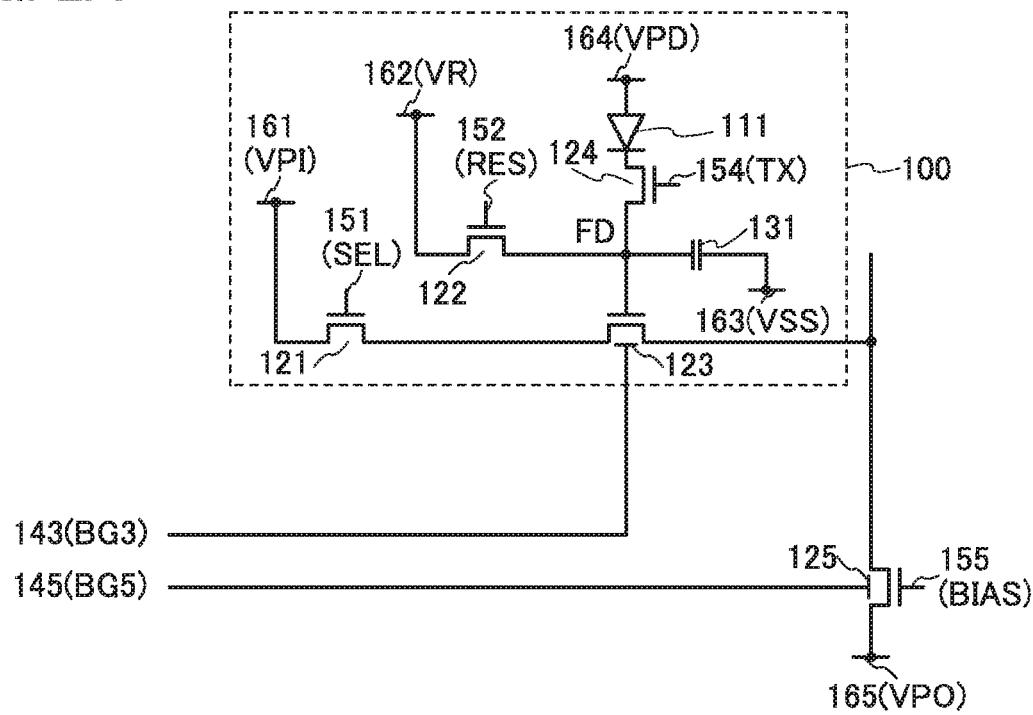
FIGS. 2A and 2B are circuit diagrams each showing a pixel included in an imaging device.
Figure 2B:
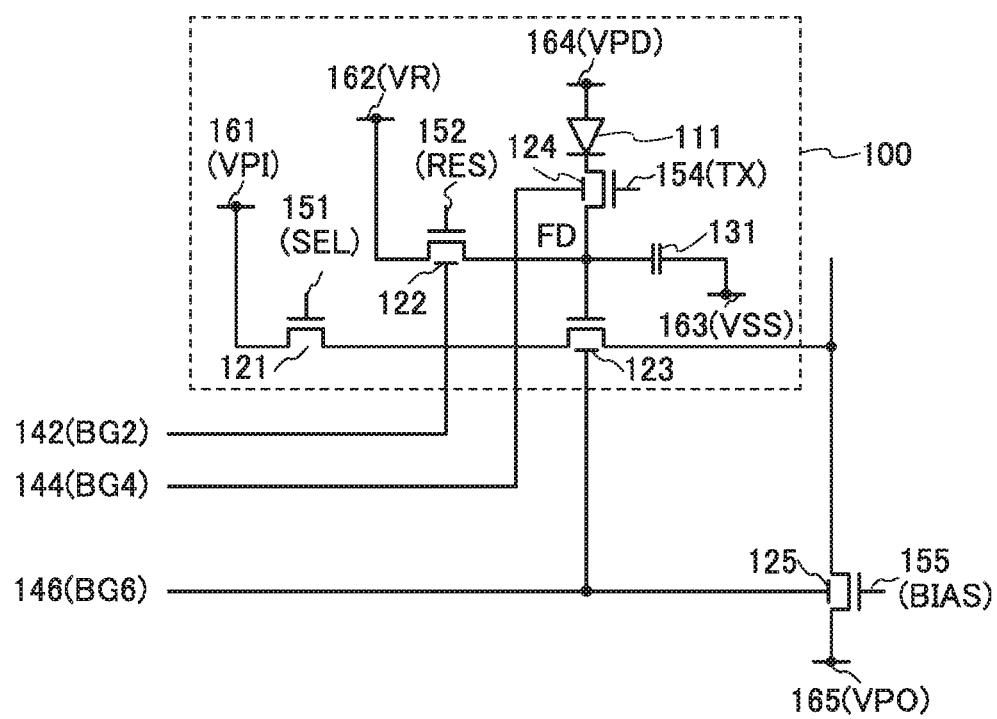

Note that as illustrated in FIG. 2A, the transistors 122 and 124 do not necessarily include a back gate electrode. As illustrated in FIG. 2B, the back gate electrodes of the transistors 123 and 125 may be connected to a wiring 146 and supplied with a potential BG6. That is, the back gate electrodes of the transistors 123 and 125 may be supplied with the same potential.

Figure 3:
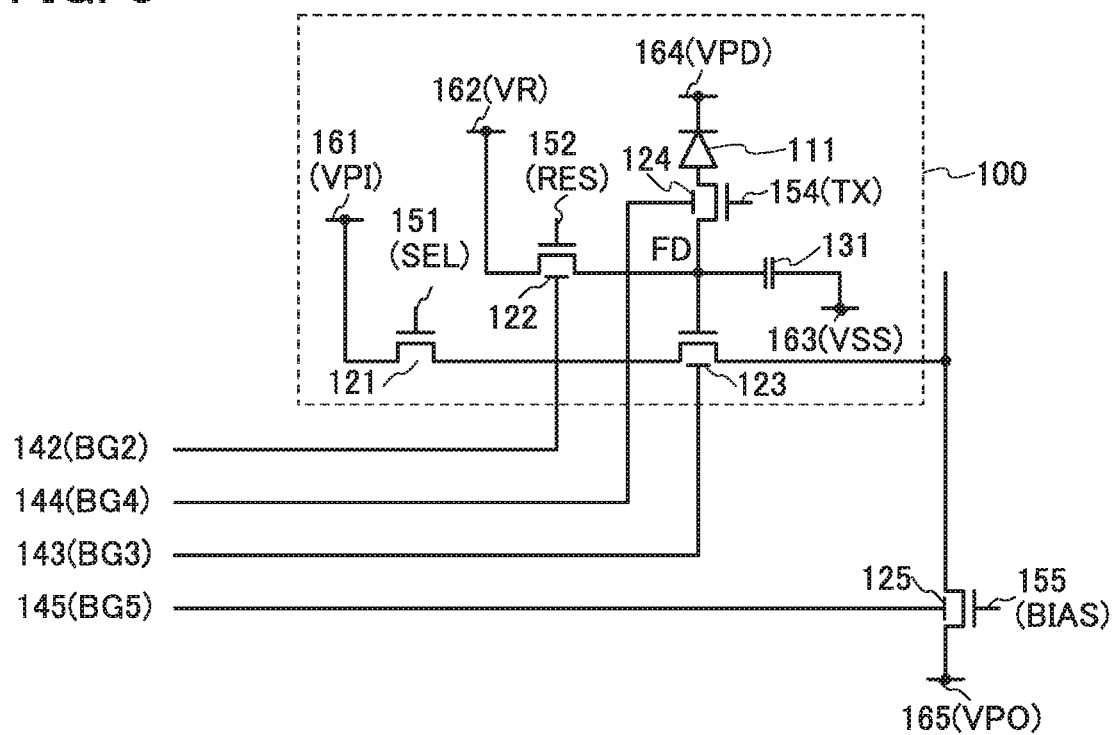
FIG. 3 is a circuit diagram of a pixel included in an imaging device.

As illustrated in FIG. 3, the connection direction of the photodiode 111 may be different from that in FIG. 1. In this case, the potential VPD is applied to the cathode, and the potential VPD is set higher than the potential VR.

Figure 4:
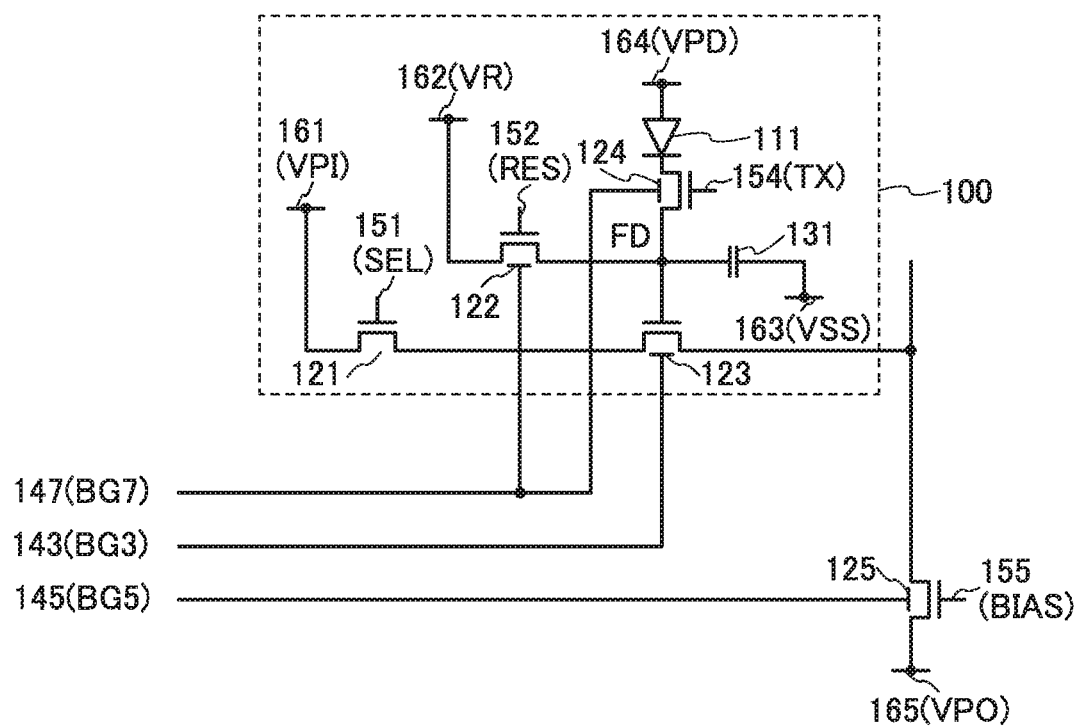
FIG. 4 is a circuit diagram of a pixel included in an imaging device.

As illustrated in FIG. 4, the back gate electrodes of the transistors 122 and 124 may be connected to a wiring 147 and supplied with a potential BG7. That is, the back gate electrodes of the transistors 122 and 124 may be supplied with the same potential.

Figure 5:
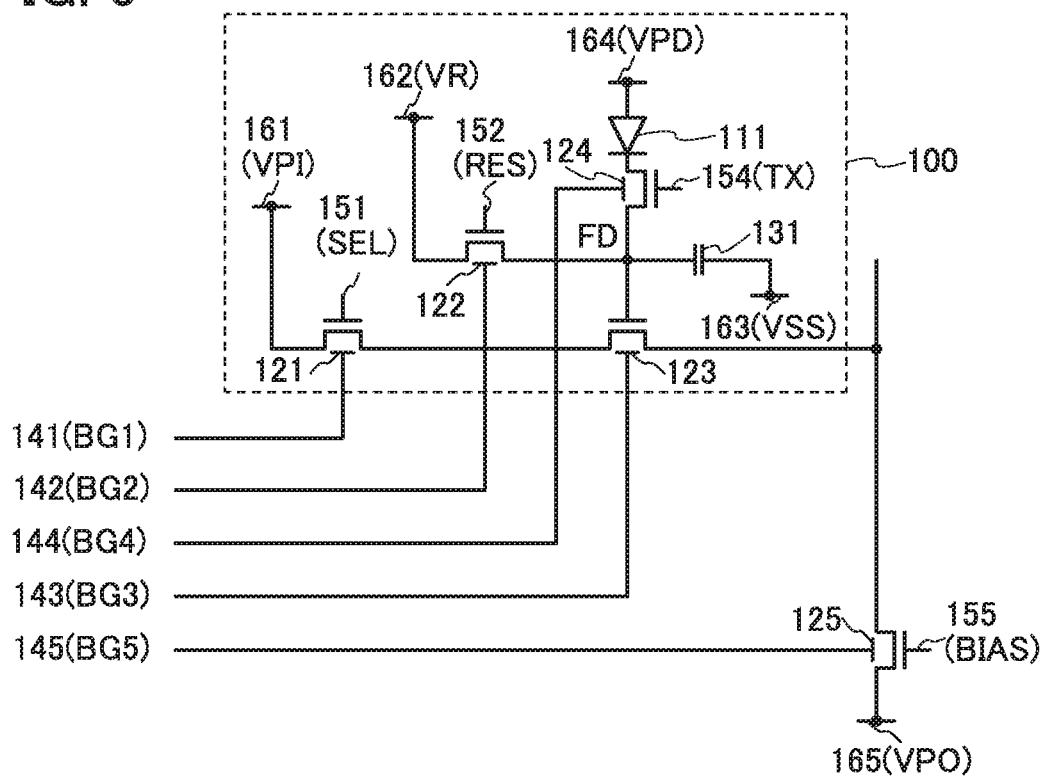
FIG. 5 is a circuit diagram of a pixel included in an imaging device.
Figure 6A:
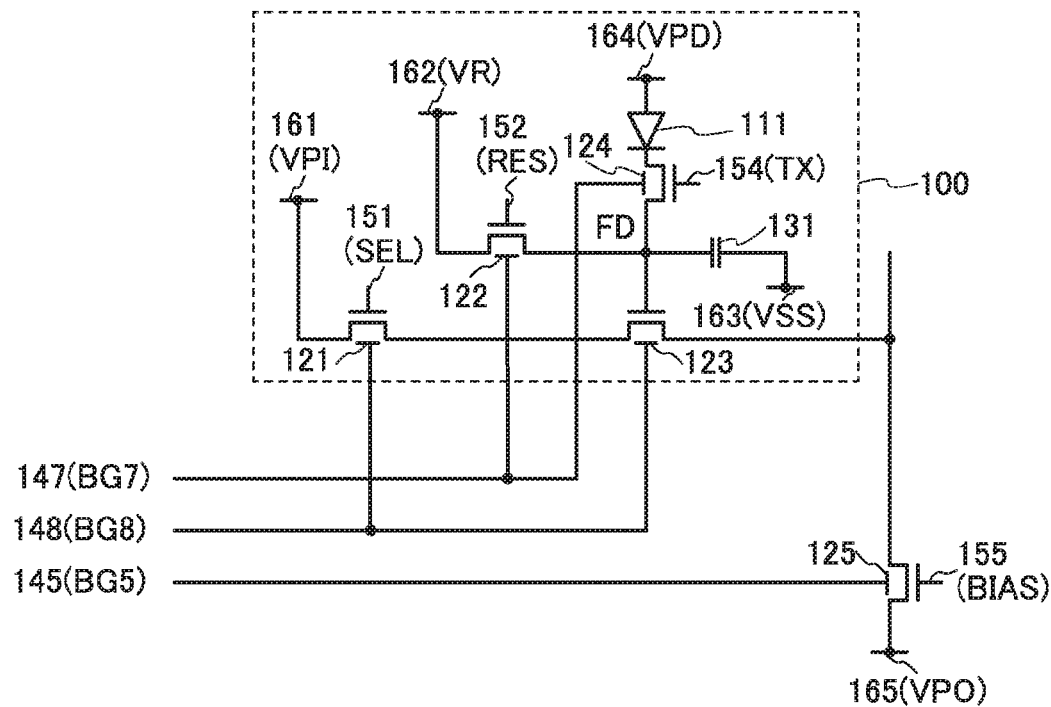
FIGS. 6A and 6B are circuit diagrams each showing a pixel included in an imaging device.

As illustrated in FIG. 5, a back gate electrode may be provided in the transistor 121, connected to a wiring 141, and supplied with a potential BG1. As illustrated in FIG. 6A, the back gate electrodes of the transistors 122 and 124 may be connected to a wiring 147 and supplied with the potential BG7, and the back gate electrodes of the transistors 121 and 123 may be connected to a wiring 148 and supplied with a potential BG8. That is, the back gate electrodes of the transistors 122 and 124 may be supplied with the same potential, and the back gate electrodes of the transistors 121 and 123 may be supplied with the same potential.

Figure 6B:
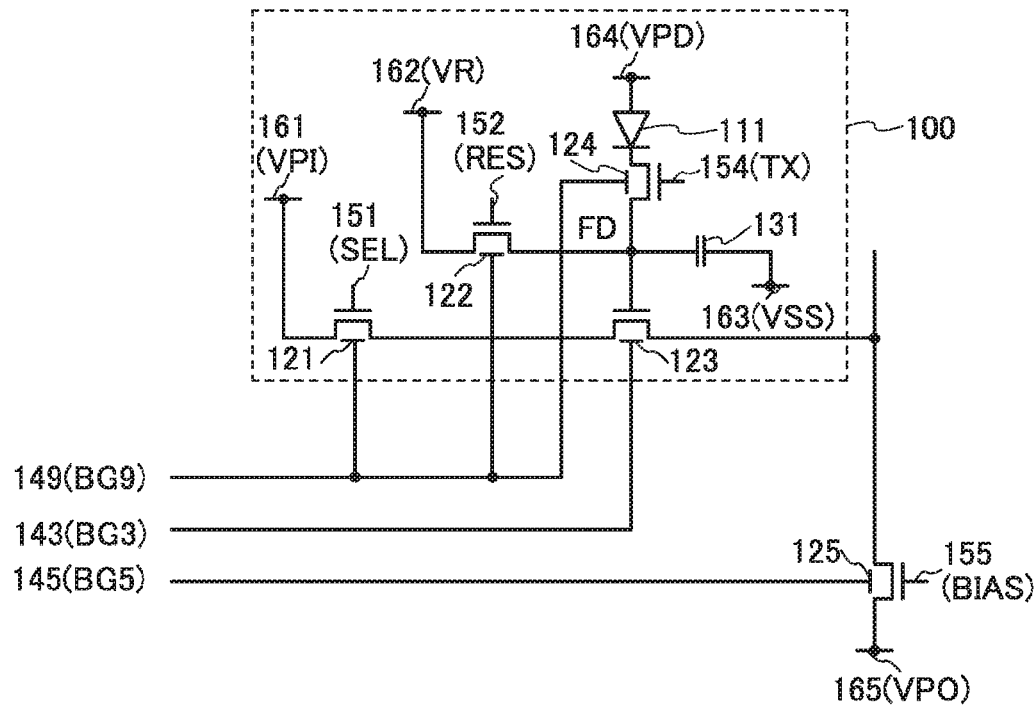

As illustrated in FIG. 6B, the back gate electrodes of the transistors 121, 122, and 124 may be connected to a wiring 149 and supplied with a potential BG9. That is, the back gate electrodes of the transistors 121, 122, and 124 may be supplied with the same potential.

Figure 7A:
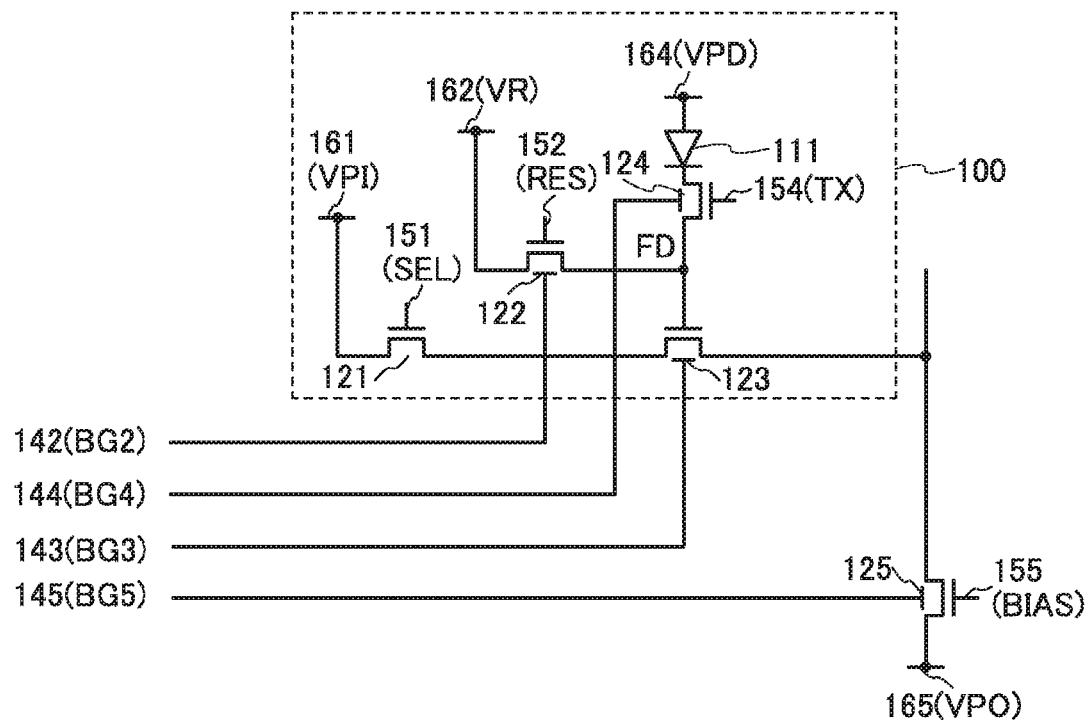
FIGS. 7A and 7B are circuit diagrams each showing a pixel included in an imaging device.
Figure 7B:
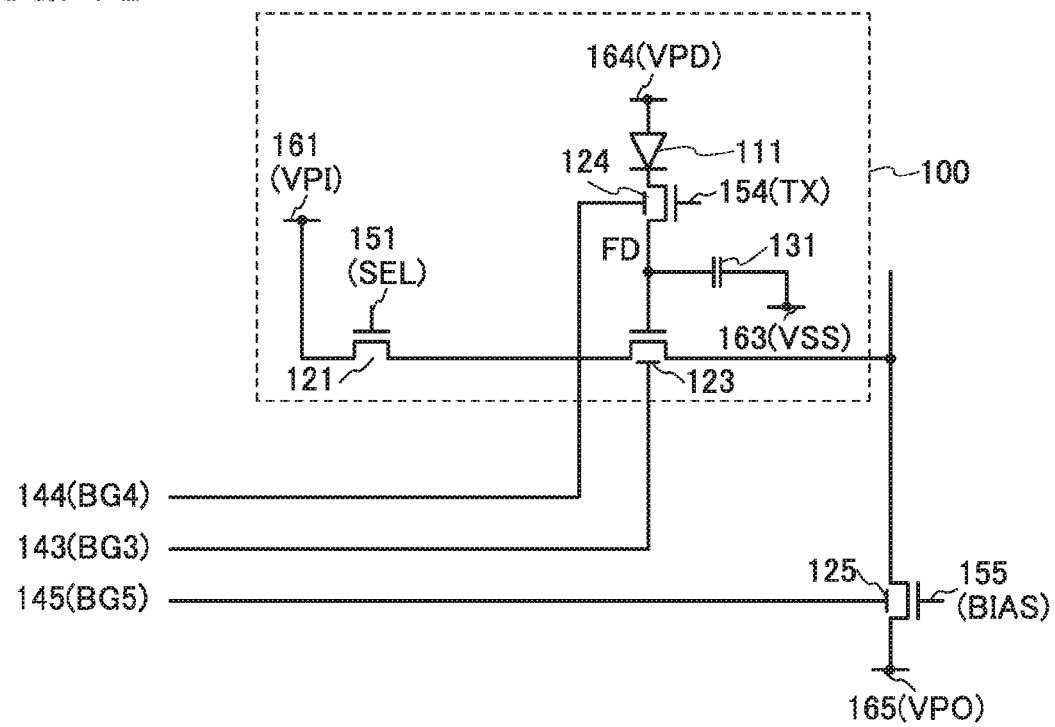
Figure 8A:
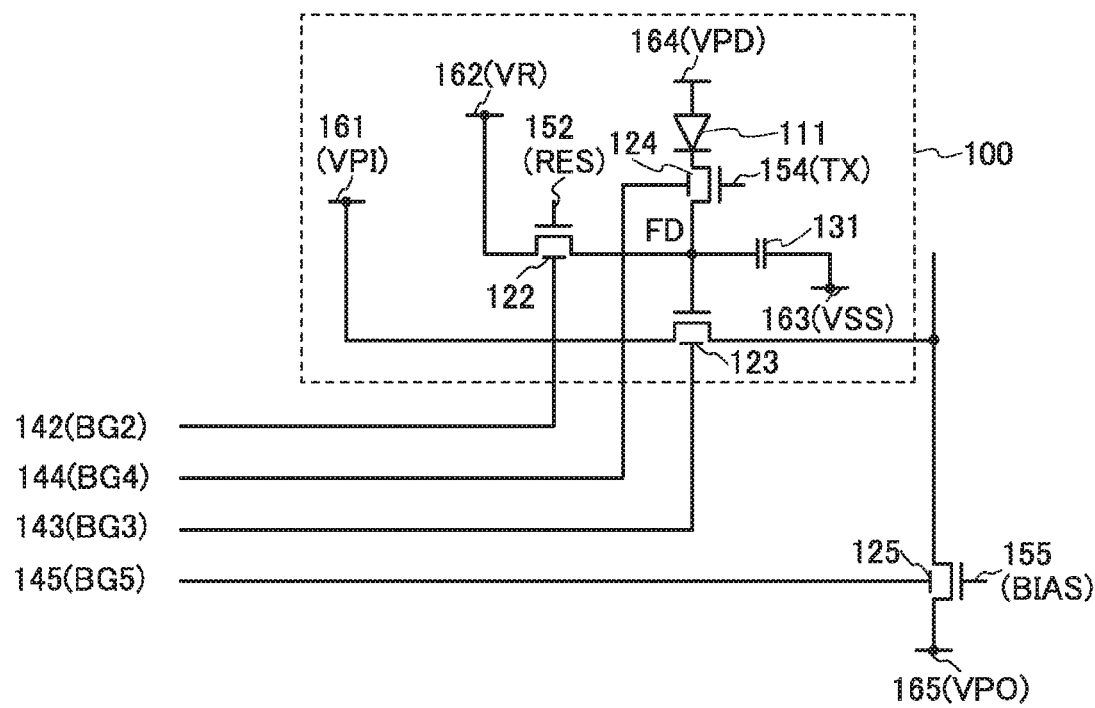
FIGS. 8A and 8B are circuit diagrams each showing a pixel included in an imaging device.
Figure 8B:
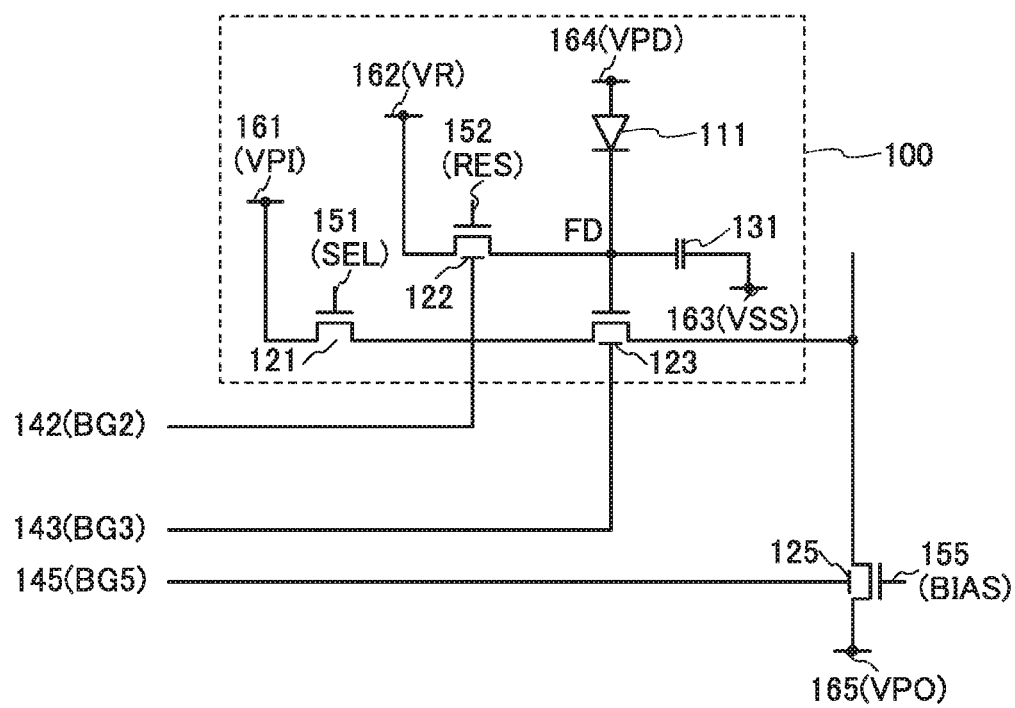

As illustrated in FIG. 7A, the pixel 100 does not necessarily include the storage capacitor 131. As illustrated in FIG. 7B, the pixel 100 does not necessarily include the transistor 122. As illustrated in FIG. 8A, the pixel 100 does not necessarily include the transistor 121. As illustrated in FIG. 8B, the pixel 100 does not necessarily include the transistor 124.

Note that a transistor including an oxide semiconductor in an active layer (hereinafter also referred to as an OS transistor) can be used as the transistors 121 to 125. One, two or more, or all of the transistors 121 to 125 may be OS transistors.

Extremely low off-state current characteristics of the OS transistor can widen the dynamic range of imaging. In the configuration shown in FIG. 1, for example, when the illuminance of light entering the photodiode 111 is high, the potential of the signal charge storage portion becomes low. Since the OS transistor has an extremely low off-state current, a current corresponding to the gate potential can be accurately output even when the gate potential is extremely low. Thus, it is possible to broaden the detection range of illuminance, i.e., the dynamic range.

In addition, the OS transistor has lower temperature dependence of change in electrical characteristics than a transistor including silicon in an active layer (hereinafter referred to as a Si transistor), and thus can be used in an extremely wide range of temperatures. Therefore, an imaging device and a semiconductor device that include the OS transistors are suitable for automobiles, aircrafts, spacecrafts, and the like.

Furthermore, the OS transistor has higher drain breakdown voltage than the Si transistor. In a photodiode including a selenium-based material in a photoelectric conversion film, a relatively high potential (e.g., 10 V or more) is preferably applied to easily cause the avalanche phenomenon. Thus, by combination of the OS transistor and a photodiode including the selenium-based material in the photoelectric conversion film, a highly reliable imaging device can be obtained.

Next, imaging operation and reading operation in the circuit shown in FIG. 1 will be described with reference to a timing chart in FIG. 9. Note that all the transistors 122 to 125 are n-channel transistors. The wirings 161 and 162 have a high potential, and the wirings 163, 164, and 165 have a low potential.

In this specification, a low potential can be, for example, a ground potential.

First, a high potential is applied to the wiring 152 (RES) to turn on the transistor 122, and a positive potential is applied to the wiring 142 (BG2). At this time, the threshold voltage of the transistor 122 shifts in the negative direction, and thus, the on-state current becomes higher, so that reset operation can be performed at higher speed. Here, the signal charge storage portion (FD) is charged to the potential VR of the wiring 162.

After that, a low potential is applied to the wiring 152 (RES) to turn off the transistor 122, whereby the signal charge storage portion (FD) is held at the potential VR of the wiring 162. Furthermore, a negative potential is applied to the wiring 142 (BG2) and the wiring 144 (BG4). At this time, the threshold voltage of each of the transistors 122 and 124 shifts in the positive direction, and thus the off-state current becomes low. Thus, the charge retention characteristics of the signal charge storage portion (FD) is improved.

Next, when a high potential is applied to the wiring 154 (TX) to turn on the transistor 124, current flows from the signal charge storage portion (FD) to the photodiode 111, so that the potential of the signal charge storage portion (FD) is lowered. Furthermore, when a positive potential is applied to the wiring 144 (BG4), the on-state current of the transistor 124 is increased, so that transfer operation can be performed at higher speed. After that, when a low potential is applied to the wiring 154 (TX) to turn off the transistor 124, a potential when the transistor 124 is turned off is held in the signal charge storage portion (FD). Furthermore, when a negative potential is applied to the wiring 144 (BG4), the off-state current becomes low, and thus the charge retention characteristics of the signal charge storage portion (FD) is improved. The above is the description of the imaging operation.

Then, a high potential is applied to the wiring 151 (SEL) and the wiring 155 (BIAS) to turn on the transistor 121 and the transistor 125, so that a signal is read. Furthermore, a positive potential is applied to the wiring 143 (BG3) and the wiring 145 (BG5). Thus, the on-state current of each of the transistors 123 and 125 is increased, so that reading can be performed at higher speed. After the signal is read, a low potential is applied to the wiring 151 (SEL) to turn off the transistor 121. At this time, application of the potential to the wiring 143 (BG3) and the wiring 145 (BG5) may be stopped.

In the imaging device of one embodiment of the present invention, the wirings 142 to 145 are electrically connected to the back gate electrodes of the transistors 122 to 125, respectively. A positive potential is applied to the wiring electrically connected to the back gate electrode of the transistor in an on state, and a negative potential is applied to the wiring electrically connected to the back gate electrode of the transistor in an off state. Thus, the on-state current can be increased in the case where each transistor is in an on state, and the off-state current can be reduced in the case where each transistor is in an off state. Accordingly, both high-speed operation and a long signal holding period can be achieved.

Note that a negative potential may be constantly applied to the wiring 142 (BG2) and the wiring 144 (BG4) except in the case where the transistors 122 and 124 are in an on state, or a potential is not necessarily applied to the wiring 142 (BG2) and the wiring 144 (BG4) except during imaging operation (during reading operation, for example).

Next, operation in the case where the transistors 121 to 123 and the wirings 142 to 144 are shared among a plurality of pixels will be described. Note that the wirings 142 to 144 are not necessarily shared among the plurality of pixels, and pixels may have respective wirings. In this case, potentials applied to the back gate electrodes of the transistors 122 to 124 can be controlled for each pixel. All the transistors 122 to 125 are n-channel transistors. Note that the wirings 161 and 162 have a high potential, and the wirings 163, 164, and 165 have a low potential.

Figure 10:
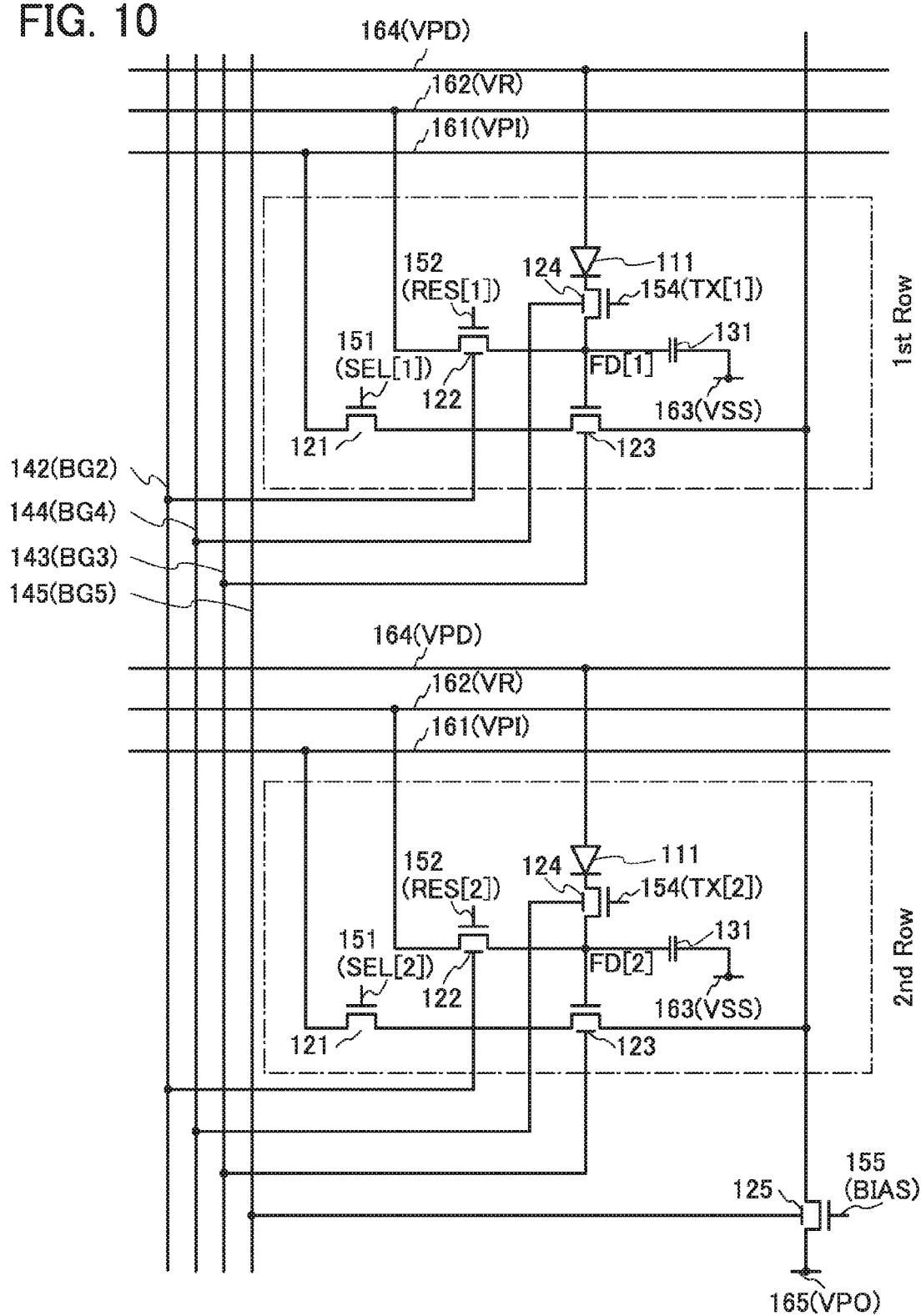
FIG. 10 is a circuit diagram of a pixel included in an imaging device.

FIG. 10 illustrates a basic configuration in which pixels each include one photodiode 111, one transistor 121, one transistor 122, one transistor 123, and one transistor 124 and are connected to the wirings 142, 143, 144, 145, 151, 152, 154, 161, 162, 163, and 164.

Figure 11:
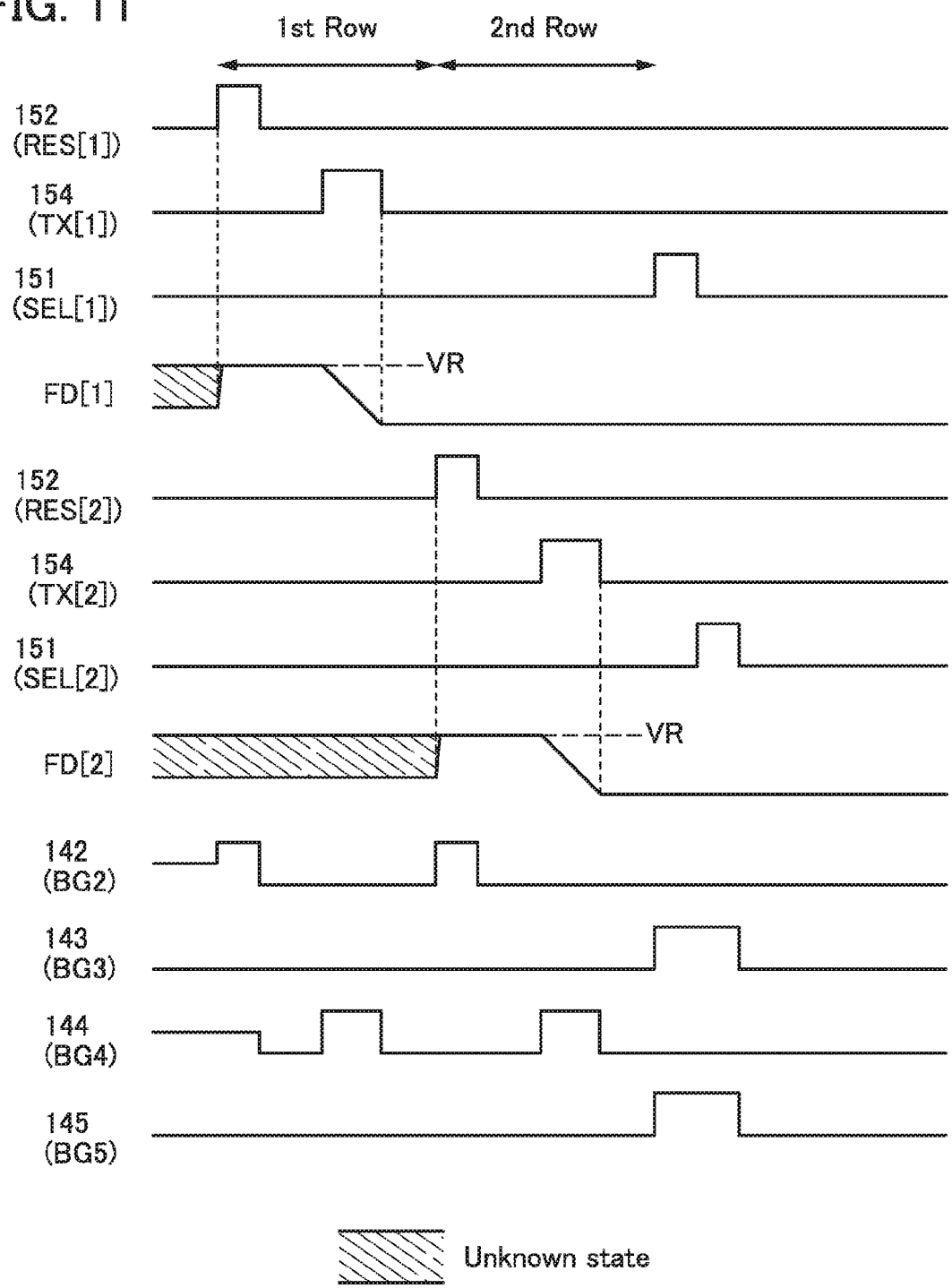
FIG. 11 is a timing chart showing the operation of a pixel circuit.

The operation in the basic configuration will be described with reference to a timing chart in FIG. 11. In the driving in a first row, first, a high potential is applied to the wiring 152 (RES[1]) to turn on the transistor 122. Furthermore, a positive potential is applied to the wiring 142 (BG2), and thus reset operation can be performed at higher speed. Here, the signal charge storage portion (FD[1]) is charged to the potential VR of the wiring 162. After that, a low potential is applied to the wiring 152 (RES[1]) to turn off the transistor 122, whereby the signal charge storage portion (FD[1]) is held at the potential VR of the wiring 162. Furthermore, a negative potential is applied to the wiring 142 (BG2) and the wiring 144 (BG4), and thus, the charge retention characteristics of the signal charge storage portion (FD[1]) is improved.

Next, when a high potential is applied to the wiring 154 (TX[1]) to turn on the transistor 124, current flows from the signal charge storage portion (FD[1]) to the photodiode 111, so that the potential of the signal charge storage portion (FD[1]) is lowered. Furthermore, when a positive potential is applied to the wiring 144 (BG4), transfer operation can be performed at higher speed. After that, when a low potential is applied to the wiring 154 (TX[1]) to turn off the transistor 124, a potential when the transistor 124 is turned off is held in the signal charge storage portion (FD[1]). Furthermore, when a negative potential is applied to the wiring 144 (BG4), the charge retention characteristics of the signal charge storage portion (FD[1]) is improved. The above is the description of imaging operation performed on pixels in the first row. Next, imaging operation is performed on pixels in a second row as in the pixels in the first row. In this manner, imaging operation is sequentially performed.

Then, a high potential is applied to the wiring 151 (SEL[1]) and the wiring 155 (BIAS) to turn on the transistor 121 and the transistor 125, so that the signal written to the pixels in the first row is read. Furthermore, a positive potential is applied to the wiring 143 (BG3) and the wiring 145 (BG5), so that reading can be performed at higher speed. After the signal written to the pixels in the first row is read, a low potential is applied to the wiring 151 (SEL[1]) to turn off the transistor 121. Next, the signal written to the pixels in the second row is read in a manner similar to that in the first row. Thus, reading operation is sequentially performed.

Figure 12:
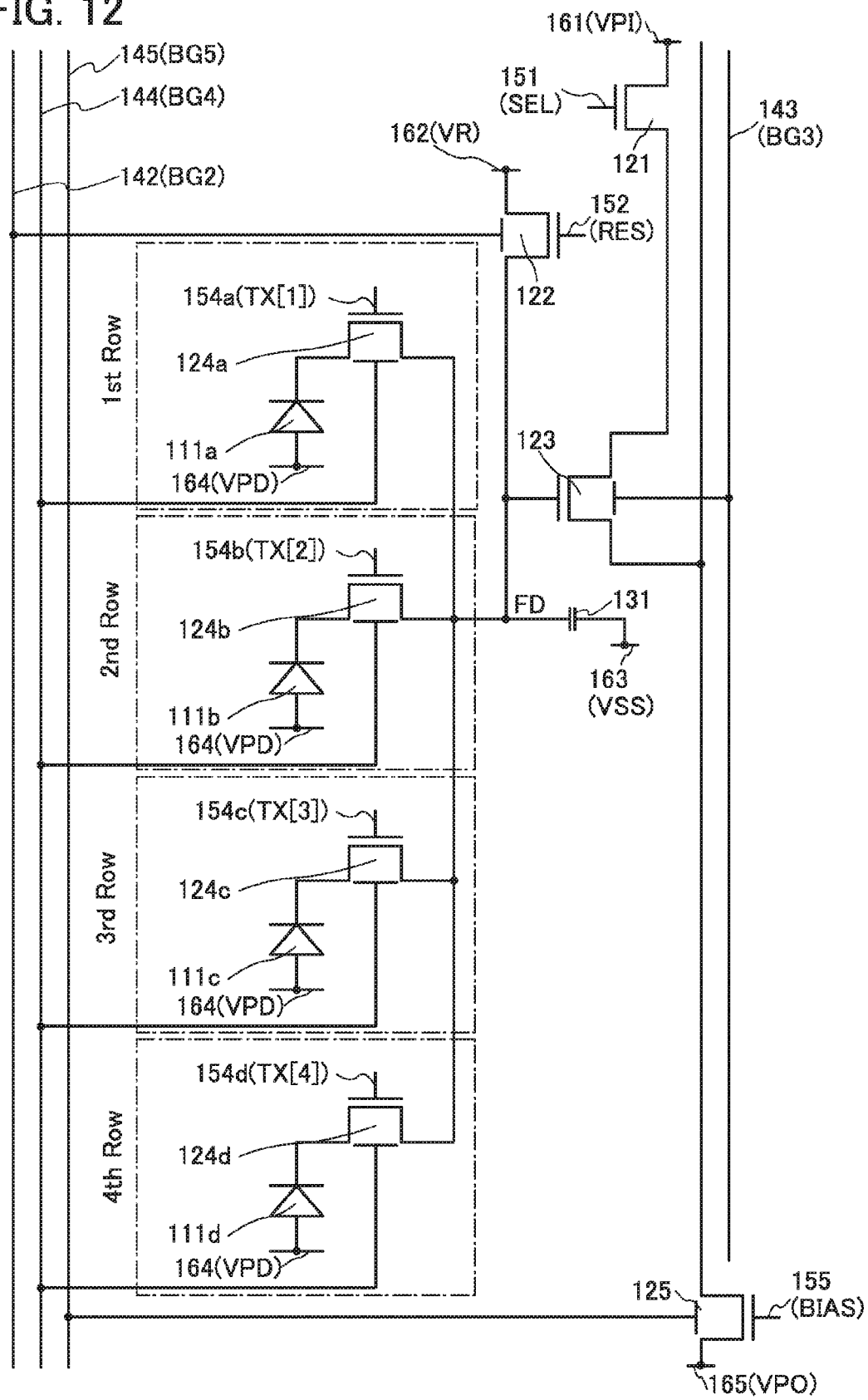
FIG. 12 is a circuit diagram of a pixel included in an imaging device.

Unlike the above basic configuration, FIG. 12 illustrates a vertical-sharing-type configuration of four pixels arranged vertically, in which the transistors 121 to 123 are used in common. When the number of transistors and the number of wirings are reduced, the pixel area can be reduced, which leads to miniaturization, and the light-receiving area of a photodiode can be increased, which leads to noise reduction. The signal charge storage portion (FD) is connected to the one of the source electrode and the drain electrode of the transistor 122, the gate electrode of the transistor 123, one of a source electrode and a drain electrode of a transistor 124*a*, one of a source electrode and a drain electrode of a transistor 124*b*, one of a source electrode and a drain electrode of a transistor 124*c*, and one of a source electrode and a drain electrode of a transistor 124*d*, and the one electrode of the storage capacitor 131. One of a cathode and an anode of a photodiode 111*a* is electrically connected to the other of the source electrode and the drain electrode of the transistor 124*a*. One of a cathode and an anode of a photodiode 111*b* is electrically connected to the other of the source electrode and the drain electrode of the transistor 124*b*. One of a cathode and an anode of a photodiode 111*c* is electrically connected to the other of the source electrode and the drain electrode of the transistor 124*c*. One of a cathode and an anode of a photodiode 111*d* is electrically connected to the other of the source electrode and the drain electrode of the transistor 124*d*. The wiring 154*a* (a potential TX[1]) is electrically connected to a gate electrode of the transistor 124*a*. The wiring 154*b* (a potential TX[2]) is electrically connected to a gate electrode of the transistor 124*b*. The wiring 154*c* (a potential TX[3]) is electrically connected to a gate electrode of the transistor 124*c*. The wiring 154*d* (a potential TX[4]) is electrically connected to a gate electrode of the transistor 124*d*. Note that the transistors 124*a* to 124*d* can each function as a transfer transistor.

Figure 13:
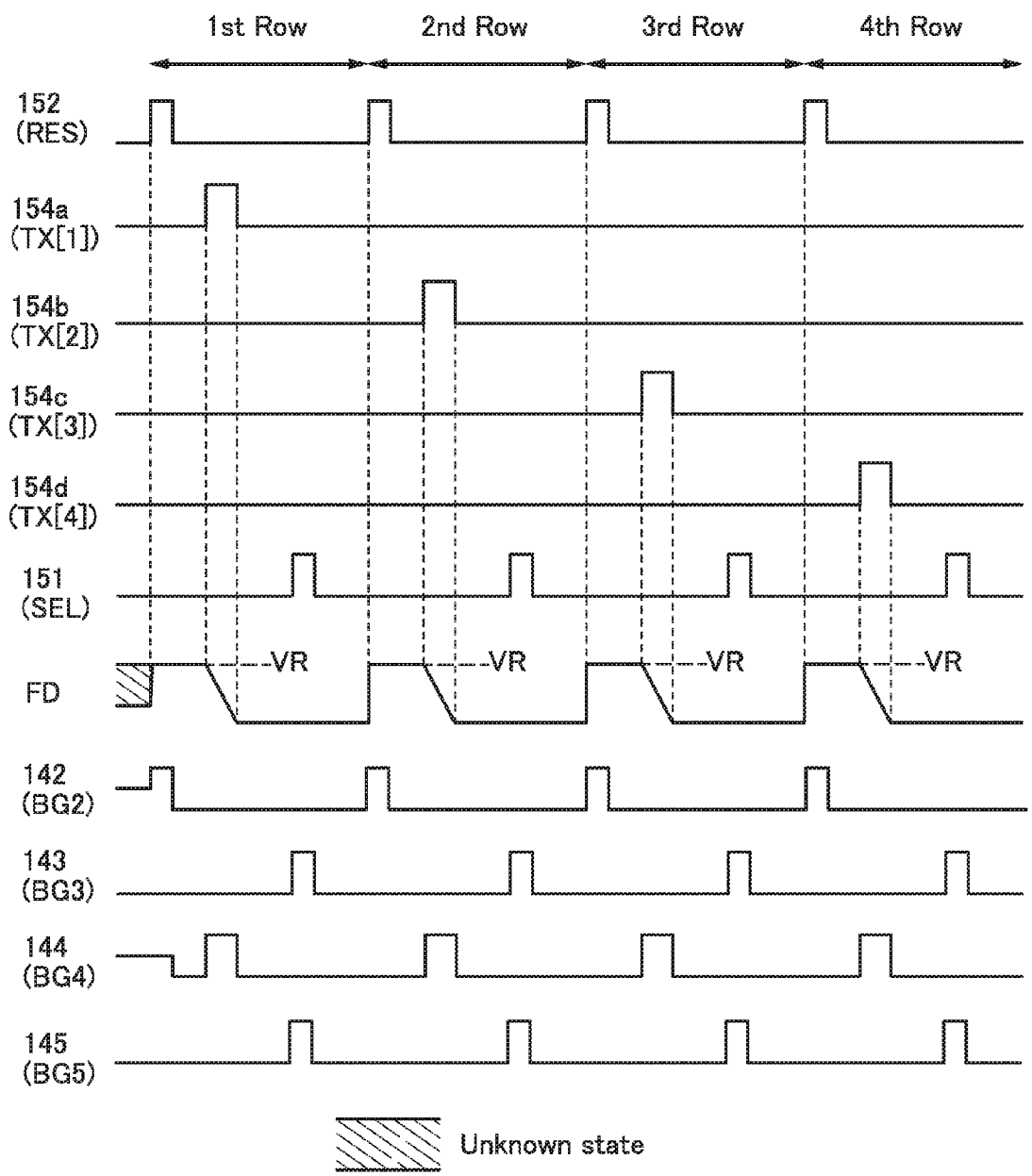
FIG. 13 is a timing chart showing the operation of a pixel circuit.

The operation in the a vertical-sharing-type configuration of four pixels will be described with reference to a timing chart in FIG. 13. In the driving in a first row, first, a high potential is applied to the wiring 152 (RES) to turn on the transistor 122. Furthermore, a positive potential is applied to the wiring 142 (BG2), and thus reset operation can be performed at higher speed. Here, the signal charge storage portion (FD) is charged to the potential VR of the wiring 162. After that, a low potential is applied to the wiring 152 (RES) to turn off the transistor 122, whereby the signal charge storage portion (FD) is held at the potential VR of the wiring 162. Furthermore, when a negative potential is applied to the wiring 142 (BG2) and the wiring 144 (BG4), the charge retention characteristics of the signal charge storage portion (FD) is improved. Next, when a high potential is applied to the wiring 154*a* (TX[1]) to turn on the transistor 124*a*, current flows from the signal charge storage portion (FD) to the photodiode 111*a*, so that the potential of the signal charge storage portion (FD) is lowered. Furthermore, when a positive potential is applied to the wiring 144 (BG4), transfer operation can be performed at higher speed.

After that, when a low potential is applied to the wiring 154*a* (TX[1]) to turn off the transistor 124*a*, a potential when the transistor 124*a* is turned off is held in the signal charge storage portion (FD). Furthermore, when a negative potential is applied to the wiring 144 (BG4), the charge retention characteristics of the signal charge storage portion (FD) is improved. The above is the description of imaging operation performed on the first row.

Then, a high potential is applied to the wiring 151 (SEL) and the wiring 155 (BIAS) to turn on the transistor 121 and the transistor 125, so that the signal written to the pixels in the first row is read. Furthermore, a positive potential is applied to the wirings 143 (BG3) and the wiring 145 (BG5), so that reading can be performed at higher speed. After the signal is read, a low potential is applied to the wiring 151 (SEL) to turn off the transistor 121. At this time, application of the potential to the wiring 143 (BG3) and the wiring 145 (BG5) may be stopped. The above is the description of reading operation on pixels in the first row.

In the driving in the second row, a high potential is applied again to the wiring 152 (RES) to turn on the transistor 122. Furthermore, a positive potential is applied to the wiring 142 (BG2), and thus reset operation can be performed at higher speed. Here, the signal charge storage portion (FD) is charged to the potential VR of the wiring 162. After that, a low potential is applied to the wiring 152 (RES) to turn off the transistor 122, whereby the signal charge storage portion (FD) is held at the potential VR of the wiring 162. Furthermore, a negative potential is applied to the wiring 142 (BG2) and the wiring 144 (BG4), and thus, the charge retention characteristics of the signal charge storage portion (FD) is improved.

Next, when a high potential is applied to the wiring 154*b* (TX[2]) to turn on the transistor 124*b*, current flows from the signal charge storage portion (FD) to the photodiode 111*b*, so that the potential of the signal charge storage portion (FD) is lowered. Furthermore, when a positive potential is applied to the wiring 144 (BG4), transfer operation can be performed at higher speed. When a low potential is applied to the wiring 154*b* (TX[2]) to turn off the transistor 124*b*, a potential when the transistor 124*b* is turned off is held in the signal charge storage portion (FD). Furthermore, a negative potential is applied to the wiring 144 (BG4), and thus, the charge retention characteristics of the signal charge storage portion (FD) is improved. The above is the description of imaging operation performed on the second row.

Next, reading from pixels in the second row is performed as in the pixels in the first row. After that, imaging operation and reading operation are performed on pixels in a third row and pixels in a fourth row as in the pixels in the second row. The above is the description of imaging operation and reading operation in the circuit shown in FIG. 12.

Figure 14:
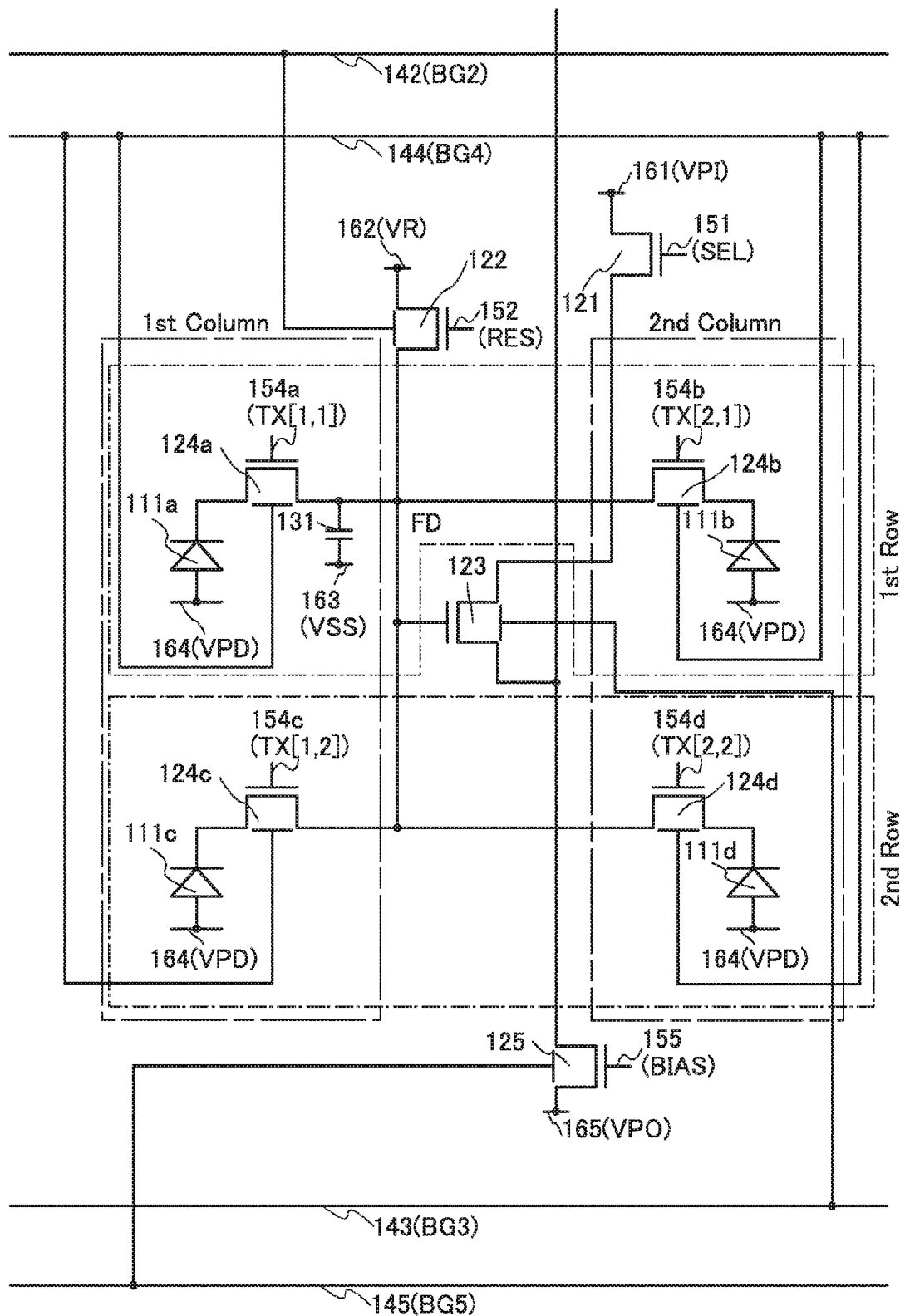
FIG. 14 is a circuit diagram of a pixel included in an imaging device.

FIG. 14 illustrates a vertical-horizontal-sharing-type configuration of four pixels, which is different from the configuration in FIG. 12 and in which the transistors 121 to 123 are shared among four pixels arranged in two rows and two columns. As in the vertical-sharing-type configuration of four pixels, when the number of transistors and the number of wirings are reduced, the pixel area can be reduced, which leads to miniaturization, and the light-receiving area of a photodiode can be increased, which leads to noise reduction. The transistors 124*a* to 124*d* can each function as a transfer transistor. The wiring 154*a* (TX[1,1]) is electrically connected to the gate electrode of the transistor 124*a*. The wiring 154*b* (TX[2,1]) is electrically connected to the gate electrode of the transistor 124*b*. The wiring 154*c* (TX[1,2]) is electrically connected to the gate electrode of the transistor 124*c*. The wiring 154*d* (TX[2,2]) is electrically connected to the gate electrode of the transistor 124*d*.

Figure 15:
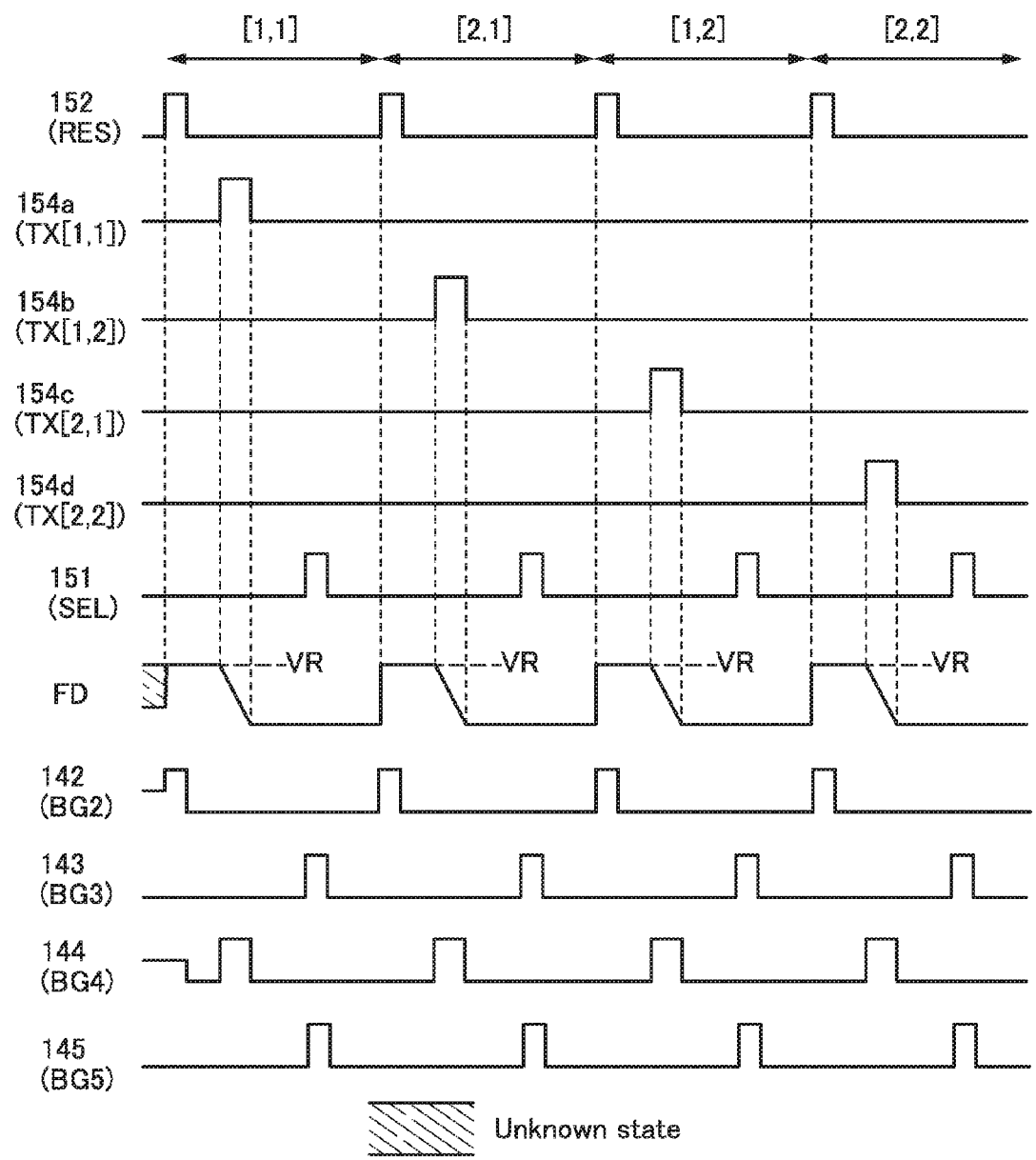
FIG. 15 is a timing chart showing the operation of a pixel circuit.

The operation in the vertical-horizontal-sharing-type configuration of four pixels will be described with reference to a timing chart in FIG. 15. In the driving in a first row and a first column, first, a high potential is applied to the wiring 152 (RES) to turn on the transistor 122. Furthermore, a positive potential is applied to the wiring 142 (BG2), and thus reset operation can be performed at higher speed. Here, the signal charge storage portion (FD) is charged to the potential VR of the wiring 162. After that, a low potential is applied to the wiring 152 (RES) to turn off the transistor 122, whereby the signal charge storage portion (FD) is held at the potential VR of the wiring 162. Furthermore, when a negative potential is applied to the wiring 142 (BG2) and the wiring 144 (BG4), the charge retention characteristics of the signal charge storage portion (FD) is improved.

Next, when a high potential is applied to the wiring 154*a* (TX[1,1]) to turn on the transistor 124*a*, current flows from the signal charge storage portion (FD) to the photodiode 111*a*, so that the potential of the signal charge storage portion (FD) is lowered. Furthermore, when a positive potential is applied to the wiring 144 (BG4), transfer operation can be performed at higher speed. When a low potential is applied to the wiring 154*a* (TX[1,1]) to turn off the transistor 124*a*, a potential when the transistor 124*a* is turned off is held in the signal charge storage portion (FD). Furthermore, when a negative potential is applied to the wiring 144 (BG4), the charge retention characteristics of the signal charge storage portion (FD) is improved. The above is the description of the imaging operation.

Then, a high potential is applied to the wiring 151 (SEL) and the wiring 155 (BIAS) to turn on the transistor 121 and the transistor 125, so that the signal written to the pixels in the first row and the first column is read. Furthermore, a positive potential is applied to the wirings 143 (BG3) and the wiring 145 (BG5), so that reading can be performed at higher speed. After the signal is read, a low potential is applied to the wiring 151 (SEL) to turn off the transistor 121. At this time, application of the potential to the wiring 143 (BG3) and the wiring 145 (BG5) may be stopped. The above is the description of reading operation.

As in the pixels in the first row and the first column, imaging operation and reading operation in the pixels in the first row and a second column, the pixels in a second row and the first column, and the pixels in the second row and the second column are performed. The above is the description of imaging operation and reading operation in the circuit shown in FIG. 14.

Figure 16A:
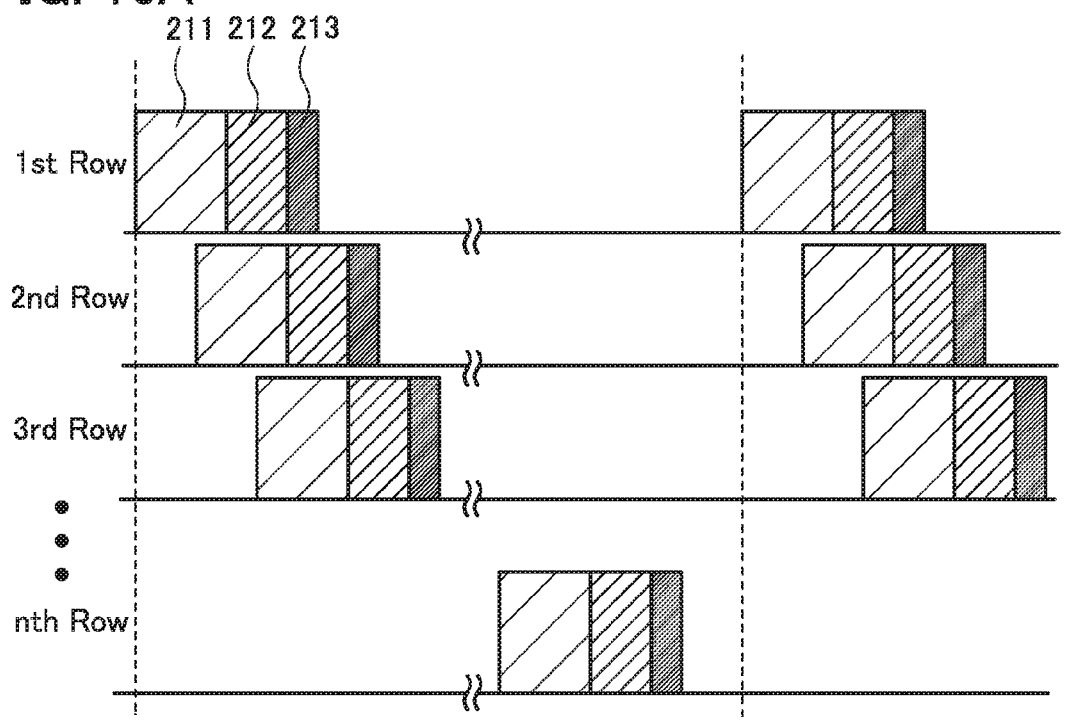
FIGS. 16A and 16B are timing charts showing operations of a rolling shutter system and a global shutter system, respectively.
Figure 16B:
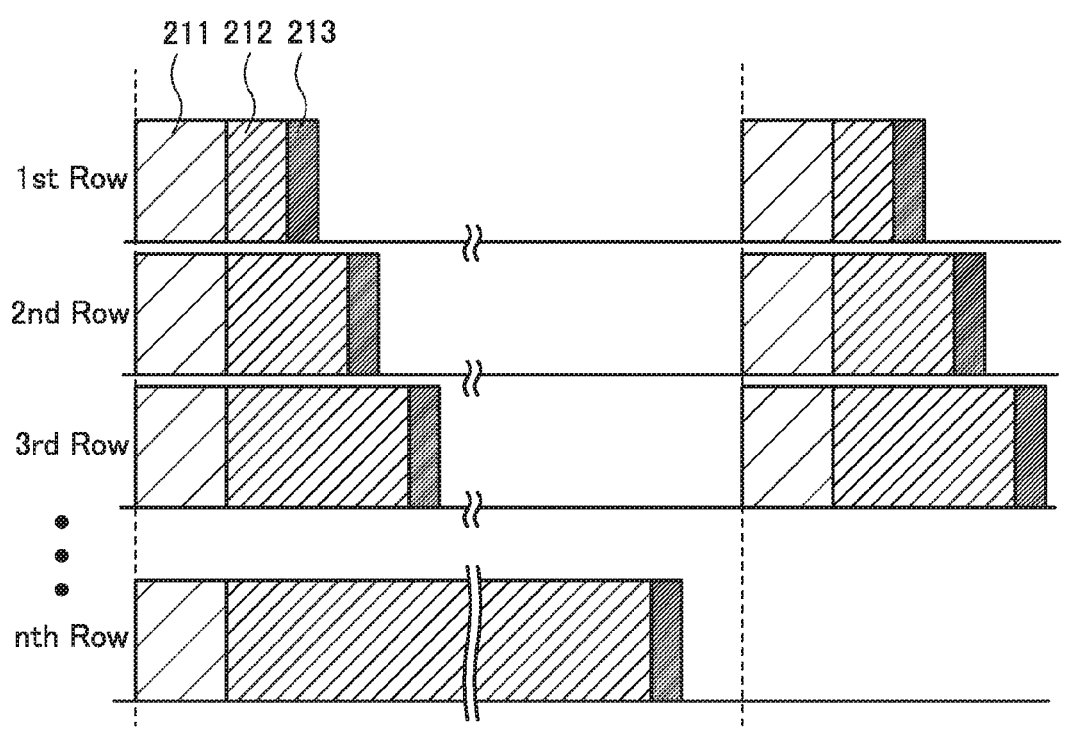

Note that in each of the configurations shown in FIG. 10, FIG. 12, and FIG. 14, as illustrated in FIG. 16A, the driving is performed with a rolling shutter system in which imaging operation 211, data retaining operation 212, and reading operation 213 are performed row by row. A circuit configuration capable of a global shutter system in which the imaging operation 211 is performed on the pixels in all the rows at the same time, and the reading operation 213 is sequentially performed row by row as illustrated in FIG. 16B can also be used.

For example, when the transistors 122 and 124 are OS transistors, a period during which charge can be retained in the signal charge storage portion can be made extremely long because of the low off-state current characteristics of an OS transistor, so that a global shutter system can be employed. Therefore, an image with little distortion can be easily obtained even in the case of a moving object. Furthermore, exposure time (a period for obtaining an imaging data) can be long in the global shutter system; thus, the circuit configuration employing the global shutter system is suitable for imaging even in a low illuminance environment.

Note that although all the transistors 122 to 125 may be OS transistors, one or more of the transistors 122 to 125 may be Si transistors. For example, OS transistors are used as the transistors 122 and 124, and Si transistors are used as the transistors 121 and 123.

Although all the transistors 122 to 125 are n-channel transistors in this embodiment, at least one of the transistors 122 to 125 may be a p-channel transistor. In a p-channel transistor, when a negative potential is applied to a back gate electrode, the threshold voltage shifts in the positive direction, leading to an increase in the on-state current, and when a positive potential is applied to the back gate electrode, the threshold voltage shifts in the negative direction, leading to a reduction in the off-state current.

Note that although the wirings 161 and 162 have a high potential and the wirings 163, 164, and 165 have a low potential in the driving method described as an example, other potentials can be supplied to the above wirings for the driving.

In Embodiment 1, one embodiment of the present invention has been described. Other embodiments of the present invention are described in Embodiments 2 to 7. Note that one embodiment of the present invention is not limited to the above examples. Although an example in which one embodiment of the present invention is applied to an imaging device is described, one embodiment of the present invention is not limited thereto. Depending on circumstances or conditions, one embodiment of the present invention is not necessarily applied to an imaging device. One embodiment of the present invention may be applied to a semiconductor device with another function, for example.

Note that the configurations shown in FIG. 1 to FIGS. 8A and 8B, FIG. 10, FIG. 12, and FIG. 14 can be combined with each other arbitrarily.

This embodiment can be implemented in an appropriate combination with any of the structures described in the other embodiments.

Embodiment 2

In this embodiment, a whole configuration of an imaging device of one embodiment of the present invention will be described with reference to FIG. 17.

Figure 17:
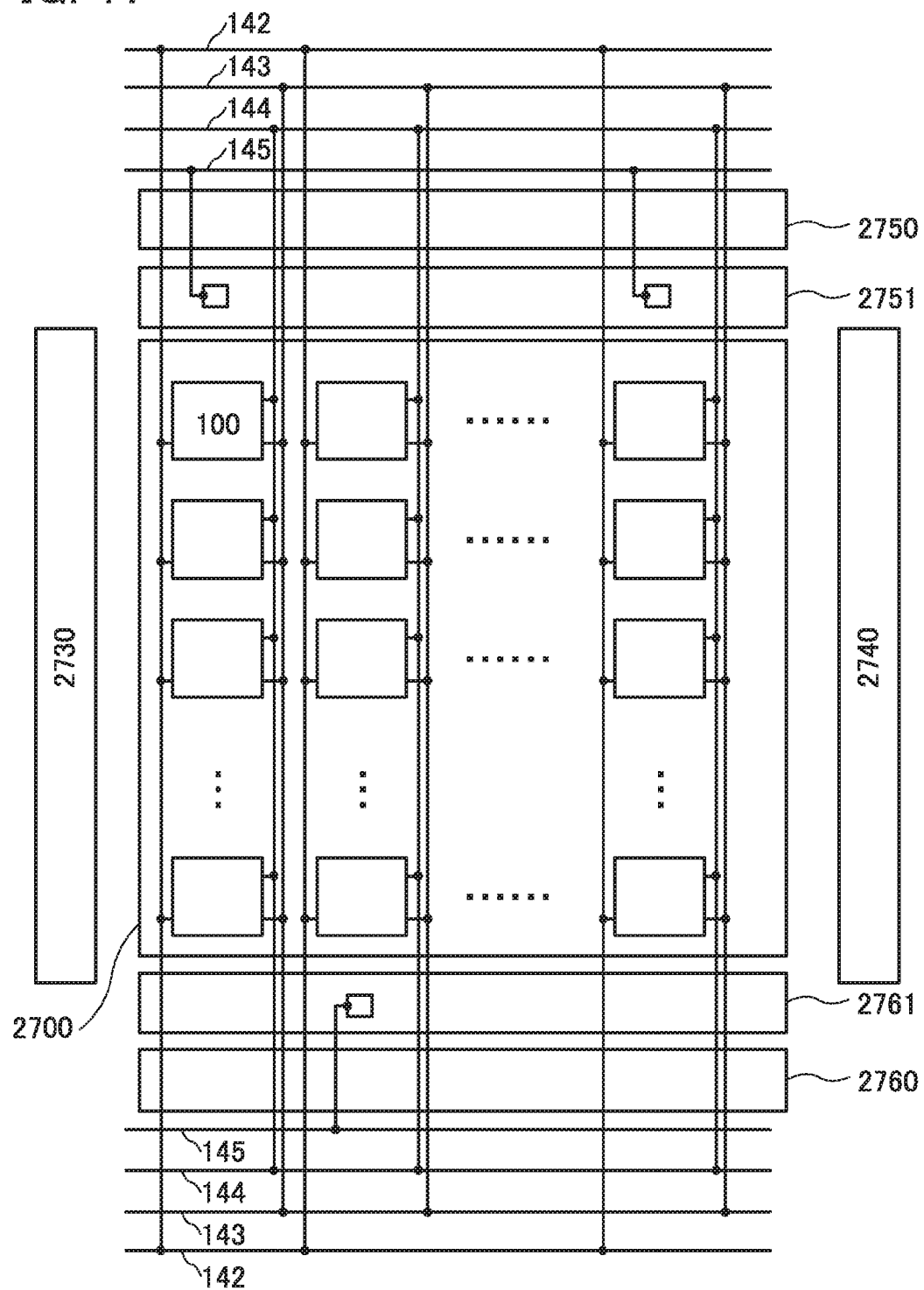
FIG. 17 is a block diagram illustrating an imaging device.

FIG. 17 is a block diagram illustrating the configuration of the imaging device. The imaging device includes a pixel array 2700 in which the plurality of pixels 100 are arranged in matrix; a circuit 2730; a circuit 2740; a circuit 2750; a circuit 2760; a bias transistor array 2751; a bias transistor array 2761; and the wirings 142 to 145.

Note that the pixel 100 in FIG. 17 has the circuit configuration shown in FIG. 1 but may have any circuit configuration. For example, the pixel 100 in FIG. 17 may have any of the circuit configurations shown in FIG. 1 to FIGS. 6A and 6B. In the case where the pixel 100 in FIG. 17 has the circuit configuration shown in FIG. 5, for example, the imaging device in FIG. 17 includes the wiring 141 in addition to the wirings 142 to 145.

The circuit 2730 and the circuit 2740 are connected to the pixel array 2700 with wirings (not illustrated). The circuit 2730 can function as a driver circuit of a reset transistor, for example. In this case, the circuit 2730 is electrically connected to the wiring 152 in FIG. 1. The circuit 2740 can function as a driver circuit for a transfer transistor, for example. In this case, the circuit 2740 is electrically connected to the wiring 154 in FIG. 1. Alternatively, the circuit 2730 or the circuit 2740 can function as a driver circuit for a selection transistor. In this case, the circuit 2730 or the circuit 2740 is electrically connected to the wiring 151 in FIG. 1. Note that although the circuit 2730 and the circuit 2740 are separately provided in FIG. 17, the circuit 2730 and the circuit 2740 may be collectively arranged in one region.

Furthermore, the pixel array 2700 is connected to the circuit 2750 and the circuit 2760 with a wiring (not illustrated). The circuit 2750 and the circuit 2760 can each function as a driver circuit which selects a vertical output circuit electrically connected to the other of the source electrode and the drain electrode of the transistor 123 shown in FIG. 1, for example. Note that only one of the circuit 2750 and the circuit 2760 may be provided for the driving of the vertical output circuit.

In each of the bias transistor array 2751 and the bias transistor array 2761, the transistor 125 shown in FIG. 1 is provided. Note that only one of the bias transistor array 2751 and the bias transistor array 2761 may be provided.

Note that the circuits 2730, 2740, 2750, and 2760 may be formed over the same substrate as the pixel 100, or may be included in an external IC chip.

Figure 18:
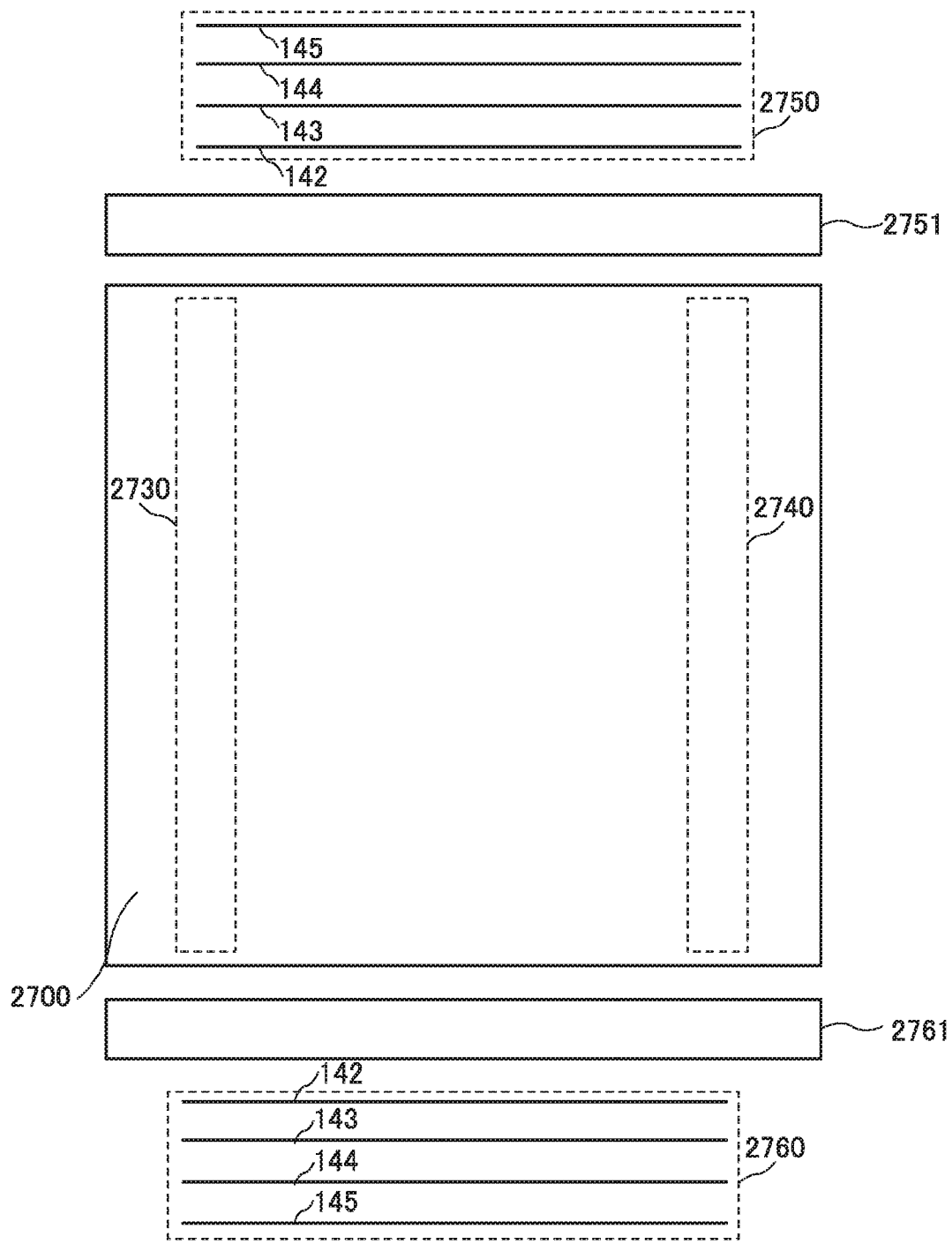
FIG. 18 is a block diagram illustrating an imaging device.

As illustrated in FIG. 18, the imaging device may have a stacked-layer structure including two layers. The circuit 2730, the circuit 2740, the circuit 2750, and the circuit 2760, which are shown by dotted lines, may be provided in a first layer. The pixel array 2700, the bias transistor array 2751, the bias transistor array 2761, and the wiring 142 to 145, which are shown by solid lines, may be provided in a second layer. In this case, the wirings 142 to 145 can be provided in a region overlapping with the circuit 2730, the circuit 2740, the circuit 2750, and the circuit 2760. Therefore, the chip area can be reduced. The wirings 142 to 145 can have flexibility in arrangement of the wirings 142 to 145, so that the wirings 142 to 145 are easily connected to an IO pin. Note that the imaging device may have a stacked-layer structure including three or more layers.

Note that although two wirings 142, two wirings 143, two wirings 144, and two wirings 145 are provided in each of FIG. 17 and FIG. 18, a configuration including one wiring 142, one wiring 143, one wiring 144, and one wiring 145 may be employed.

This embodiment can be implemented in an appropriate combination with any of the structures described in the other embodiments.

Embodiment 3

In this embodiment, a configuration of a pixel in an imaging device of one embodiment of the present invention will be described with reference to FIGS. 19A to 19C, FIGS. 20A to 20E, FIGS. 21A and 21B, FIGS. 22A to 22F, FIG. 23, FIGS. 24A and 24B, FIG. 25, FIG. 26, FIG. 27, FIGS. 28A to 28D, and FIGS. 29A1, 29A2, 29A3, 29B1, 29B2, and 29B3.

Figure 19A:
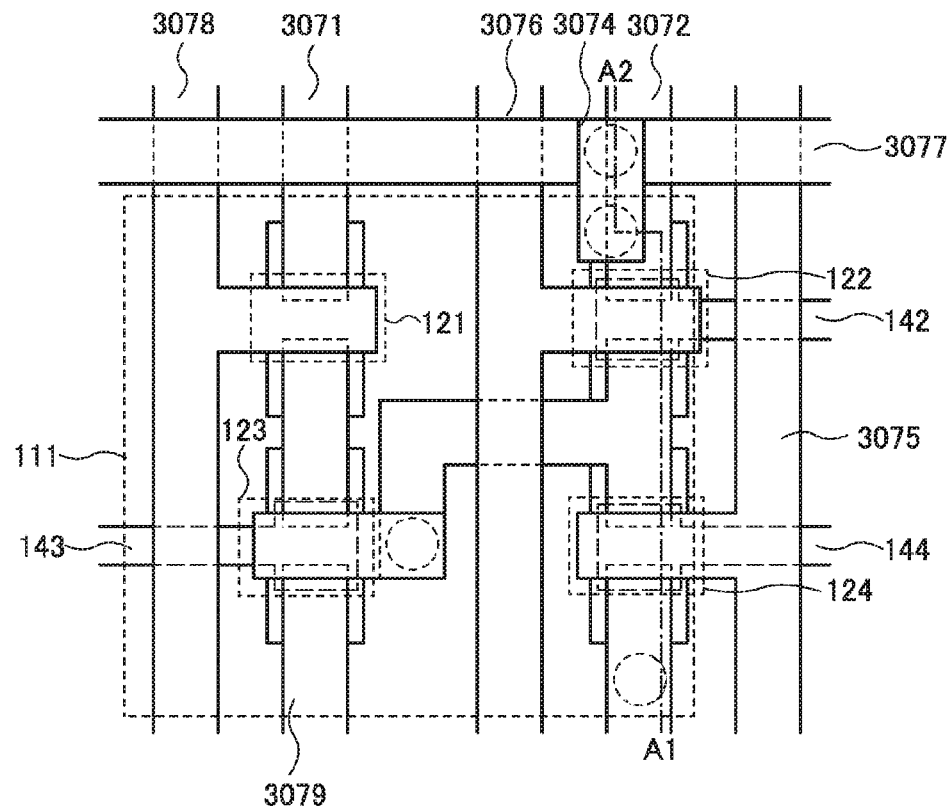
FIGS. 19A to 19C are top views and a cross-sectional view illustrating an imaging device.
Figure 19B:
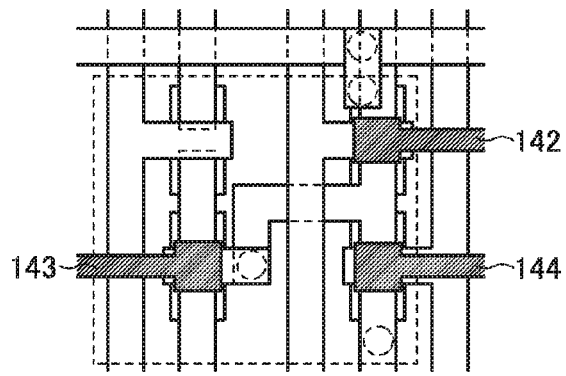
Figure 19C:
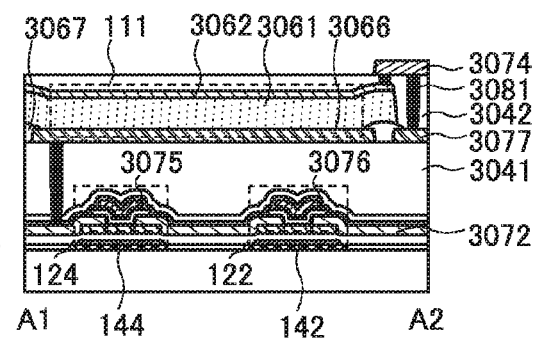

FIG. 19A is a top view of one pixel of the imaging device having the circuit configuration shown in FIG. 1. FIG. 19B is a top view showing the hatched wirings 142 to 144 each functioning as a back gate electrode in FIG. 19A. FIG. 19C is a cross-sectional view along line A1-A2 in FIG. 19A. Note that in the above drawings, some components are not illustrated for clarity.

Note that electrical connection between the above components is only an example. Although the wirings, the electrodes, and a conductive film 3081 are illustrated as independent components in the drawings, some of them are provided as one component in some cases when they are electrically connected to each other. In addition, an insulating film 3041 and an insulating film 3042 that serve as interlayer insulating films or planarizing films are provided between the components.

For example, an inorganic insulating film such as a silicon oxide film or a silicon oxynitride film can be used as the insulating films 3041 and 3042. Alternatively, an organic insulating film such as an acrylic resin film or a polyimide resin film may be used. Top surfaces of the insulating films 3041 and 3042 and the like are preferably planarized by chemical mechanical polishing (CMP) or the like.

There are a case where one or more of the wirings are not provided and a case where another wiring or transistor is included in any of the layers. Furthermore, another layer may be included in the stacked-layer structure. In addition, one or more of the layers are not included in some cases.

The pixel includes a wiring 3071, a wiring 3072, and a wiring 3074, a wiring 3075, a wiring 3076, a wiring 3077, a wiring 3078, and a wiring 3079 in addition to the photodiode 111, the transistors 121 to 124, and the wirings 142 to 144.

The wiring 3071 can function as the one of the source electrode and the drain electrode of the transistor 121. The wiring 3072 can function as the one of the source electrode and the drain electrode of the transistor 122. The wiring 3075 can function as a gate electrode of the transistor 124. The wiring 3076 can function as the gate electrode of the transistor 122. The wiring 3078 can function as the gate electrode of the transistor 121. The wiring 3079 can function as the one of the source electrode and the drain electrode of the transistor 123.

For example, one of wirings 3071 and 3079 can function as a power supply line, and the other of the wirings 3071 and 3079 can function as an output line. The wirings 3072 and 3077 can each function as a power supply line. The wiring 3074 can function as a connection wiring. The wirings 3075, 3076, and 3078 can each function as a signal line for controlling the on/off states of the transistors.

In the photodiode 111, a selenium-based material, which has high external quantum efficiency to visible light, is preferably used for a photoelectric conversion film 3061. Moreover, the use of the photodiode can achieve a highly sensitive sensor in which the amplification of electrons with respect to the amount of incident light is large owing to an avalanche phenomenon. Furthermore, the selenium-based material has a high light-absorption coefficient, which leads to an advantage that the photoelectric conversion film 3061 can be formed thin easily.

Amorphous selenium or crystalline selenium can be used as a selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity to and a higher absorption coefficient for visible light than amorphous selenium.

Furthermore, the photoelectric conversion film 3061 may be a layer including a compound of copper, indium, and selenium (CIS). Alternatively, a layer including a compound of copper, indium, gallium, and selenium (CIGS) may be used. With the CIS film or the CIGS film, the photodiode 111 that can utilize an avalanche phenomenon in a manner similar to that of a single layer of selenium can be formed.

In the photodiode 111 including a selenium-based material, for example, the photoelectric conversion film 3061 can be provided between a light-transmitting conductive film 3062 and an electrode 3066 formed using a metal material or the like. Furthermore, to prevent leakage current and the like, an oxide semiconductor film containing zinc oxide or the like may be provided in contact with the photoelectric conversion film 3061.

Figure 20A:
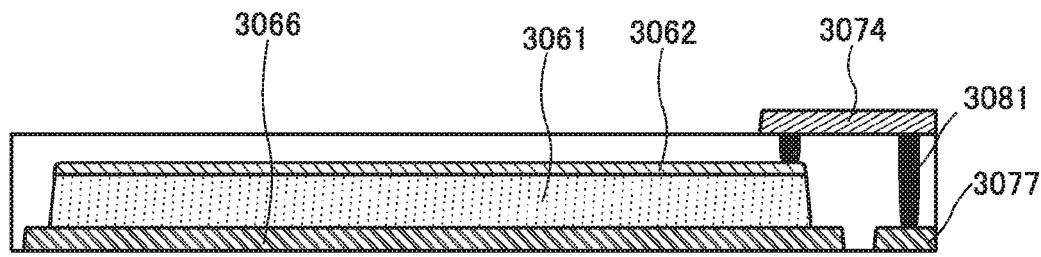
FIGS. 20A to 20E are each a cross-sectional view illustrating the connection configuration of a photodiode.
Figure 20B:
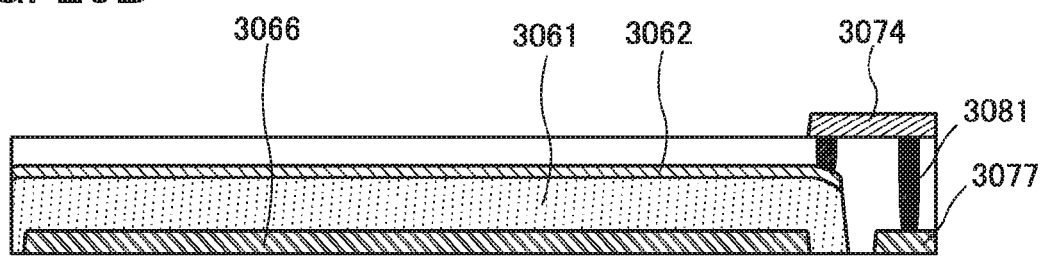
Figure 20C:
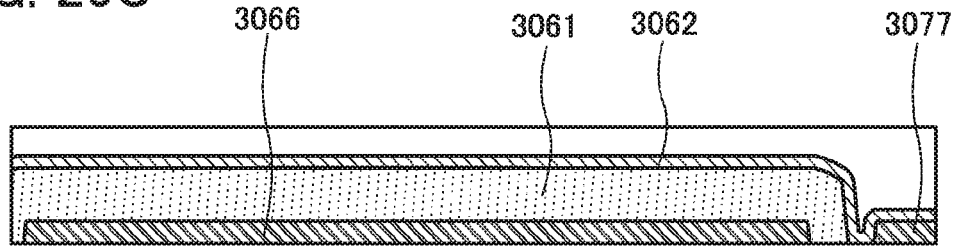
Figure 20D:
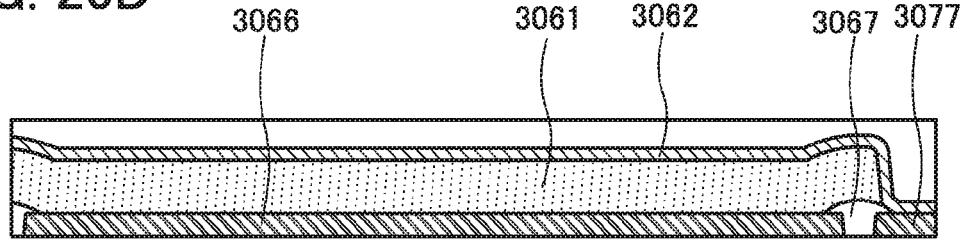
Figure 20E:
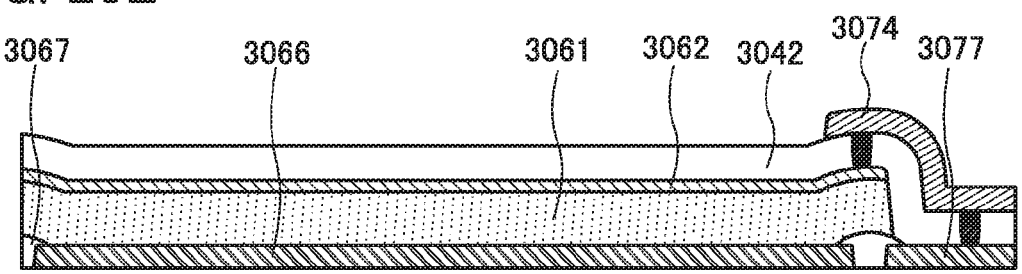

Although the photoelectric conversion film 3061 and the light-transmitting conductive film 3062 are not divided between pixels in FIGS. 19A to 19C, they may be divided between circuits as illustrated in the cross-sectional view of FIG. 20A. Furthermore, as illustrated in FIG. 19C, a partition wall 3067 formed of an insulating film is preferably provided in a region between pixels where the wiring 3077 and the electrode 3066 are not provided not to generate a crack in the photoelectric conversion film 3061 and the light-transmitting conductive film 3062; however, the partition wall 3067 is not necessarily provided as illustrated in FIG. 20B. Alternatively, as illustrated in FIGS. 20C and 20D, the light-transmitting conductive film 3062 may be directly in contact with the wiring 3077. The insulating film 3042 is not necessarily planarized as illustrated in FIG. 20E.

Note that the partition wall 3067 can be formed using an inorganic insulating film, an insulating organic resin, or the like. The partition wall 3067 may be colored black or the like in order to shield the transistors and the like from light and/or to determine the area of a light-receiving portion in each pixel.

A diode element formed using a silicon substrate with a pn junction or a pin junction can be used as the photodiode 111. Alternatively, a PIN diode element formed using an amorphous silicon film, a microcrystalline silicon film, or the like may be used, for example.

Figure 21A:
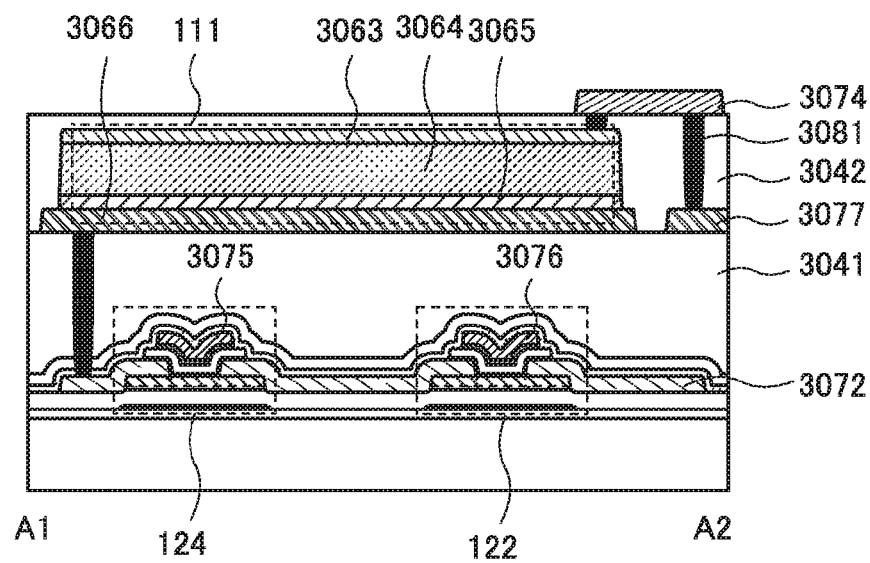
FIGS. 21A and 21B are each a cross-sectional view illustrating an imaging device.

FIG. 21A illustrates an example in which a thin film PIN photodiode is used as the photodiode 111. In the photodiode, an n-type semiconductor film 3065, an i-type semiconductor film 3064, and a p-type semiconductor film 3063 are stacked in this order. The i-type semiconductor film 3064 is preferably formed using amorphous silicon. The p-type semiconductor film 3063 and the n-type semiconductor film 3065 can each be formed using amorphous silicon, microcrystalline silicon, or the like that includes a dopant imparting the corresponding conductivity type. A photodiode in which a photoelectric conversion film is formed of amorphous silicon has high sensitivity in a visible light wavelength region, and therefore can easily sense weak visible light.

In the photodiode 111 illustrated in FIG. 21A, the n-type semiconductor film 3065 functioning as a cathode is electrically connected to an electrode layer which is electrically connected to the transistor 122. Furthermore, the p-type semiconductor film 3063 functioning as an anode is electrically connected to the wiring 3077.

Note that in any case, the photodiode 111 is preferably formed so that the p-type semiconductor film 3063 serves as a light-receiving surface, in which case the output current of the photodiode 111 can be increased.

The structure of the photodiode 111 having a configuration of a PIN thin film photodiode and the connection configuration between the photodiode 111 and the wirings may be any of examples shown in FIGS. 22A to 22F. Note that the structure of the photodiode 111 and the connection configuration between the photodiode 111 and the wirings are not limited thereto and other configurations may be applied.

Figure 22A:
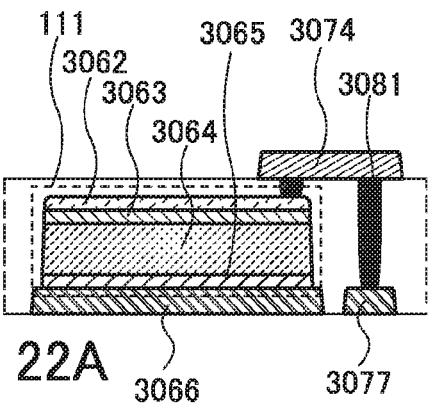
FIGS. 22A to 22F are each a cross-sectional view illustrating the connection configuration of a photodiode.

FIG. 22A illustrates a structure of the photodiode 111 that includes the light-transmitting conductive film 3062 in contact with the p-type semiconductor film 3063. The light-transmitting conductive film 3062 serves as an electrode and can increase the output current of the photodiode 111.

For the light-transmitting conductive film 3062, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; or the like. The light-transmitting conductive film 3062 is not limited to a single layer, and may be a stacked layer of different films.

Figure 22B:
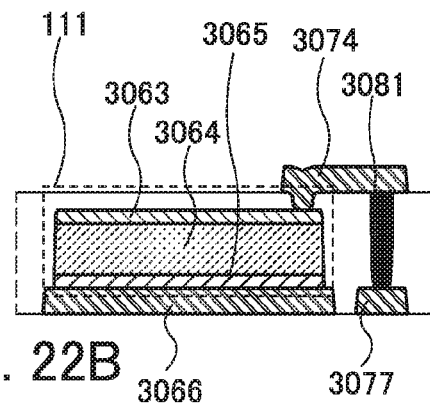

FIG. 22B illustrates a structure of the photodiode 111 in which the p-type semiconductor film 3063 is electrically connected directly to the wiring 3074.

Figure 22C:
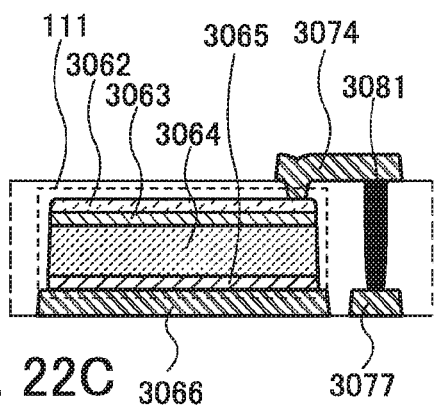

FIG. 22C illustrates a structure of the photodiode 111 which includes the light-transmitting conductive film 3062 in contact with the p-type semiconductor film 3063 and in which the wiring 3074 is electrically connected to the light-transmitting conductive film 3062.

Figure 22D:
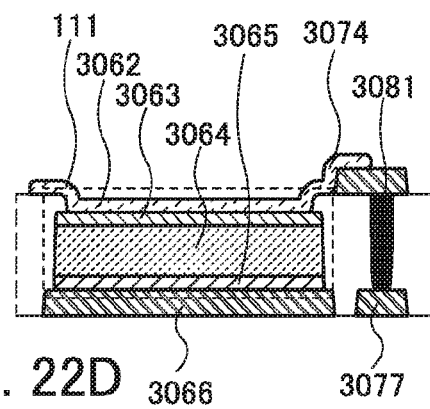

FIG. 22D illustrates a structure in which an opening exposing the p-type semiconductor film 3063 is provided in an insulating film covering the photodiode 111, and the light-transmitting conductive film 3062 that covers the opening is electrically connected to the wiring 3074.

Figure 22E:
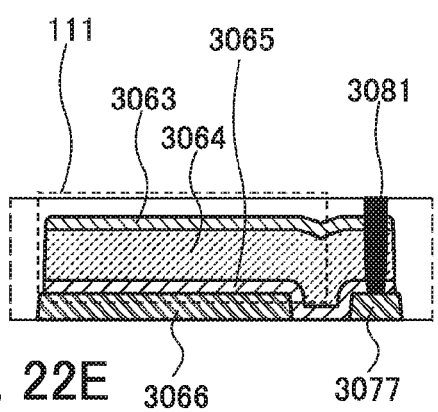

FIG. 22E illustrates a structure including the conductive film 3081 which penetrates the photodiode 111. In the structure, the wiring 3077 is electrically connected to the p-type semiconductor film 3063 through the conductive film 3081. Note that in the drawing, the wiring 3077 appears to be electrically connected to the electrode 3066 through the n-type semiconductor film 3065. However, because of a high resistance in the lateral direction of the n-type semiconductor film 3065, the resistance between the wiring 3077 and the electrode layer is extremely high when there is an appropriate distance therebetween. Thus, the photodiode 111 can have diode characteristics without a short circuit between the anode and the cathode.

Figure 22F:
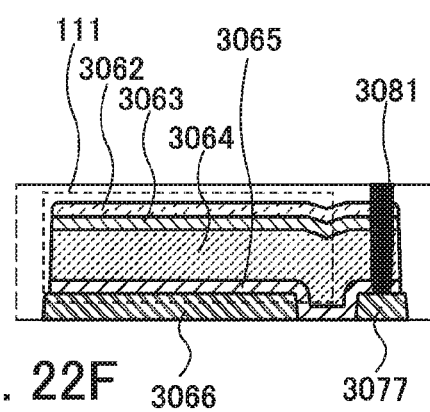

FIG. 22F illustrates a structure in which the photodiode 111 in FIG. 22E is provided with the light-transmitting conductive film 3062 in contact with the p-type semiconductor film 3063.

Note that each of the photodiodes 111 illustrated in FIGS. 22D to 22F has an advantage of having a large light-receiving area because wirings and the like do not overlap with a light-receiving region.

Figure 21B:
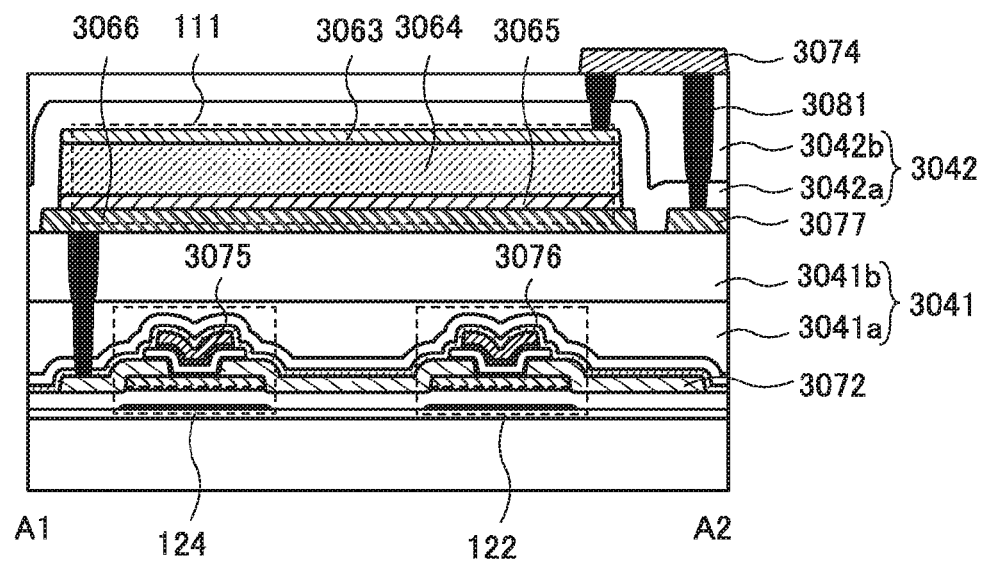

As illustrated in FIG. 21B, the insulating films 3041 and 3042 may each be a multilayer. As illustrated in the drawing, the conductive film 3081 has a step in the case where the insulating film 3041 includes an insulating film 3041a and an insulating film 3041b that have different etching rates. The same applies to the case where the insulating film 3042 includes an insulating film 3042a and an insulating film 3042b.

Figure 23:
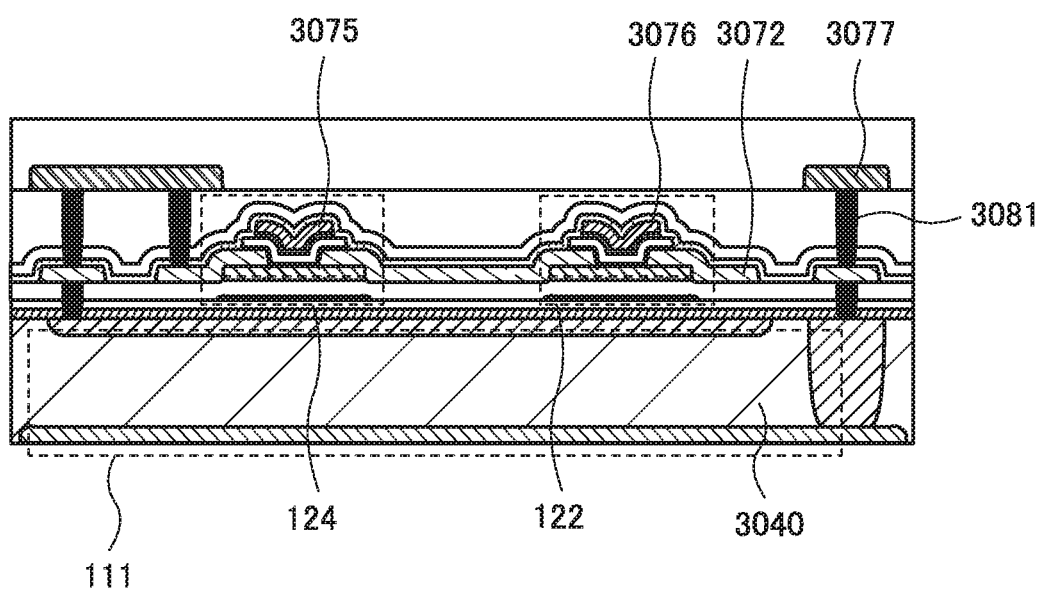
FIG. 23 is a cross-sectional view illustrating an imaging device.

As the photodiode 111, a photodiode in which a silicon substrate 3040 is used as a photoelectric conversion film as illustrated in FIG. 23 can also be used.

The photodiode 111 formed using the aforementioned selenium-based material, amorphous silicon, or the like can be formed through general semiconductor manufacturing processes such as a deposition process, a lithography process, and an etching process. In addition, because the resistance of the selenium-based material is high, the photoelectric conversion film 3061 does not need to be divided between circuits as illustrated in FIG. 19C. Therefore, the imaging device of one embodiment of the present invention can be manufactured with a high yield at low cost. In contrast, a photodiode including a crystalline silicon substrate as the photoelectric conversion film requires difficult processes such as a polishing process and a bonding process.

Figure 24A:
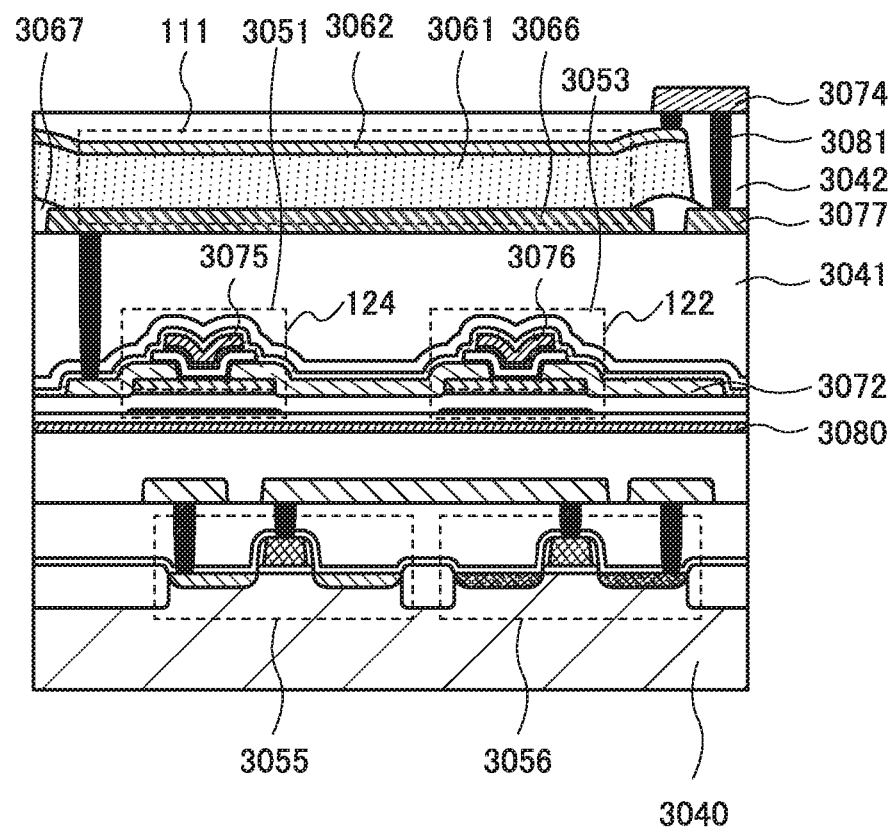
FIGS. 24A and 24B are cross-sectional views each illustrating an imaging devices.

Furthermore, the imaging device of one embodiment of the present invention may be stacked over the silicon substrate 3040 including circuits. For example, as illustrated in FIGS. 24A and 24B, the pixel circuit may overlap with transistors 3055 and 3056 whose active regions are formed in the silicon substrate 3040.

The circuit formed using the silicon substrate 3040 is capable of reading a signal output from the pixel circuit and converting the signal; for example, the circuit may include a CMOS inverter. A gate of the transistor 3055 (n-channel transistor) is electrically connected to a gate of the transistor 3056 (p-channel transistor). One of a source electrode and a drain electrode of one of the transistors 3055 and 3056 is electrically connected to one of a source electrode and a drain electrode of the other of the transistors 3055 and 3056. The other of the source electrode and the drain electrode of the one transistor is electrically connected to a wiring and the other of the source electrode and the drain electrode of the other transistor is electrically connected to another wiring.

The silicon substrate 3040 is not limited to a bulk silicon substrate and can be a substrate made of germanium, silicon germanium, silicon carbide, gallium arsenide, aluminum gallium arsenide, indium phosphide, gallium nitride, or an organic semiconductor.

Figure 24B:
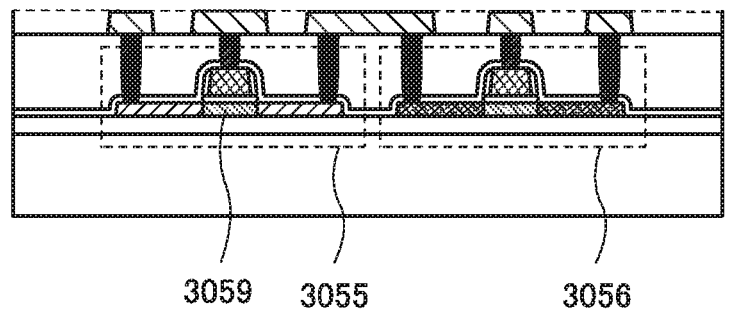

As illustrated in FIG. 24B, the transistors 3055 and 3056 may each be a transistor including an active layer 3059 formed using a silicon thin film. The active layer 3059 can be formed using polycrystalline silicon or single crystal silicon of a silicon-on-insulator (SOI) structure.

In the stack, an insulating film 3080 is provided between the layer including the transistors 3055 and 3056 and the layer including the transistors 124 and 123.

Dangling bonds of silicon are terminated with hydrogen in insulating films provided in the vicinities of the active regions of the transistors 3055 and 3056. Therefore, hydrogen has an effect of improving the reliability of the transistors 3055 and 3056. Meanwhile, hydrogen in insulating films provided in the vicinity of the oxide semiconductor film that is the active layer of the transistor 124 or the like causes generation of carriers in the oxide semiconductor film, and therefore may reduce the reliability of the transistor 124 or the like. Thus, the insulating film 3080 having a function of preventing diffusion of hydrogen is preferably provided between one layer including the Si transistor and another layer stacked thereon that includes the OS transistor. Hydrogen is confined in the one layer by the insulating film 3080, so that the reliability of the transistors 3055 and 3056 can be improved. Furthermore, diffusion of hydrogen from the one layer to the other layer is inhibited, so that the reliability of the transistor 124 or the like can also be improved.

The insulating film 3080 can be formed using, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Note that as illustrated in FIGS. 24A and 24B, a circuit (e.g., a driver circuit) formed using the silicon substrate 3040, the transistor 124 or the like, and the photodiode 111 can overlap with each other; thus, the integration degree of pixels can be increased. In other words, the resolution of the imaging device can be increased. Such a structure is suitable for an imaging device with, for example, 4K2K, 8K4K, or 16K8K pixels. Note that the imaging device with 8K4K pixels can be referred to as 33M because it includes 33 million of pixels.

In the imaging device in FIG. 24A, the silicon substrate 3040 is not provided with a photodiode. Therefore, an optical path for the photodiode 111 can be secured without being influenced by the transistors or wirings, and a pixel with a high aperture ratio can be formed.

Figure 25:
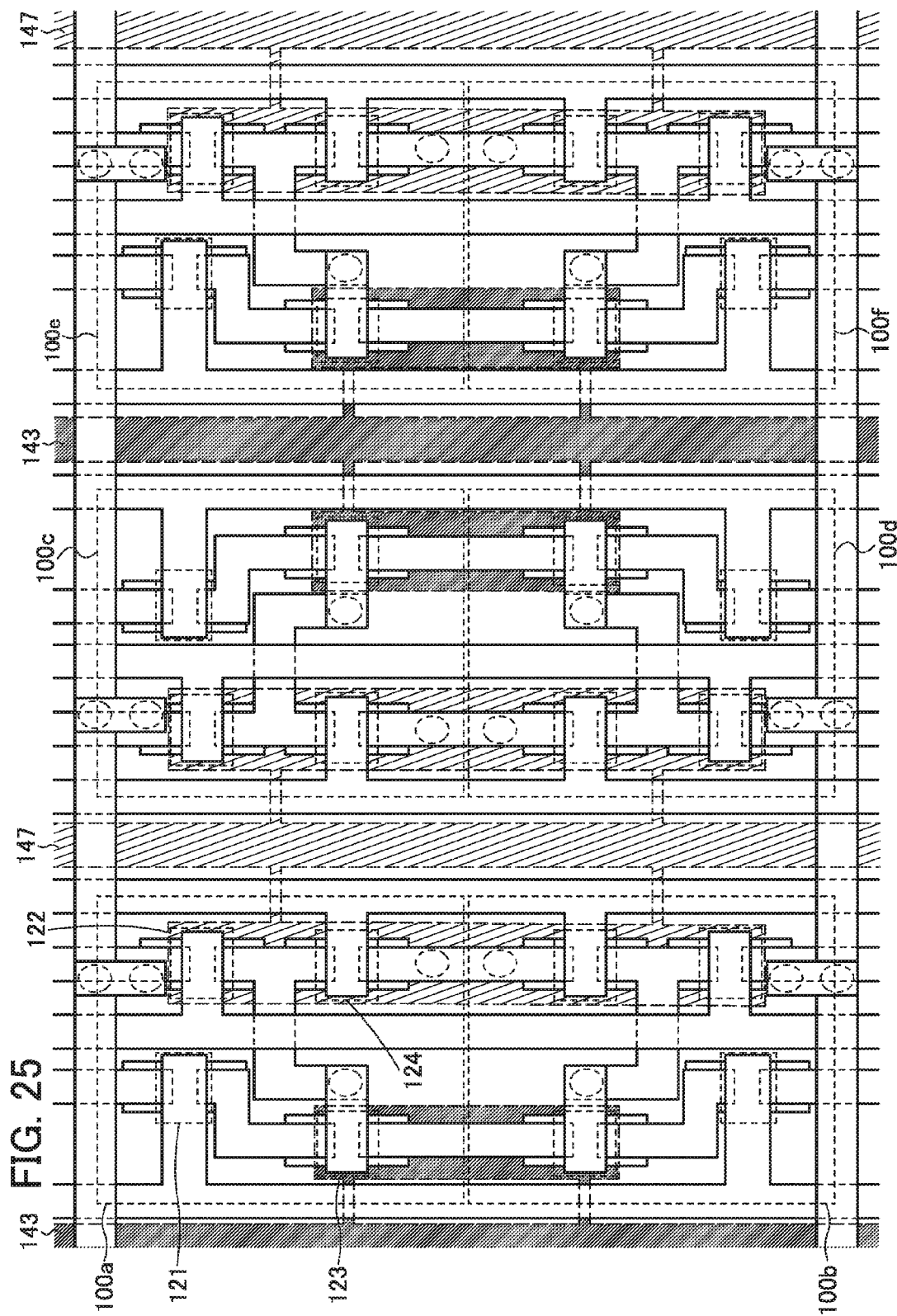
FIG. 25 is a top view illustrating an imaging device.

FIG. 25, FIG. 26, and FIG. 27 are each a top view showing a pixel 100a, a pixel 100b, a pixel 100c, a pixel 100d, a pixel 100e, and a pixel 100f. Each of the pixels 100a to 100f has any of the circuit configurations shown in FIG. 4 and FIGS. 6A and 6B. The pixels 100a to 100f are arranged in two rows and three columns.

When the transistors 121 to 124 are arranged so as to be axisymmetric with respect to the central line between the adjacent pixels, the wiring functioning as a back gate can be shared among the pixels arranged in the same row or column and the pixels arranged in one of the two adjacent rows or columns. In the case of FIG. 25, for example, the wiring 143 can be shared among the pixels 100c to 100f, and the wiring 147 can be shared among the pixels 100a to 100d. In the case of FIG. 26, for example, the wiring 147 can be shared among the pixels 100a to 100d, and the wiring 148 can be shared among the pixels 100c to 100f. In the case of FIG. 27, for example, the wiring 143 can be shared among the pixels 100c to 100f, and the wiring 149 can be shared among the pixels 100a to 100d. Accordingly, the imaging device in this case can be manufactured in a simpler process than that in the case where the pixels 100 are not arranged so as to be axisymmetric with respect to the central line between the adjacent pixels.

Note that the distance between the transistor 121 and the transistors 122, 123, and 124 in each of FIG. 25 and FIG. 27 is preferably shorter than but may be the same as that in FIG. 19A.

Application of a sufficiently low potential to a gate electrode of a transistor to be turned off can suppress generation of off-state current even when a positive potential is applied to a back gate electrode of the transistor to be turned off.

Figure 28A:
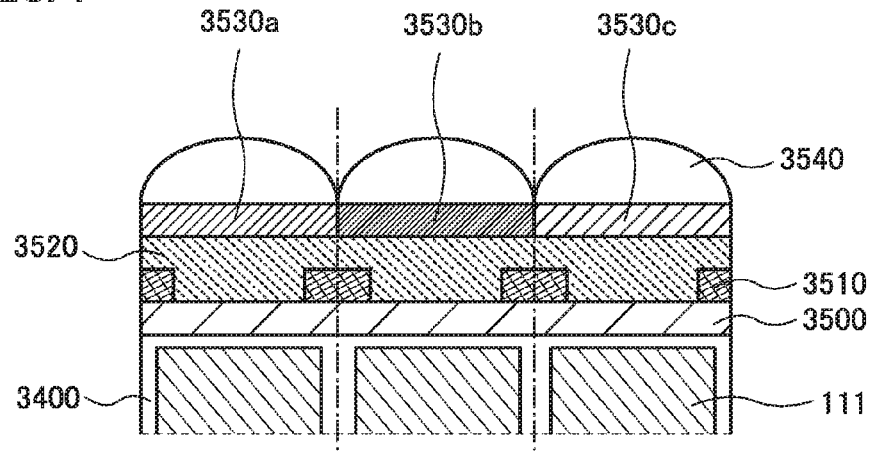
FIGS. 28A to 28D are cross-sectional views each illustrating a structure of an imaging device.
Figure 28B:
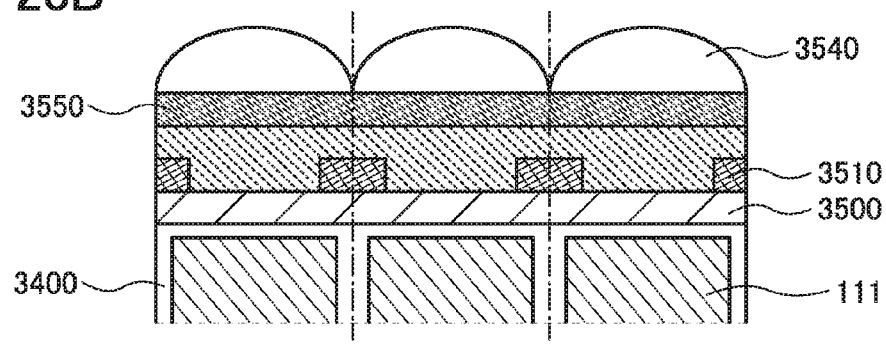

FIG. 28A is a cross-sectional view of an example of the mode in which a color filter and the like are added to the imaging device described with reference to FIGS. 19A to 19C, illustrating part of a region including pixel circuits for three pixels. An insulating film 3500 is formed over a region 3400 in which the photodiode 111 is formed. As the insulating film 3500, for example, a silicon oxide film with a high visible-light transmitting property can be used. In addition, a silicon nitride film may be stacked as a passivation film. In addition, a dielectric film of hafnium oxide or the like may be stacked as an anti-reflection film.

A light-blocking layer 3510 is formed over the insulating film 3500. The light-blocking layer 3510 has a function of inhibiting color mixing of light passing through the color filter. The light-blocking layer 3510 can be formed of a metal layer of aluminum, tungsten, or the like, or a stack including the metal layer and a dielectric film functioning as an anti-reflection film.

An organic resin layer 3520 is formed as a planarization film over the insulating film 3500 and the light-blocking layer 3510. Color filters 3530a, 3530b, and 3530c formed in each pixel. The color filters 3530a, 3530b, and 3530c have any of colors of R (red), G (green), B (blue), Y (yellow), C (cyan), M (magenta), and the like, whereby a color image can be obtained.

A microlens array 3540 is provided over the color filters 3530a, 3530b, and 3530c. Thus, light penetrating lenses included in the microlens array 3540 go through the color filters positioned therebelow to reach the photodiode. Note that a structure that is not provided with the microlens array 3540 may be employed.

In the above structure of the imaging device, an optical conversion layer 3550 (see FIG. 28B) may be used instead of the color filters 3530a, 3530b, and 3530c. Such a structure enables the imaging device to take images in various wavelength regions.

For example, when a filter which blocks light having a wavelength shorter than or equal to that of visible light is used as the optical conversion layer 3550, an infrared imaging device can be obtained. When a filter which blocks light having a wavelength shorter than or equal to that of near-infrared light is used as the optical conversion layer 3550, a far-infrared imaging device can be obtained. When a filter which blocks light having a wavelength longer than or equal to that of visible light is used as the optical conversion layer 3550, an ultraviolet imaging device can be obtained.

Furthermore, when a scintillator is used as the optical conversion layer 3550, an imaging device which takes an image visualizing the intensity of radiation and is used as an X-ray imaging device, for example, can be obtained. Radiation such as X-rays passes through a subject to enter a scintillator, and then is converted into light (fluorescence) such as visible light or ultraviolet light owing to a phenomenon known as photoluminescence. Then, the photodiode 111 detects the light to obtain image data. The imaging device having such a structure may be used in a radiation detector or the like.

A scintillator is formed of a substance that, when irradiated with radiation such as X-rays or gamma-rays, absorbs energy of the radiation to emit visible light or ultraviolet light, or a material including such a substance. For example, materials such as $Gd_2O_2S:Tb$, $Gd_2O_2S:Pr$, $Gd_2O_2S:Eu$, BaFCl:Eu, NaI, CsI, $CaF_2$, $BaF_2$, $CeF_3$, LiF, LiI, or ZnO and a resin or ceramics in which any of the materials is dispersed are known.

Note that in the photodiode 111 using a selenium-based material, radiation such as X-rays can be directly converted into electrical charges; thus, the scintillator is not necessarily used.

Figure 28C:
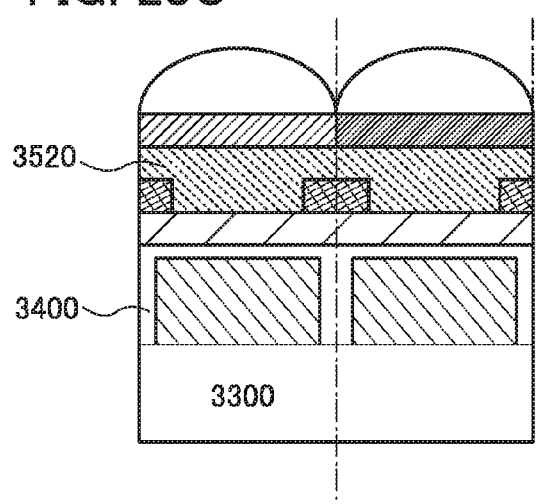

Note that in an imaging device of one embodiment of the present invention, a region 3300 including an OS transistor may be provided under the region 3400 as illustrated in FIG. 28C. The region 3300 and the region 3400 can have, for example, any of the structures illustrated in FIGS. 19A to 19C, FIGS. 21A and 21B, and FIG. 23.

Figure 28D:
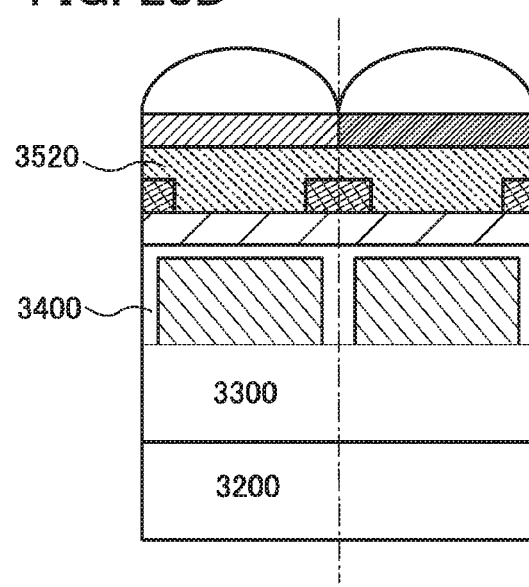

In another imaging device of one embodiment of the present invention, the region 3300 including an OS transistor may be provided under the region 3400 and a region 3200 including a Si transistor may be provided under the region 3300 as illustrated in FIG. 28D. The region 3200, the region 3300, and the region 3400 can have, for example, any of the structures illustrated in FIGS. 24A and 24B.

As illustrated in FIGS. 29A1 and 29B1, the imaging device may be bent. FIG. 29A1 illustrates a state in which the imaging device is bent in the direction of dashed-two dotted line X1-X2. FIG. 29A2 is a cross-sectional view illustrating a portion indicated by dashed-two dotted line X1-X2 in FIG. 29A1. FIG. 29A3 is a cross-sectional view illustrating a portion indicated by dashed-two dotted line Y1-Y2 in FIG. 29A1.

FIG. 29B1 illustrates a state where the imaging device is bent in the direction of dashed-two dotted line X3-X4 and the direction of dashed-two dotted line Y3-Y4. FIG. 29B2 is a cross-sectional view illustrating a portion indicated by dashed-two dotted line X3-X4 in FIG. 29B1. FIG. 29B3 is a cross-sectional view illustrating a portion indicated by dashed-two dotted line Y3-Y4 in FIG. 29B1.

The bent imaging device enables the curvature of field and astigmatism to be reduced. Thus, the optical design of lens and the like, which are used in combination of the imaging device, can be facilitated. For example, the number of lenses used for aberration correction can be reduced; accordingly, the size or weight of semiconductor devices including the imaging device can be easily reduced. In addition, the quality of a captured image can be improved.

This embodiment can be combined with any of the structures described in the other embodiments as appropriate.

Embodiment 4

In this embodiment, a transistor including an oxide semiconductor that can be used in one embodiment of the present invention is described with reference to FIG. 30A to 30F, FIG. 31A to 31F, FIGS. 32A and 32B, FIG. 33A to 33E, FIG. 34A to 34F, FIG. 35A to 35F, FIGS. 36A and 36B, FIGS. 37A and 37B, and FIG. 38A to 30C. In the drawings in this embodiment, some components are enlarged, reduced in size, or omitted for easy understanding.

Figure 30A:
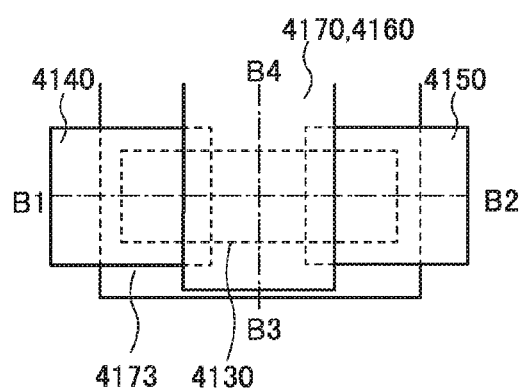
FIGS. 30A to 30F are top views and cross-sectional views of transistors.
Figure 30B:
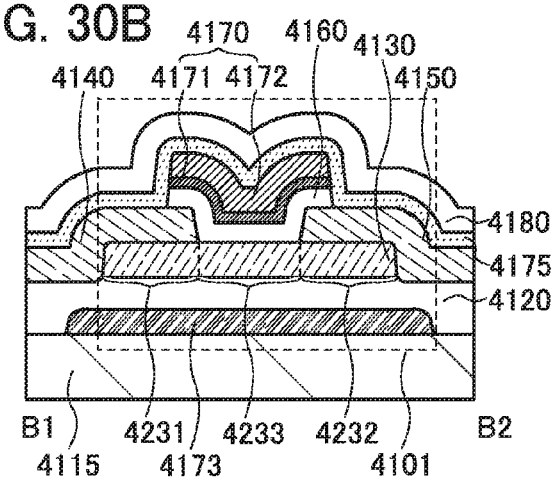
Figure 32A:
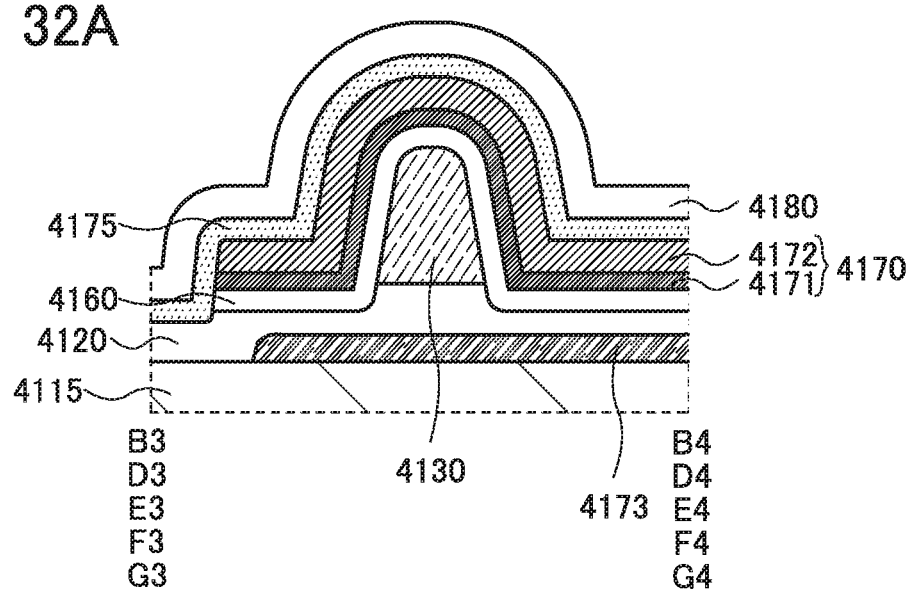
FIGS. 32A and 32B are cross-sectional views illustrating transistors.

FIGS. 30A and 30B are a top view and a cross-sectional view illustrating a transistor 4101 of one embodiment of the present invention. FIG. 30A is a top view, and a cross section in the direction of a dashed-dotted line B1-B2 in FIG. 30A is illustrated in FIG. 30B. A cross section in the direction of a dashed-dotted line B3-B4 in FIG. 30A is illustrated in FIG. 32A. In some cases, the direction of the dashed-dotted line B1-B2 is referred to as a channel length direction, and the direction of the dashed-dotted line B3-B4 is referred to as a channel width direction.

The transistor 4101 includes a conductive film 4173 in contact with a substrate 4115; an insulating film 4120 in contact with the substrate 4115 and the conductive film 4173; an oxide semiconductor film 4130 in contact with the insulating film 4120; a conductive film 4140 and a conductive film 4150 which are electrically connected to the oxide semiconductor film 4130; an insulating film 4160 in contact with the oxide semiconductor film 4130, the conductive film 4140, and the conductive film 4150; a conductive film 4170 in contact with the insulating film 4160; an insulating film 4175 in contact with the conductive film 4140, the conductive film 4150, the insulating film 4160, and the conductive film 4170; and an insulating film 4180 in contact with the insulating film 4175. The insulating film 4180 may function as a planarization film as necessary.

Here, the conductive film 4140 can function as one of a source electrode and a drain electrode. The conductive film 4150 can function as the other of the source electrode and the drain electrode. The insulating film 4160 can function as a gate insulating film. The conductive film 4170 can function as a first gate electrode. The conductive film 4173 can function as a second gate electrode (also referred to as a back gate electrode). A structure of a transistor in which a channel formation region is electrically surrounded by the first gate electrode and the second gate electrode is referred to as a surrounded channel (s-channel) structure.

A region 4231, a region 4232, and a region 4233 in FIG. 30B can function as a source region, a drain region, and a channel formation region, respectively. The region 4231 and the region 4232 are in contact with the conductive film 4140 and the conductive film 4150, respectively. When a conductive material that is easily bonded to oxygen is used for the conductive film 4140 and the conductive film 4150, for example, the resistance of the region 4231 and the region 4232 can be reduced.

Specifically, since the oxide semiconductor film 4130 is in contact with the conductive film 4140 and the conductive film 4150, an oxygen vacancy is generated in the oxide semiconductor film 4130, and interaction between the oxygen vacancy and hydrogen that remains in the oxide semiconductor film 4130 or diffuses into the oxide semiconductor film 4130 from the outside changes the region 4231 and the region 4232 to n-type regions with low resistance.

The conductive film 4170 includes two layers, a conductive film 4171 and a conductive film 4172, in the drawing, but also may be a single layer or a stack of three or more layers. The same applies to other transistors described in this embodiment.

Each of the conductive films 4140 and 4150 is a single layer in the drawing, but also may be a stack of two or more layers. The same applies to other transistors described in this embodiment.

Figure 30C:
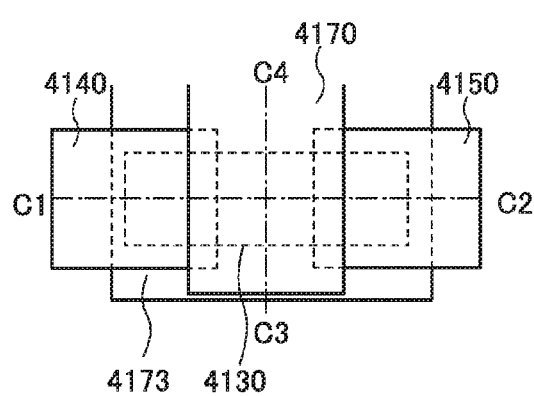
Figure 30D:
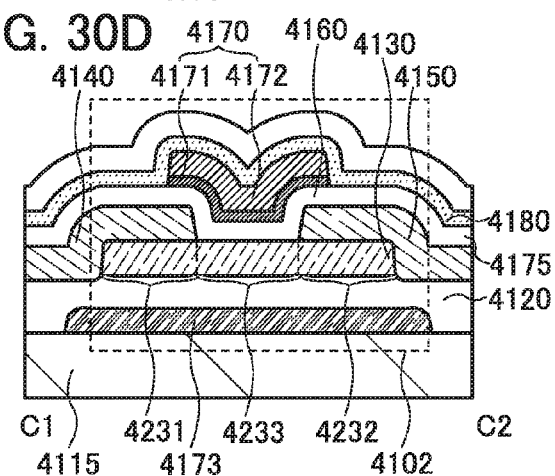
Figure 32B:
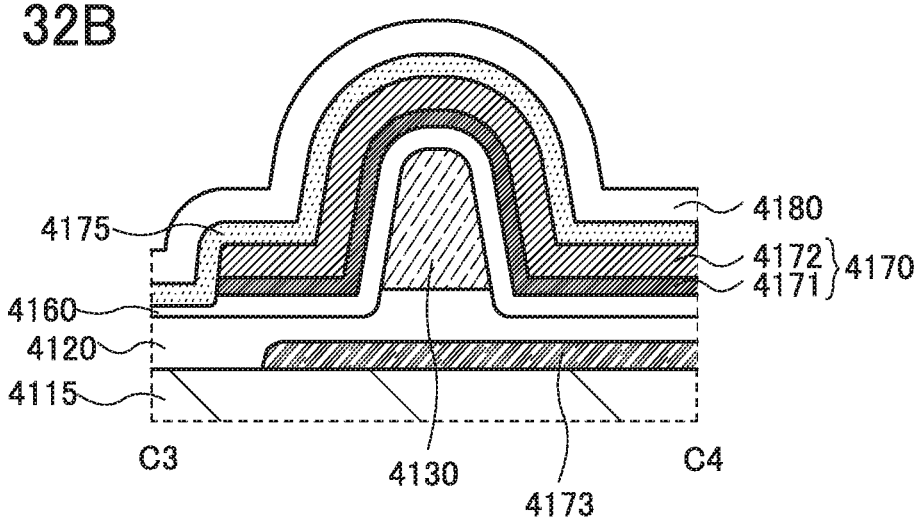

The transistor of one embodiment of the present invention may have a structure illustrated in FIGS. 30C and 30D. FIG. 30C is a top view of a transistor 4102. A cross section in the direction of a dashed-dotted line C1-C2 in FIG. 30C is illustrated in FIG. 30D. A cross section in the direction of a dashed-dotted line C3-C4 in FIG. 30C is illustrated in FIG. 32B. In some cases, the direction of the dashed-dotted line C1-C2 is referred to as a channel length direction, and the direction of the dashed-dotted line C3-C4 is referred to as a channel width direction.

The transistor 4102 has the same structure as the transistor 4101 except that an end portion of the insulating film 4160 functioning as a gate insulating film is not aligned with an end portion of the conductive film 4170 functioning as a gate electrode layer. In the transistor 4102, wide areas of the conductive film 4140 and the conductive film 4150 are covered with the insulating film 4160 and accordingly the resistance between the conductive film 4170 and the conductive films 4140 and 4150 is high; therefore, the transistor 4102 has a feature of low gate leakage current.

Figure 30E:
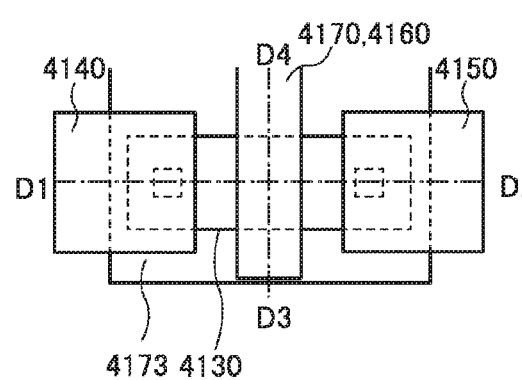
Figure 30F:
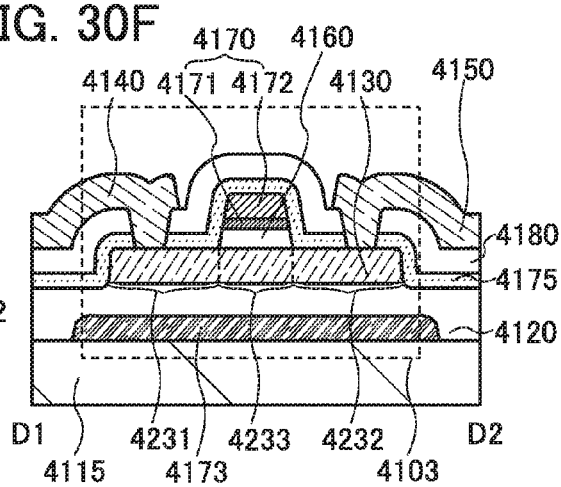

The transistor of one embodiment of the present invention may have a structure illustrated in FIGS. 30E and 30F. FIG. 30E is a top view of a transistor 4103. A cross section in the direction of a dashed-dotted line D1-D2 in FIG. 30E is illustrated in FIG. 30F. A cross section in the direction of a dashed-dotted line D3-D4 in FIG. 30E is illustrated in FIG. 32A. In some cases, the direction of the dashed-dotted line D1-D2 is referred to as a channel length direction, and the direction of the dashed-dotted line D3-D4 is referred to as a channel width direction.

The transistor 4103 includes the conductive film 4173 in contact with the substrate 4115; the insulating film 4120 in contact with the substrate 4115 and the conductive film 4173; the oxide semiconductor film 4130 in contact with the insulating film 4120; the insulating film 4160 in contact with the oxide semiconductor film 4130; the conductive film 4170 in contact with the insulating film 4160; the insulating film 4175 covering the oxide semiconductor film 4130, the insulating film 4160, and the conductive film 4170; the insulating film 4180 in contact with the insulating film 4175; and the conductive film 4140 and the conductive film 4150 electrically connected to the oxide semiconductor film 4130 through openings provided in the insulating film 4175 and the insulating film 4180. The transistor 4103 may also include, for example, the insulating film (planarization film) in contact with the insulating film 4180, the conductive film 4140, and the conductive film 4150 as necessary.

Here, the conductive film 4140, the conductive film 4150, the insulating film 4160, the conductive film 4170, and the conductive film 4173 can function as one of a source electrode and a drain electrode, the other of the source electrode and the drain electrode, a gate insulating film, a first gate electrode, and a second gate electrode, respectively.

The region 4231, the region 4232, and the region 4233 in FIG. 30F can function as a source region, a drain region, and a channel formation region, respectively. The region 4231 and the region 4232 are in contact with the insulating film 4175. When an insulating material containing hydrogen is used for the insulating film 4175, for example, the resistance of the region 4231 and the region 4232 can be reduced.

Specifically, interaction between an oxygen vacancy generated in the region 4231 and the region 4232 by the steps up to the formation of the insulating film 4175 and hydrogen that diffuses into the region 4231 and the region 4232 from the insulating film 4175 changes the region 4231 and the region 4232 to n-type regions with low resistance. As the insulating material containing hydrogen, for example, silicon nitride, aluminum nitride, or the like can be used.

Figure 31A:
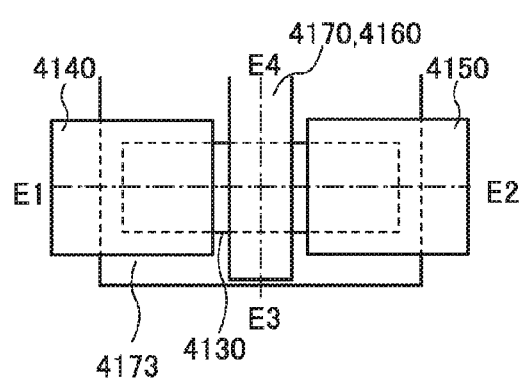
FIGS. 31A to 31F are top views and cross-sectional views of transistors.
Figure 31B:
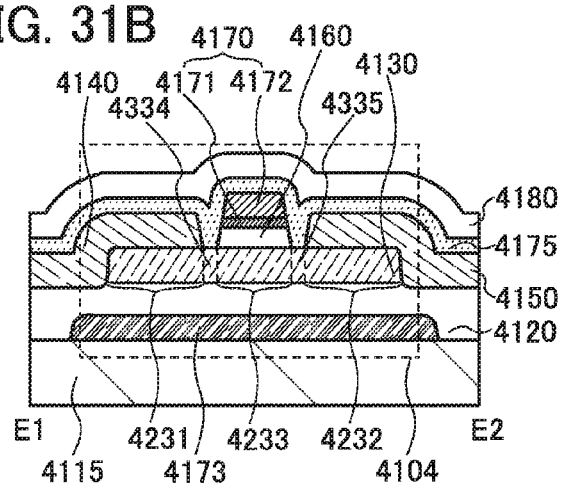

The transistor of one embodiment of the present invention may have a structure illustrated in FIGS. 31A and 31B. FIG. 31A is a top view of a transistor 104. A cross section in the direction of a dashed-dotted line E1-E2 in FIG. 31A is illustrated in FIG. 31B. A cross section in the direction of a dashed-dotted line E3-E4 in FIG. 31A is illustrated in FIG. 32A. In some cases, the direction of the dashed-dotted line E1-E2 is referred to as a channel length direction, and the direction of the dashed-dotted line E3-E4 is referred to as a channel width direction.

The transistor 4104 includes the conductive film 4173 in contact with the substrate 4115; the insulating film 4120 in contact with the substrate 4115 and the conductive film 4173; the oxide semiconductor film 4130 in contact with the insulating film 4120; the conductive film 4140 and the conductive film 4150 which are electrically connected to the oxide semiconductor film 4130; the insulating film 4160 in contact with the oxide semiconductor film 4130; the conductive film 4170 in contact with the insulating film 4160; the insulating film 4175 in contact with the oxide semiconductor film 4130, the conductive film 4140, the conductive film 4150, and the conductive film 4170; and an insulating film 4180 in contact with the insulating film 4175. The insulating film 4180 may function as a planarization film as necessary.

In FIG. 31B, a region 4331 and a region 4334 can function as a source region, a region 4332 and a region 4335 can function as a drain region, and a region 4333 can function as a channel formation region.

The resistance of the region 4331 and the region 4332 can be reduced in a manner similar to that of the region 4231 and the region 4232 in the transistor 4101.

The resistance of the region 4334 and the region 4335 can be reduced in a manner similar to that of the region 4231 and the region 4232 in the transistor 4103. In the case where the width of the region 4334 and the region 4335 in the channel length direction is less than or equal to 100 nm, preferably less than or equal to 50 nm, a gate electric field contributes to preventing a significant decrease in on-state current. Therefore, a reduction in resistance of the regions 4334 and 4335 is not performed in some cases.

The transistor 4103 and the transistor 4104 each have a self-aligned structure not including a region where the conductive film 4170 overlaps with each of the conductive films 4140 and 4150. A transistor with a self-aligned structure, which has extremely small parasitic capacitance between a gate electrode and source and drain electrodes, is suitable for applications that require high-speed operation.

Figure 31C:
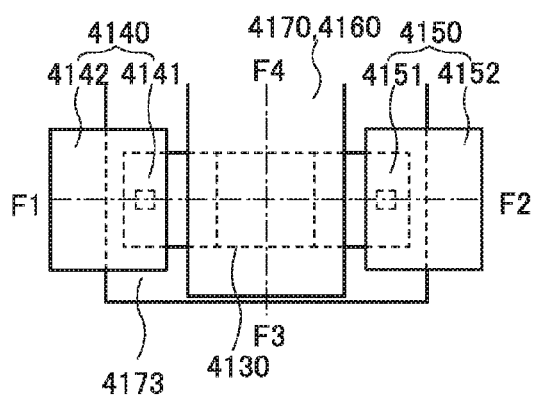
Figure 31D:
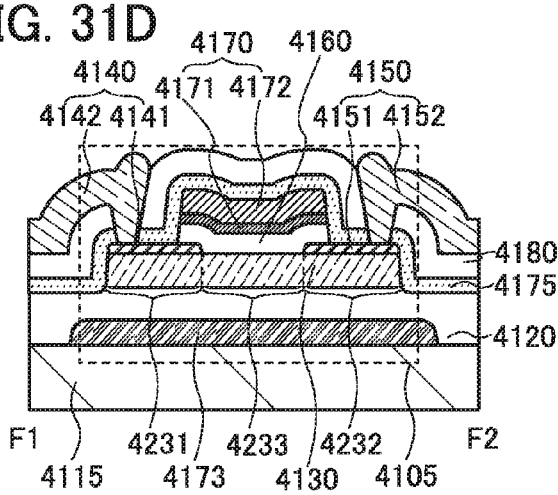

The transistor of one embodiment of the present invention may have a structure illustrated in FIGS. 31C and 31D. FIG. 31C is a top view of a transistor 4105. A cross section in the direction of a dashed-dotted line F1-F2 in FIG. 31C is illustrated in FIG. 31D. A cross section in the direction of a dashed-dotted line F3-F4 in FIG. 31C is illustrated in FIG. 32A. In some cases, the direction of the dashed-dotted line F1-F2 is referred to as a channel length direction, and the direction of the dashed-dotted line F3-F4 is referred to as a channel width direction.

The transistor 4105 includes the conductive film 4173 in contact with the substrate 4115; the insulating film 4120 in contact with the substrate 4115 and the conductive film 4173; the oxide semiconductor film 4130 in contact with the insulating film 4120; a conductive film 4141 and a conductive film 4151 which are electrically connected to the oxide semiconductor film 4130; the insulating film 4160 in contact with the oxide semiconductor film 4130, the conductive film 4141, and the conductive film 4151; the conductive film 4170 in contact with the insulating film 4160; the insulating film 4175 in contact with the oxide semiconductor film 4130, the conductive film 4141, the conductive film 4151, and the conductive film 4170; the insulating film 4180 in contact with the insulating film 4175; a conductive film 4142 electrically connected to the conductive film 4141 through an opening provided in the insulating films 4175 and 4180; and a conductive film 4152 electrically connected to the conductive film 4151 through an opening provided in the insulating films 4175 and 4180. The transistor 4105 may also include, for example, an insulating film in contact with the insulating film 4180, the conductive film 4142, and the conductive film 4152 as necessary.

Here, the conductive film 4141 and the conductive film 4151 are in contact with the top surface of the oxide semiconductor film 4130 and are not in contact with side surfaces of the oxide semiconductor film 4130.

The transistor 4105 has the same structure as the transistor 4101 except that the conductive film 4141 and the conductive film 4151 are provided, and that the conductive film 4142 and the conductive film 4152 electrically connected to the conductive film 4141 and the conductive film 4151, respectively, through the openings provided in the insulating film 4175 and the insulating film 4180, are provided. The conductive film 4140 (the conductive film 4141 and the conductive film 4142) can function as one of a source electrode and a drain electrode, and the conductive film 4150 (the conductive film 4151 and the conductive film 4152) can function as the other of the source electrode and the drain electrode.

Figure 31E:
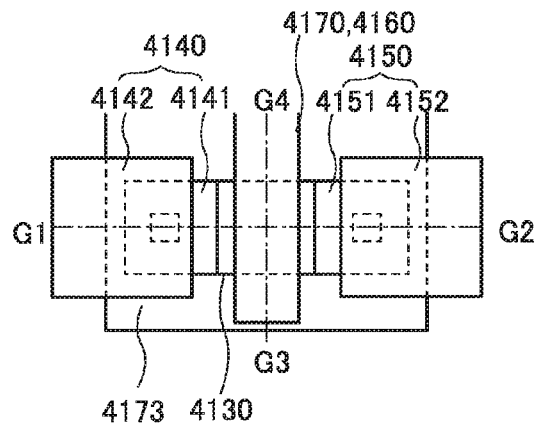
Figure 31F:
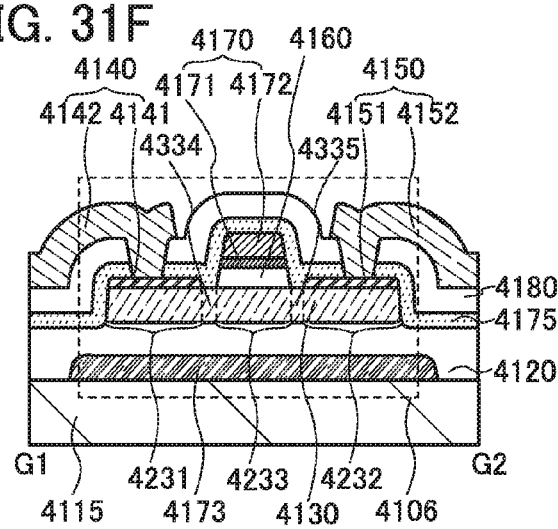

The transistor of one embodiment of the present invention may have a structure illustrated in FIGS. 31E and 31F. FIG. 31E is a top view of a transistor 4106. A cross section in the direction of a dashed-dotted line G1-G2 in FIG. 31E is illustrated in FIG. 31F. A cross section in the direction of a dashed-dotted line G3-G4 in FIG. 31E is illustrated in FIG. 32A. In some cases, the direction of the dashed-dotted line G1-G2 is referred to as a channel length direction, and the direction of the dashed-dotted line G3-G4 is referred to as a channel width direction.

The transistor 4106 includes the insulating film 4120 in contact with the substrate 4115; the oxide semiconductor film 4130 in contact with the insulating film 4120; the conductive film 4141 and the conductive film 4151 which are electrically connected to the oxide semiconductor film 4130; the insulating film 4160 in contact with the oxide semiconductor film 4130; the conductive film 4170 in contact with the insulating film 4160; the insulating film 4175 in contact with the insulating film 4120, the oxide semiconductor film 4130, the conductive film 4141, the conductive film 4151, and the conductive film 4170; the insulating film 4180 in contact with the insulating film 4175; the conductive film 4142 electrically connected to the conductive film 4141 through the opening provided in the insulating films 4175 and 4180; and the conductive film 4152 electrically connected to the conductive film 4151 through the opening provided in the insulating films 4175 and 4180. The transistor 4106 may also include, for example, an insulating film (planarization film) in contact with the insulating film 4180, the conductive film 4142, and the conductive film 4152 as necessary.

Here, the conductive film 4141 and the conductive film 4151 are in contact with the top surface of the oxide semiconductor film 4130 and are not in contact with the side surfaces of the oxide semiconductor film 4130.

The transistor 4106 has the same structure as the transistor 4103 except that the conductive films 4141 and 4151 are provided. The conductive film 4140 (the conductive film 4141 and the conductive film 4142) can function as one of a source electrode and a drain electrode, and the conductive film 4150 (the conductive film 4151 and the conductive film 4152) can function as the other of the source electrode and the drain electrode.

In the structures of the transistor 4105 and the transistor 4106, the conductive film 4140 and the conductive film 4150 are not in contact with the insulating film 4120. These structures make the insulating film 4120 less likely to be deprived of oxygen by the conductive film 4140 and the conductive film 4150 and facilitate oxygen supply from the insulating film 4120 to the oxide semiconductor film 4130.

Note that an impurity for forming an oxygen vacancy to increase conductivity may be added to the region 4231 and the region 4232 in the transistor 4103 and the region 4334 and the region 4335 in the transistor 4104 and the transistor 4106. As an impurity for forming an oxygen vacancy in an oxide semiconductor film, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, an ion implantation method, an ion doping method, a plasma immersion ion implantation method, or the like can be used.

When the above element is added as an impurity element to the oxide semiconductor film, a bond between a metal element and oxygen in the oxide semiconductor film is cut, whereby an oxygen vacancy is formed. Interaction between an oxygen vacancy in the oxide semiconductor film and hydrogen that remains in the oxide semiconductor film or is added to the oxide semiconductor film later can increase the conductivity of the oxide semiconductor film.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor having become a conductor. Note that the oxide conductor has a light-transmitting property in a manner similar to the oxide semiconductor.

The oxide conductor is a degenerate semiconductor and it is suggested that the conduction band edge equals to or substantially equals to the Fermi level. For that reason, an ohmic contact is made between an oxide conductor layer and conductive films functioning as a source electrode and a drain electrode; thus, contact resistance between the oxide conductor layer and the conductive films functioning as a source electrode and a drain electrode can be reduced.

Although the transistors 4101 to 4106 in FIGS. 30A to 30F and FIGS. 31A to 31F are examples in which the oxide semiconductor film 4130 is a single layer, the oxide semiconductor film 4130 may be a stacked layer.

Figure 33A:
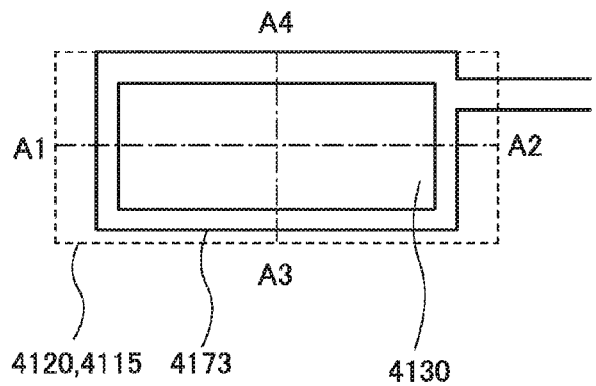
FIGS. 33A to 33E are a top view and cross-sectional views which illustrate a transistor.
Figure 33B:
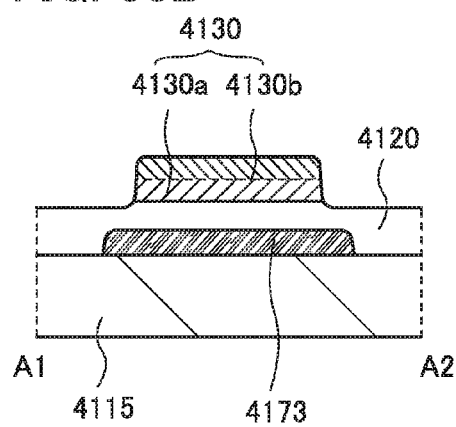
Figure 33D:
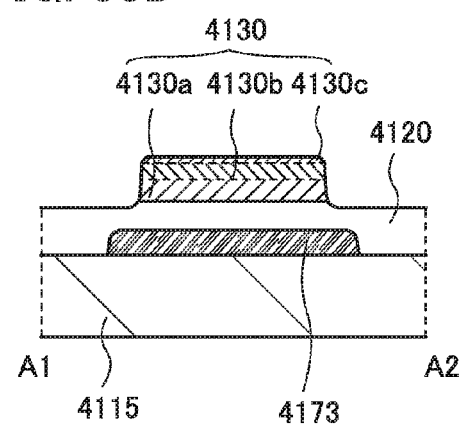
Figure 33C:
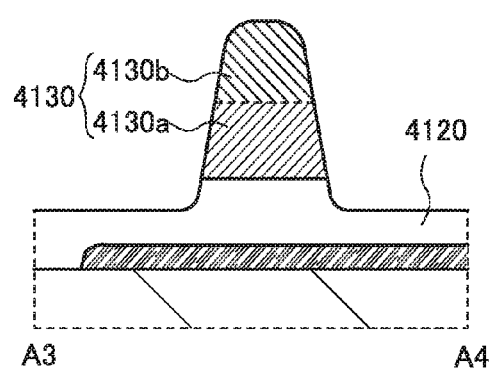
Figure 33E:
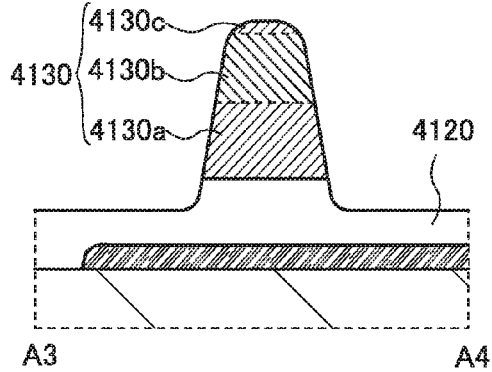

FIG. 33A is a top view illustrating the oxide semiconductor film 4130. FIG. 33B is a cross-sectional view illustrating the oxide semiconductor film 4130 having a two-layer structure, which is taken along a dashed dotted line A1-A2 in FIG. 33A. FIG. 33C is a cross-sectional view illustrating the oxide semiconductor film 4130 having a two-layer structure, which is taken along a dashed dotted line A3-A4 in FIG. 33A. FIG. 33D is a cross-sectional view illustrating the oxide semiconductor film 4130 having a three-layer structure, which is taken along a dashed dotted line A1-A2 in FIG. 33A. FIG. 33E is a cross-sectional view illustrating the oxide semiconductor film 4130 having a three-layer structure, which is taken along a dashed dotted line A3-A4 in FIG. 33A.

The oxide semiconductor film 4130 in the transistors 4101 to 4106 can be replaced with the oxide semiconductor film 4130 in FIGS. 33B and 33C or FIGS. 33D and 33E.

In this specification, when an oxide semiconductor film includes two or more layers, a layer where a channel region is formed is referred to as an oxide semiconductor film, and a layer where a channel region is not formed is referred to as an insulating film. In the case where an oxide semiconductor film has a three-layer structure, for example, a channel region is formed in a second layer (a layer between a first layer and a third layer).

As an insulating film 4130a, an oxide semiconductor film 4130b, and an insulating film 4130c, which are illustrated in FIGS. 33A to 33E, for example, oxide semiconductor films having different compositions can be used.

Figure 36A:
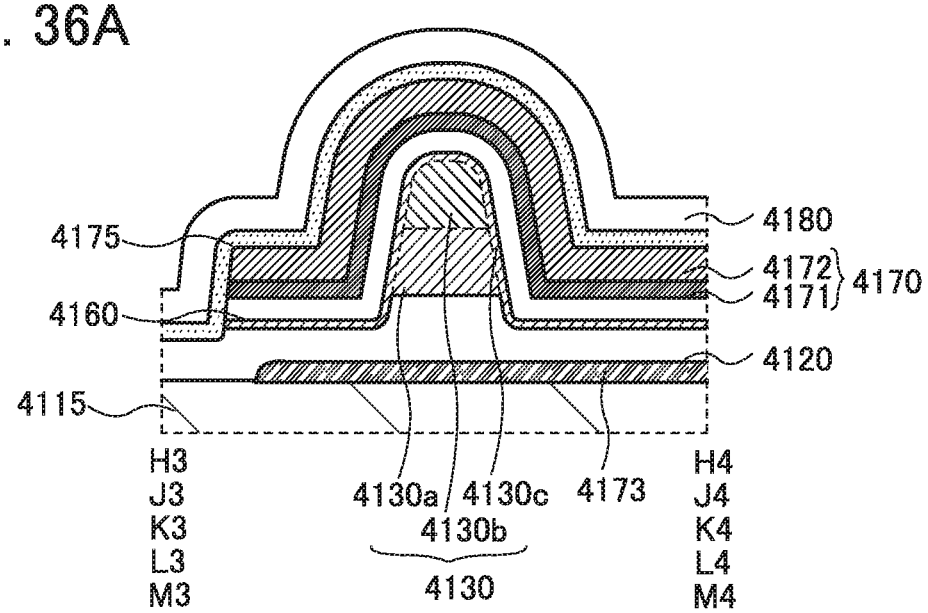
FIGS. 36A and 36B are cross-sectional views each illustrating a transistor.
Figure 36B:
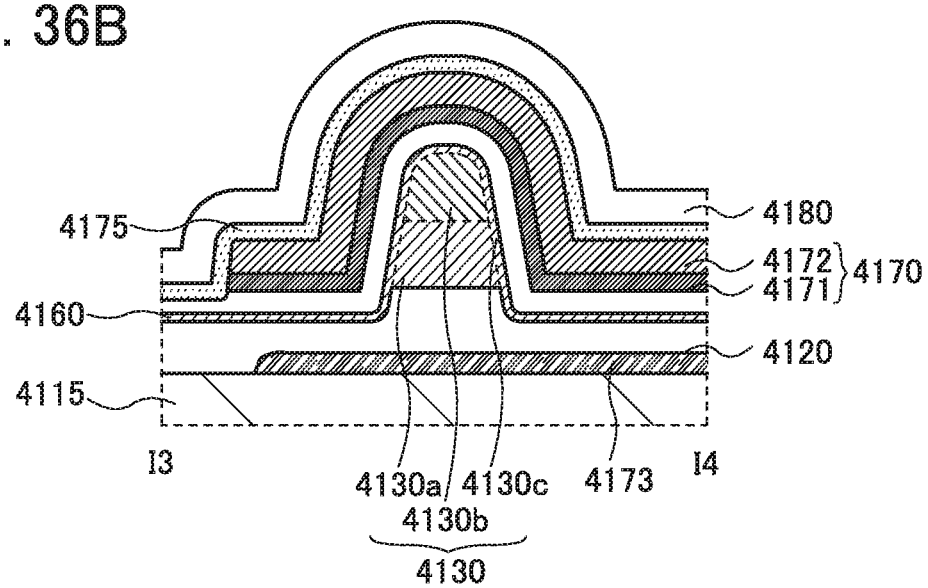

Furthermore, the transistor of one embodiment of the present invention may have any of structures illustrated in FIGS. 34A to 34F, FIGS. 35A to 35F, and FIGS. 36A and 36B. The transistors in FIGS. 34A to 34F, the transistors in FIGS. 35A to 35F, and the transistors in FIGS. 36A and 36B are modification examples of those in FIGS. 30A to 30F, those in FIGS. 31A to 31F, and those in FIGS. 32A and 32B. In each of the transistors in FIGS. 34A to 34F, FIGS. 35A to 35F, and FIGS. 36A and 36B, the oxide semiconductor film 4130 in the regions 4231, 4232, 4334, and 4335 includes two layers (the insulating film 4130a and the oxide semiconductor film 4130b) and the oxide semiconductor film 4130 in the region 4233 includes three layers (the insulating film 4130a and the oxide semiconductor film 4130b, and the insulating film 4130c).

Figure 34A:
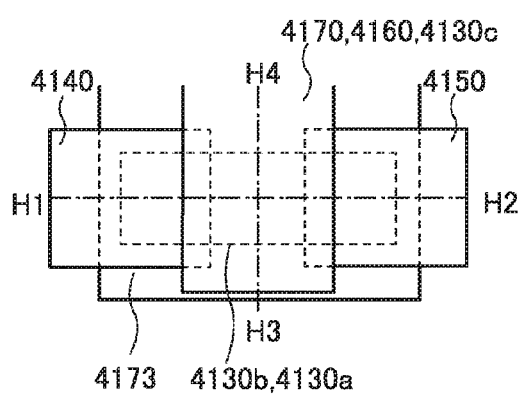
FIGS. 34A and 34F are top views and cross sectional views illustrating transistors.
Figure 34B:
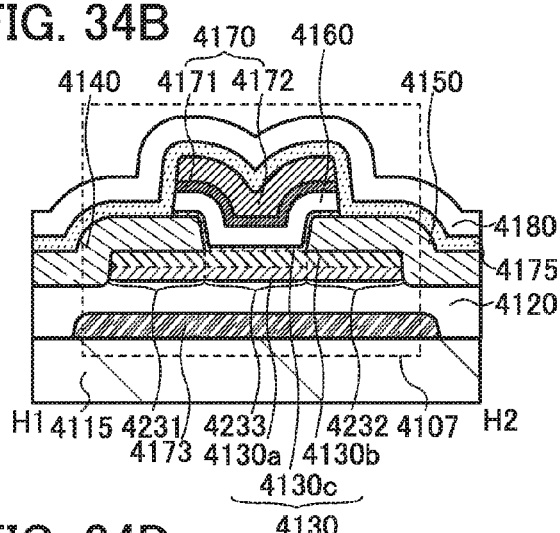
Figure 34C:
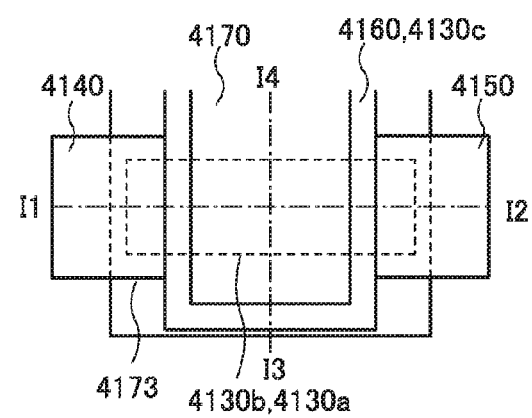
Figure 34D:
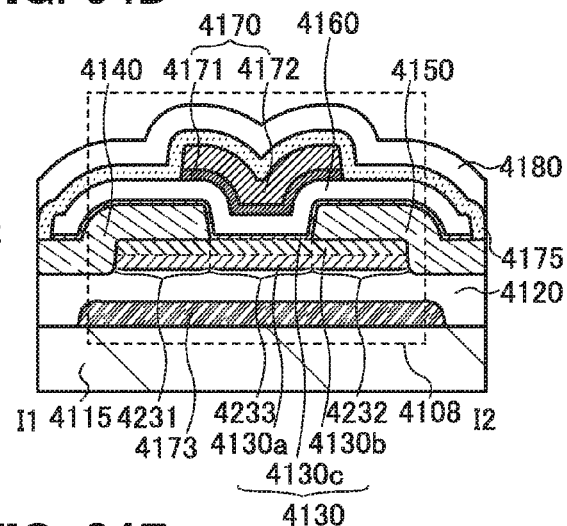
Figure 34E:
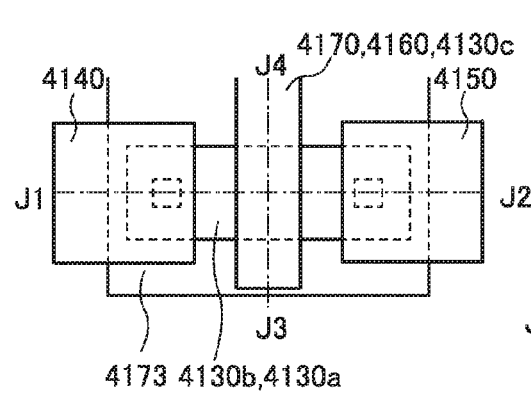
Figure 34F:
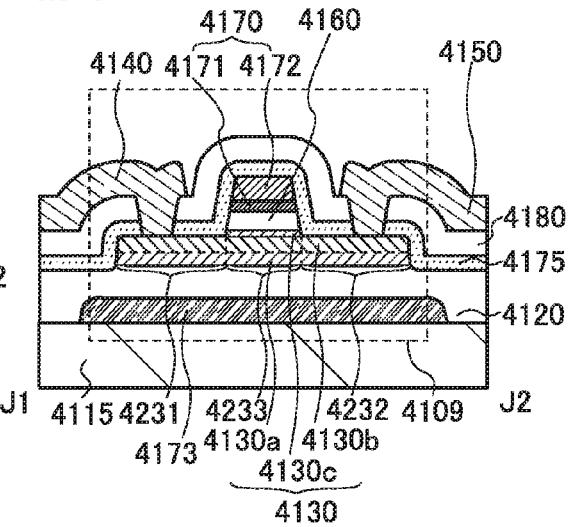
Figure 35A:
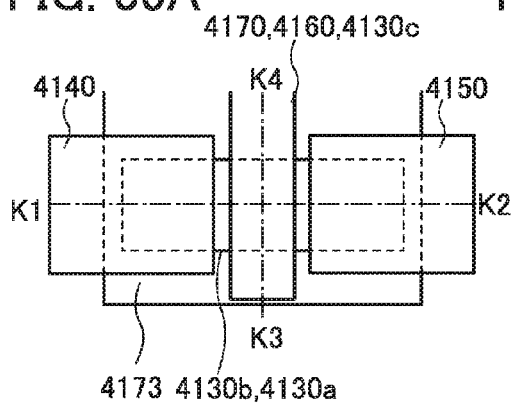
FIGS. 35A to 35F are top views and cross-sectional views illustrating transistors.
Figure 35B:
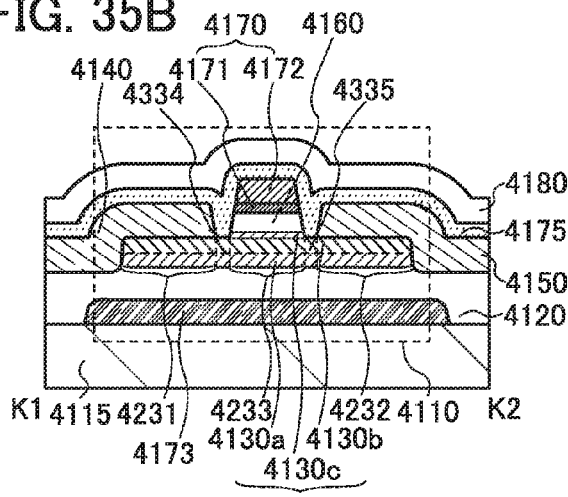
Figure 35C:
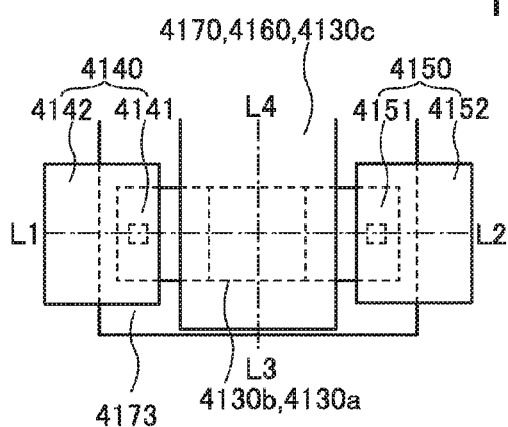
Figure 35D:
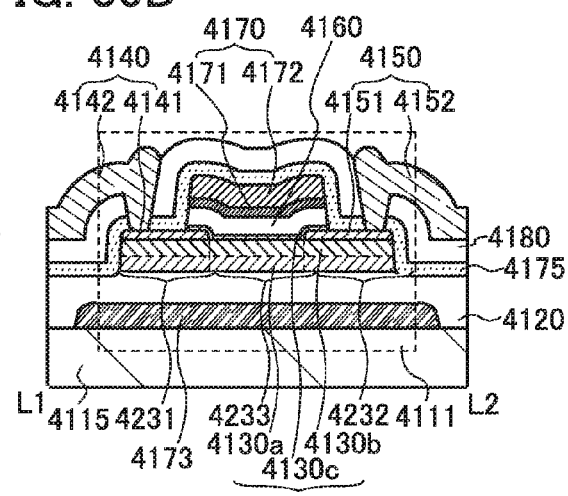
Figure 35E:
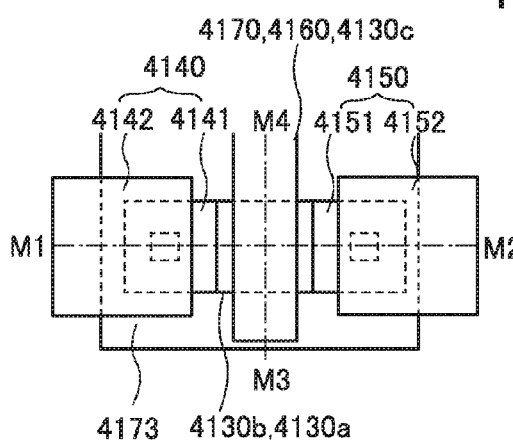
Figure 35F:
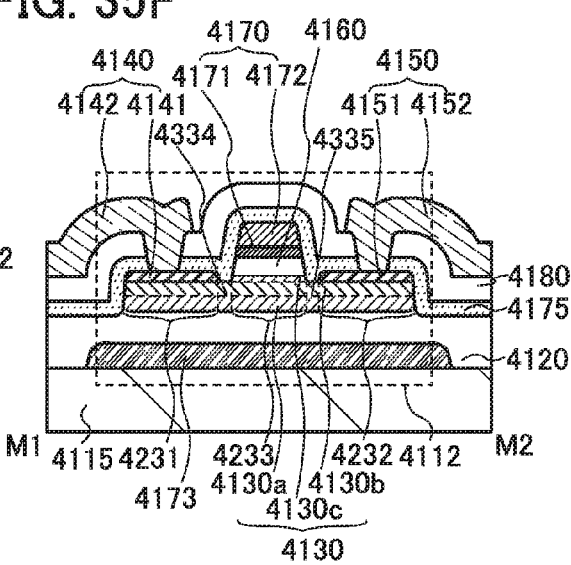

In each of a transistor 4107 illustrated in FIGS. 34A and 34B and FIG. 36A and a transistor 4108 illustrated in FIGS. 34C and 34D and FIG. 36B, the insulating film 4130c is interposed between the insulating film 4160 and the conductive films 4140 and 4150. In a transistor 4111 illustrated in FIGS. 35C and 35D and FIG. 36A, the insulating film 4130c is interposed between the insulating film 4160 and the conductive films 4141 and 4151.

Figure 37A:
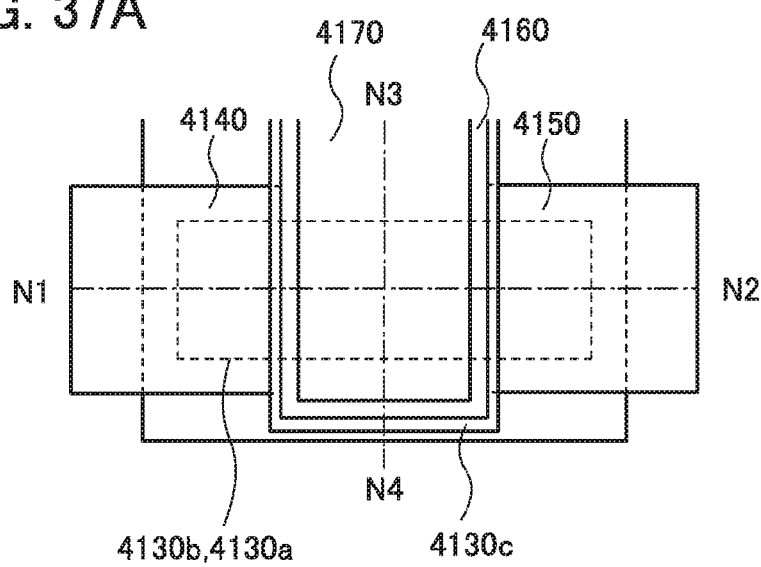
FIGS. 37A and 37B are a top view and a cross-sectional view illustrating a transistor.
Figure 37B:
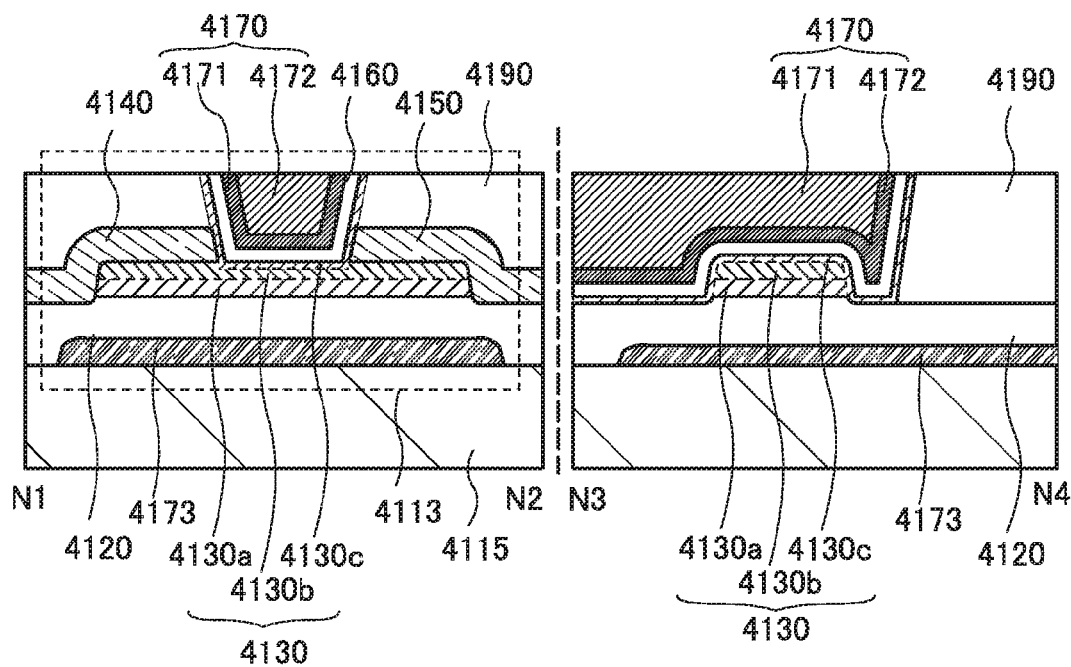

The transistor of one embodiment of the present invention can have a structure illustrated in FIGS. 37A and 37B. FIG. 37A is a top view and FIG. 37B is a cross-sectional view taken along dashed-dotted line N1-N2 and dashed-dotted line N3-N4 in FIG. 37A. Note that for simplification of the drawing, some components are not illustrated in the top view in FIG. 37A.

A transistor 4113 illustrated in FIGS. 37A and 37B includes the substrate 4115; the conductive film 4173 over the substrate 4115; the insulating film 4120 over the substrate 4115 and the conductive film 4173; the oxide semiconductor film 4130 (the insulating film 4130a, the oxide semiconductor film 4130b, and the insulating film 4130c) over the insulating film 4120; the conductive films 4140 and 4150 which are provided in contact with the oxide semiconductor film 4130 and provided with a distance therebetween; the insulating film 4160 in contact with the insulating film 4130c; and the conductive film 4170 in contact with the insulating film 4160. Note that the insulating film 4130c, the insulating film 4160, and the conductive film 4170 are provided in an opening which is provided in the insulating film 4190 over the transistor 4113 and reaches the oxide semiconductor film 4130b, the insulating film 4130a, and the insulating film 4120.

A region where the conductive film serving as a source electrode or a drain electrode overlaps with the conductive film serving as a gate electrode is smaller in the structure of the transistor 4113 than in the structures of the transistors described above, and thus the parasitic capacitance in the structure of the transistor 4113 can be reduced. Accordingly, the transistor 4113 is suitable as an element in a circuit which needs to operate at a high speed. Note that a top surface of the transistor 4113 is preferably planarized by a chemical mechanical polishing (CMP) method or the like as illustrated in FIG. 37B, but is not necessarily planarized.

Figure 38A:
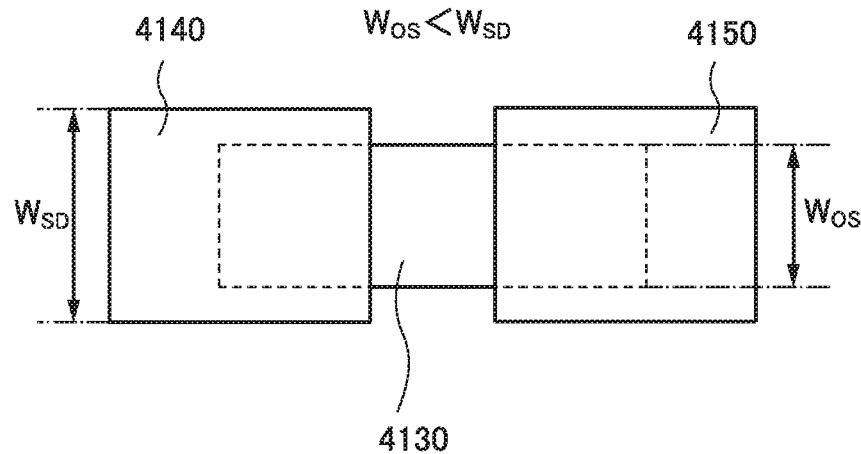
FIGS. 38A to 38C are top views illustrating a transistor.
Figure 38B:
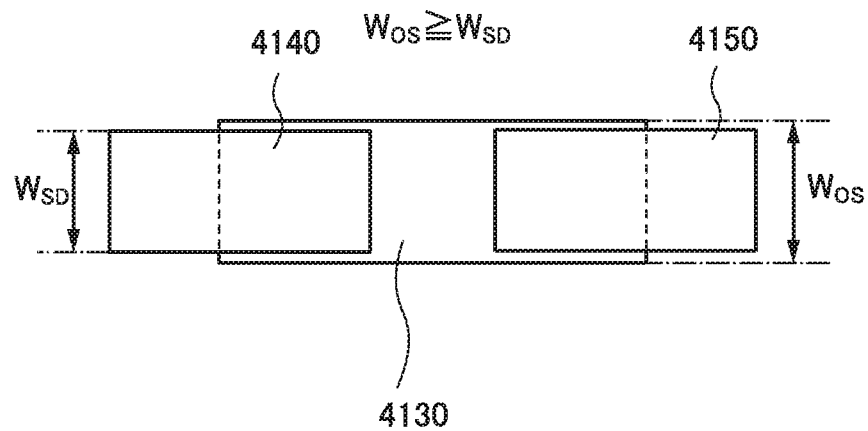
Figure 38C:
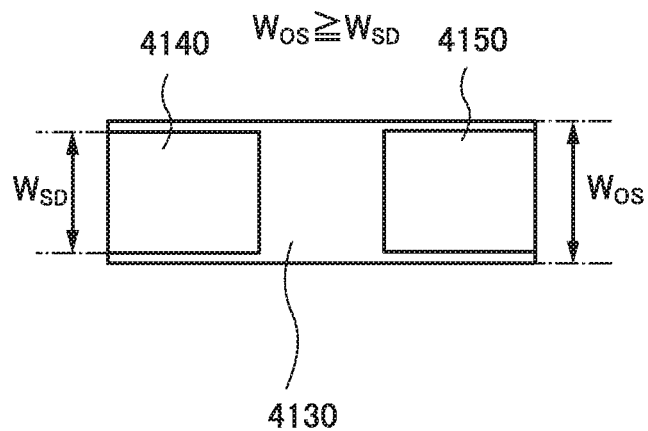

Furthermore, as shown in the top view in FIG. 38A (showing only the oxide semiconductor film 4130, the conductive film 4140, and the conductive film 4150), the width ($W_{SD}$) of the conductive film 4140 and the conductive film 4150 in the transistor of one embodiment of the present invention may be longer than the width ($W_{OS}$) of the oxide semiconductor film 4130 or shorter than the width ($W_{OS}$) of the oxide semiconductor film 4130 as shown in FIG. 38B. When $W_{OS} \geq W_{SD}$ ($W_{SD}$ is less than or equal to $W_{OS}$) is satisfied, a gate electric field is easily applied to the entire oxide semiconductor film 4130, so that electrical characteristics of the transistor can be improved. As illustrated in FIG. 38C, the conductive films 4140 and 4150 may be formed only in a region that overlaps with the oxide semiconductor film 4130.

In the transistor in one embodiment of the present invention (any of the transistors 4101 to 4112), the conductive film 4170 functioning as a gate electrode electrically surrounds the oxide semiconductor film 4130 in the channel width direction with the insulating film 4160 functioning as a gate insulating film positioned therebetween. This structure increases the on-state current. Such a transistor structure is referred to as a surrounded channel (s-channel) structure.

Note that each of the transistors described in this embodiment has a top-gate structure in which the conductive film 4173 serving as a second gate electrode is provided below the conductive film 4170 serving as a first gate electrode but may have a bottom-gate structure in which the second gate electrode is provided over the first gate electrode.

A semiconductor device using a transistor with any of the above structures can have favorable electrical characteristics.

The structure described in this embodiment can be used in appropriate combination with the structure described in any of the other embodiments.

Embodiment 5

In this embodiment, components of the transistors described in Embodiment 4 are described in detail.

As the substrate 4115, a glass substrate, a quartz substrate, a semiconductor substrate, a ceramic substrate, a metal substrate having a surface subjected to insulation treatment, or the like can be used. The substrate 4115 can be a silicon substrate provided with a transistor; and an insulating film, a wiring, a conductor functioning as a contact plug, and the like that are provided over the silicon substrate. Note that when p-channel transistors are formed using the silicon substrate, a silicon substrate with n⁻-type conductivity is preferably used. Alternatively, an SOI substrate including an n⁻-type or i-type silicon layer may be used. In the case where a p-channel transistor is formed using the silicon substrate, a surface of the silicon substrate where the transistor is formed preferably has a (110) plane orientation. Forming a p-channel transistor with the (110) plane can increase mobility.

The insulating film 4120 can have a function of supplying oxygen to the oxide semiconductor film 4130 as well as a function of preventing diffusion of impurities from a component included in the substrate 4115. For this reason, the insulating film 4120 is preferably an insulating film containing oxygen and further preferably, the insulating is an insulating film containing oxygen in which the oxygen content is higher than that in the stoichiometric composition. The insulating film 4120 is a film in which the amount of released oxygen when converted into oxygen atoms is greater than or equal to $1.0 \times 10^{19}$ atoms/cm³ in thermal desorption spectroscopy (TDS) analysis. In the TDS analysis, the film surface temperature is preferably higher than or equal to 100° C. and lower than or equal to 700° C., or higher than or equal to 100° C. and lower than or equal to 500° C. In the case where the substrate 4115 is provided with another device, the insulating film 4120 also functions as an interlayer insulating film. In that case, the insulating film 4120 is preferably subjected to planarization treatment such as CMP so as to have a flat surface.

For example, the insulating film 4120 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film including silicon nitride, silicon nitride oxide, aluminum nitride, aluminum nitride oxide, or the like; or a mixed material of any of these. The insulating film 4120 may be a stack of any of the above materials.

In this embodiment, detailed description is given mainly on the case where the oxide semiconductor film 4130 of the transistor has a three-layer structure in which the insulating film 4130a, the oxide semiconductor film 4130b, the insulating film 4130c are sequentially stacked from the insulating film 4120 side.

Note that in the case where the oxide semiconductor film 4130 is a single layer, a layer corresponding to the oxide semiconductor film 4130b described in this embodiment is used.

In the case where the oxide semiconductor film 4130 has a two-layer structure, a stack in which a layer corresponding to the insulating film 4130a and a layer corresponding to the oxide semiconductor film 4130b are sequentially stacked from the insulating film 4120 side described in this embodiment is used. In such a case, the insulating film 4130a and the oxide semiconductor film 4130b can be replaced with each other.

In the case where the oxide semiconductor film 4130 has a layered structure of four or more layers, for example, a structure in which another oxide semiconductor film is added to the three-layer stack of the oxide semiconductor film 4130 described in this embodiment can be employed.

For the oxide semiconductor film 4130b, for example, an oxide semiconductor film whose electron affinity (an energy difference between a vacuum level and the conduction band minimum) is higher than those of the insulating film 4130a and 4130c is used. The electron affinity can be obtained by subtracting an energy difference between the conduction band minimum and the valence band maximum (what is called an energy gap) from an energy difference between the vacuum level and the valence band maximum (what is called an ionization potential).

The insulating films 4130a and 4130c each contain one or more kinds of metal elements contained in the oxide semiconductor film 4130b. For example, the insulating films 4130a and 4130c are preferably formed using an oxide semiconductor whose conduction band minimum is closer to a vacuum level than that of the oxide semiconductor film 4130b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the conductive film 4170, a channel is formed in the oxide semiconductor film 4130b whose conduction band minimum is the lowest in the oxide semiconductor film 4130.

Furthermore, since the insulating film 4130a contains one or more kinds of metal elements contained in the oxide semiconductor film 4130b, an interface state is unlikely to be formed at the interface between the oxide semiconductor film 4130b and the insulating film 4130a, compared with the interface between the oxide semiconductor film 4130b and the insulating film 4120 on the assumption that the oxide semiconductor film 4130b is in contact with the insulating film 4120. The interface state sometimes forms a channel; therefore, the threshold voltage of the transistor is changed in some cases. Thus, with the insulating film 4130a, variations in electrical characteristics of the transistor, such as a threshold voltage, can be reduced. Moreover, the reliability of the transistor can be improved.

Furthermore, since the insulating film 4130c contains one or more kinds of metal elements contained in the oxide semiconductor film 4130b, scattering of carriers is unlikely to occur at the interface between the oxide semiconductor film 4130b and the insulating film 4130c, compared with the interface between the oxide semiconductor film 4130b and the insulating film 4160 on the assumption that the oxide semiconductor film 4130b is in contact with the insulating film 4160. Thus, with the insulating film 4130c, the field-effect mobility of the transistor can be increased.

For the insulating films 4130a and 4130c, for example, a material containing Al, Ti, Ga, Ge, Y, Zr, Sn, La, Ce, or Hf with a higher atomic ratio than that used for the oxide semiconductor film 4130b can be used. Specifically, the atomic ratio of any of the above metal elements in the insulating films 4130a and 4130c is 1.5 times or more, preferably 2 times or more, more preferably 3 times or more as large as that in the oxide semiconductor film 4130b. Any of the above metal elements is strongly bonded to oxygen and thus has a function of suppressing generation of an oxygen vacancy in the oxide semiconductor film. That is, an oxygen vacancy is less likely to be generated in the insulating films 4130a and 4130c than in the oxide semiconductor film 4130b.

An oxide semiconductor that can be used for each of the insulating film 4130a, the oxide semiconductor film 4130b, and the insulating film 4130c preferably contains at least indium (In) or zinc (Zn). Both In and Zn are preferably contained. In order to reduce variations in electrical characteristics of the transistor including the oxide semiconductor, the oxide semiconductor preferably contains a stabilizer in addition to In and Zn.

Examples of a stabilizer include gallium (Ga), tin (Sn), hafnium (Hf), aluminum (Al), and zirconium (Zr). Other examples of the stabilizer include lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor, for example, any of the following can be used: indium oxide, tin oxide, gallium oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide means an oxide containing In, Ga, and Zn as its main components. The In—Ga—Zn oxide may contain another metal element in addition to In, Ga, and Zn. In this specification, a film containing the In—Ga—Zn oxide is also referred to as an IGZO film.

A material represented by $InMO_3(ZnO)_m$ (m>0, where m is not an integer) may be used. Note that M represents one or more metal elements selected from Ga, Y, Zr, La, Ce, and Nd. Alternatively, a material represented by $In_2SnO_5(ZnO)_n$ (n>0, where n is an integer) may be used.

Note that when each of the insulating film 4130a, the oxide semiconductor film 4130b, and the insulating film 4130c is an In-M-Zn oxide containing at least indium, zinc, and M (M is a metal such as Al, Ti, Ga, Ge, Y, Zr, Sn, La, Ce, or Hf), in the case where the insulating film 4130a has an atomic ratio of In to M and Zn which is $x_1:y_1:z_1$, the oxide semiconductor film 4130b has an atomic ratio of In to M and Zn which is $x_2:y_2:z_2$, and the insulating film 4130c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, more preferably 3 times or more as large as $y_2/x_2$. At this time, when $y_2$ is greater than or equal to $x_2$ in the oxide semiconductor film 4130b, the transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in the insulating film 4130a and the insulating film 4130c are preferably less than 50 atomic % and greater than 50 atomic %, respectively, further preferably less than 25 atomic % and greater than 75 atomic %, respectively. Furthermore, in the case where Zn and O are not taken into consideration, the proportion of In and the proportion of M in the oxide semiconductor film 4130b are preferably greater than 25 atomic % and less than 75 atomic %, respectively, further preferably greater than 34 atomic % and less than 66 atomic %, respectively.

The indium content in the oxide semiconductor film 4130b is preferably higher than those in the insulating films 4130a and 4130c. In an oxide semiconductor, the s orbital of heavy metal mainly contributes to carrier transfer, and when the proportion of In the oxide semiconductor is increased, overlap of the s orbitals is likely to be increased. Therefore, an oxide in which the proportion of In is higher than that of M has higher mobility than an oxide in which the proportion of In is equal to or lower than that of M. Thus, with the use of an oxide having a high content of indium for the oxide semiconductor film 4130b, a transistor having high field-effect mobility can be obtained.

The thickness of the insulating film 4130a is greater than or equal to 3 nm and less than or equal to 100 nm, preferably greater than or equal to 5 nm and less than or equal to 50 nm, further preferably greater than or equal to 5 nm and less than or equal to 25 nm. The thickness of the oxide semiconductor film 4130b is greater than or equal to 3 nm and less than or equal to 200 nm, preferably greater than or equal to 5 nm and less than or equal to 150 nm, further preferably greater than or equal to 10 nm and less than or equal to 100 nm. The thickness of the insulating film 4130c is greater than or equal to 1 nm and less than or equal to 50 nm, preferably greater than or equal to 2 nm and less than or equal to 30 nm, further preferably greater than or equal to 3 nm and less than or equal to 15 nm. In addition, the oxide semiconductor film 4130b is preferably thicker than the insulating film 4130c.

Note that in order that a transistor in which a channel is formed in an oxide semiconductor film have stable electrical characteristics, it is effective to make the oxide semiconductor film intrinsic or substantially intrinsic by reducing the concentration of impurities in the oxide semiconductor film. The term "substantially intrinsic" refers to a state where an oxide semiconductor film has a carrier density lower than $1 \times 10^{15}/cm^3$, preferably lower than $1 \times 10^{13}/cm^3$, further preferably lower than $8 \times 10^{11}/cm^3$, still further preferably higher than or equal to $1 \times 10^{-9}/cm^3$ and lower than $1 \times 10^{8}/cm^3$.

In the oxide semiconductor film, hydrogen, nitrogen, carbon, silicon, and a metal element other than main components of the oxide semiconductor film are impurities. For example, hydrogen and nitrogen form donor levels to increase the carrier density, and silicon forms impurity levels in the oxide semiconductor film. The impurity levels serve as traps and might cause deterioration of electrical characteristics of the transistor. Therefore, it is preferable to reduce the concentration of the impurities in the insulating film 4130a, the oxide semiconductor film 4130b, and the insulating film 4130c and at interfaces between these films.

In order to make the oxide semiconductor film intrinsic or substantially intrinsic, in SIMS (secondary ion mass spectrometry), for example, the concentration of silicon at a certain depth of the oxide semiconductor film or in a region of the oxide semiconductor film is lower than $1 \times 10^{19}$ atoms/$cm^3$, preferably lower than $5 \times 10^{18}$ atoms/$cm^3$ and higher than or equal to $1 \times 10^{18}$ atoms/$cm^3$. Furthermore, the concentration of hydrogen at a certain depth of the oxide semiconductor film or in a certain region of the oxide semiconductor film is lower than or equal to $2 \times 10^{20}$ atoms/$cm^3$, preferably lower than or equal to $5 \times 10^{19}$ atoms/$cm^3$, further preferably lower than or equal to $1 \times 10^{19}$ atoms/$cm^3$, still further preferably lower than or equal to $5 \times 10^{18}$ atoms/$cm^3$ and higher than or equal to $1 \times 10^{17}$ atoms/$cm^3$. Moreover, the concentration of nitrogen at a certain depth of the oxide semiconductor film or in a certain region of the oxide semiconductor film is lower than $5 \times 10^{19}$ atoms/$cm^3$, preferably lower than or equal to $5 \times 10^{18}$ atoms/$cm^3$, further preferably lower than or equal to $1 \times 10^{18}$ atoms/$cm^3$, still further preferably lower than or equal to $5 \times 10^{17}$ atoms/$cm^3$ and higher than or equal to $5 \times 10^{16}$ atoms/$cm^3$.

In addition, in the case where the oxide semiconductor film includes a crystal, high concentration of silicon or carbon might reduce the crystallinity of the oxide semiconductor film. In order not to reduce the crystallinity of the oxide semiconductor film, for example, the concentration of silicon at a certain depth of the oxide semiconductor film or in a region of the oxide semiconductor film is lower than $1\times10^{19}$ atoms/cm$^3$, preferably lower than $5\times10^{18}$ atoms/cm$^3$ and higher than or equal to $1\times10^{18}$ atoms/cm$^3$. Furthermore, the concentration of carbon at a certain depth of the oxide semiconductor film or in a certain region of the oxide semiconductor film is lower than $1\times10^{19}$ atoms/cm$^3$, preferably lower than $5\times10^{18}$ atoms/cm$^3$, further preferably lower than $1\times10^{18}$ atoms/cm$^3$ and higher than or equal to $6\times10^{17}$ atoms/cm$^3$ a for example.

A transistor in which a highly purified oxide semiconductor film is used for a channel formation region exhibits extremely low off-state current. For example, in the case where the voltage between the source and the drain is set to approximately 0.1 V, 5 V, or 10 V, the off-state current standardized on the channel width of the transistor can be as low as several yoctoamperes per micrometer to several zeptoamperes per micrometer.

As the gate insulating film of the transistor, an insulating film containing silicon is used in many cases; thus, it is preferable that, as in the transistor in one embodiment of the present invention, a region of the oxide semiconductor film that serves as a channel not be in contact with the gate insulating film for the above reason. In the case where a channel is formed at the interface between the gate insulating film and the oxide semiconductor film, scattering of carriers occurs at the interface, so that the field-effect mobility of the transistor is reduced in some cases. Also from the view of the above, it is preferable that the region of the oxide semiconductor film that serves as a channel be separated from the gate insulating film.

Accordingly, with the oxide semiconductor film 4130 having a layered structure including the insulating film 4130*a*, the oxide semiconductor film 4130*b*, and the insulating film 4130*c*, a channel can be formed in the oxide semiconductor film 4130*b*; thus, the transistor can have high field-effect mobility and stable electrical characteristics.

In a band structure, the conduction band minimums of the insulating film 4130*a*, the oxide semiconductor film 4130*b*, and the insulating film 4130*c* are continuous. This can be understood also from the fact that the compositions of the insulating film 4130*a*, the oxide semiconductor film 4130*b*, and the insulating film 4130*c* are close to one another and oxygen is easily diffused among the insulating film 4130*a*, the oxide semiconductor film 4130*b*, and the insulating film 4130*c*. Thus, the insulating film 4130*a*, the oxide semiconductor film 4130*b*, and the insulating film 4130*c* have a continuous physical property though they have different compositions and form a stack. In the drawings, interfaces between these films of the stack are indicated by dotted lines.

The oxide semiconductor film 4130 in which layers containing the same main components are stacked is formed to have not only a simple layered structure of the layers but also a continuous energy band (here, in particular, a well structure having a U shape in which the conduction band minimums are continuous (U-shape well)). In other words, the layered structure is formed such that there exists no impurity that forms a defect level such as a trap center or a recombination center at each interface. If impurities exist between the stacked oxide semiconductor films, the continuity of the energy band is lost and carriers disappear by a trap or recombination at the interface.

For each of the insulating films 4130*a* and 4130*c*, an In—Ga—Zn oxide whose atomic ratio of In to Ga and Zn is 1:3:2, 1:3:3, 1:3:4, 1:3:6, 1:4:5, 1:6:4, 1:9:6, or the like can be used, for example. For the oxide semiconductor film 4130*b*, for example, an In—Ga—Zn oxide whose atomic ratio of In to Ga and Zn is 1:1:1, 2:1:3, 5:5:6, 3:1:2, or the like can be used. Note that in each of the insulating film 4130*a*, the oxide semiconductor film 4130*b*, and the insulating film 4130*c*, the proportion of each atom in the above-described atomic ratio varies within a range of ±40% as an error.

The oxide semiconductor film 4130*b* of the oxide semiconductor film 4130 serves as a well, so that a channel is formed in the oxide semiconductor film 4130*b*. Since the conduction band minimums are continuous, the oxide semiconductor film 4130 can also be referred to as a U-shaped well. Furthermore, a channel formed to have such a structure can also be referred to as a buried channel.

Note that trap levels due to impurities or defects can be formed in the vicinity of the interface between the insulating films 4130*a* and 4130*c* and an insulating film such as a silicon oxide film. The oxide semiconductor film 4130*b* can be distanced away from the trap levels owing to existence of the insulating film 4130*a* and the insulating film 4130*c*.

However, when the energy differences between the conduction band minimum of the oxide semiconductor film 4130*b* and the conduction band minimum of each of the insulating films 4130*a* and 4130*c* are small, an electron in the oxide semiconductor film 4130*b* might reach the trap level by passing over the energy differences. When the electron is trapped in the trap level, negative charge is generated at the interface with the insulating film, so that the threshold voltage of the transistor is shifted in a positive direction.

The insulating film 4130*a*, the oxide semiconductor film 4130*b*, and the insulating film 4130*c* preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive film 4140 functioning as one of a source electrode and a drain electrode and the conductive film 4150 functioning as the other of the source electrode and the drain electrode, for example, a single layer or a stacked layer formed using a material selected from Al, Cr, Cu, Ta, Ti, Mo, W, Ni, Mn, Nd, and Sc and alloys of any of these metal materials can be used. Typically, it is preferable to use Ti, which is particularly easily bonded to oxygen, or W, which has a high melting point and thus makes subsequent process temperatures comparatively high. It is also possible to use a stack of any of the above materials and Cu or an alloy such as Cu—Mn, which has low resistance. In the transistors 4105, 4106, 4111, and 4112, for example, it is possible to use W for the conductive films 4141 and 4151 and use a stack of Ti and Al for the conductive films 4142 and 4152.

The above materials are capable of extracting oxygen from an oxide semiconductor film. Therefore, in a region of the oxide semiconductor film that is in contact with any of the above materials, oxygen is released from the oxide semiconductor film and an oxygen vacancy is formed. Hydrogen slightly contained in the film and the oxygen vacancy are bonded to each other, so that the region is markedly changed to an n-type region. Accordingly, the n-type region can serve as a source electrode or a drain electrode of the transistor.

In the case where W is used for the conductive films 4140 and 4150, the conductive films 4140 and 4150 may be doped with nitrogen. Doping with nitrogen can appropriately lower the capability of extracting oxygen and prevent the n-type region from spreading to a channel region. It is possible to prevent the n-type region from spreading to a channel region also by using a stack of W and an n-type semiconductor films as the conductive films 4140 and 4150 and putting the n-type semiconductor film in contact with the oxide semiconductor film. As the n-type semiconductor film, an In—Ga—Zn oxide, zinc oxide, indium oxide, tin oxide, indium tin oxide, or the like to which nitrogen is added can be used.

The insulating film 4160 functioning as a gate insulating film can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating film 4160 may be a stack including any of the above materials. The insulating film 4160 may contain lanthanum (La), nitrogen, zirconium (Zr), or the like as an impurity.

An example of a layered structure of the insulating film 4160 is described. The insulating film 4160 includes, for example, oxygen, nitrogen, silicon, or hafnium. Specifically, the insulating film 4160 preferably includes hafnium oxide and silicon oxide or silicon oxynitride.

Hafnium oxide and aluminum oxide have higher dielectric constants than silicon oxide and silicon oxynitride. Therefore, the insulating film 4160 using hafnium oxide or aluminum oxide can have larger thickness than the insulating film 4160 using silicon oxide, so that leakage current due to tunnel current can be reduced. That is, a transistor with low off-state current can be provided. Moreover, hafnium oxide with a crystalline structure has a higher dielectric constant than hafnium oxide with an amorphous structure. Therefore, it is preferable to use hafnium oxide with a crystalline structure in order to provide a transistor with low off-state current. Examples of the crystal structure include a monoclinic crystal structure and a cubic crystal structure. Note that one embodiment of the present invention is not limited to the above examples.

For the insulating films 4120 and 4160 in contact with the oxide semiconductor film 4130, a film that releases less nitrogen oxide is preferably used. In the case where the oxide semiconductor is in contact with an insulating film that releases a large amount of nitrogen oxide, the density of states caused by nitrogen oxide becomes high in some cases. The density of states caused by nitrogen oxide can be formed in the energy gap of the oxide semiconductor. For the insulating films 4120 and 4160, for example, an oxide insulating film such as a silicon oxynitride film or an aluminum oxynitride film that releases less nitrogen oxide can be used.

A silicon oxynitride film that releases less nitrogen oxide is a film of which the amount of released ammonia is larger than the amount of released nitrogen oxide in TDS; the amount of released ammonia is typically greater than or equal to $1\times10^{18}$ molecules/cm$^3$ and less than or equal to $5\times10^{19}$ molecules/cm$^3$. Note that the amount of released ammonia is the amount of ammonia released by heat treatment with which the surface temperature of the film becomes higher than or equal to 50° C. and lower than or equal to 650° C., preferably higher than or equal to 50° C. and lower than or equal to 550° C.

By using the above oxide insulating film for the insulating films 4120 and 4160, a shift in the threshold voltage of the transistor can be reduced, which leads to reduced fluctuations in the electrical characteristics of the transistor.

For the conductive film 4170 functioning as a gate electrode layer, for example, a conductive film formed using Al, Ti, Cr, Co, Ni, Cu, Y, Zr, Mo, Ru, Ag, Mn, Nd, Sc, Ta, W, or the like can be used. Alternatively, an alloy or a conductive nitride of any of these materials may be used. Alternatively, a stack of a plurality of materials selected from these materials, alloys of these materials, and conductive nitrides of these materials may be used. Typically, tungsten, a stack of tungsten and titanium nitride, a stack of tungsten and tantalum nitride, or the like can be used. Alternatively, Cu or an alloy such as Cu—Mn, which has low resistance, or a stack of any of the above materials and Cu or an alloy such as Cu—Mn may be used.

As the insulating film 4175, a silicon nitride film, an aluminum nitride film, or the like containing hydrogen can be used. In the transistors 4103, 4104, 4106, 4109, 4110, and 4112 described in Embodiment 4, when an insulating film containing hydrogen is used as the insulating film 4175, part of the oxide semiconductor film can have n-type conductivity. In addition, a nitride insulating film functions as a blocking film against moisture and the like and can improve the reliability of the transistor.

An aluminum oxide film can also be used as the insulating film 4175. It is particularly preferable to use an aluminum oxide film as the insulating film 4175 in the transistors 4101, 4102, 4105, 4107, 4108, and 4111 described in Embodiment 4. The aluminum oxide film has a high blocking effect of preventing penetration of both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor film 4130, preventing release of oxygen from the oxide semiconductor film, and preventing unnecessary release of oxygen from the insulating film 4120. Furthermore, oxygen contained in the aluminum oxide film can be diffused into the oxide semiconductor film.

Furthermore, the insulating film 4180 is preferably formed over the insulating film 4175. The insulating film 4180 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating film 4180 may be a stack of any of the above materials.

Here, like the insulating film 4120, the insulating film 4180 preferably contains oxygen more than that in the stoichiometric composition. Oxygen released from the insulating film 4180 can be diffused into the channel formation region in the oxide semiconductor film 4130 through the insulating film 4160, so that oxygen vacancies formed in the channel formation region can be filled with oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. In particular, a decrease in channel width causes a reduction in on-state current.

In the transistors 4107 to 4112 in one embodiment of the present invention, the insulating film 4130c is formed to cover the oxide semiconductor film 4130b where a channel is formed; thus, a channel formation layer is not in contact with the gate insulating film. Accordingly, scattering of carriers at the interface between the channel formation layer and the gate insulating film can be reduced and the on-state current of the transistor can be increased.

In the transistor in one embodiment of the present invention, as described above, the conductive film 4170 is formed to electrically surround the oxide semiconductor film 4130 in the channel width direction; accordingly, a gate electric field is applied to the oxide semiconductor film 4130 in the side surface direction in addition to the perpendicular direction. In other words, a gate electric field is applied to the entire channel formation layer and effective channel width is increased, leading to a further increase in the on-state current.

Furthermore, in the transistor in one embodiment of the present invention in which the oxide semiconductor film 4130 has a two-layer structure or a three-layer structure, since the oxide semiconductor film 4130b where a channel is formed is provided over the insulating film 4130a, an effect of making an interface state less likely to be formed is obtained. In the transistor in one embodiment of the present invention in which the oxide semiconductor film 4130 has a three-layer structure, since the oxide semiconductor film 4130b is positioned at the middle of the three-layer structure, an effect of eliminating the influence of an impurity that enters from upper and lower layers on the oxide semiconductor film 4130b is obtained as well. Therefore, the transistor can achieve not only the increase in the on-state current of the transistor but also stabilization of the threshold voltage and a reduction in the S value (subthreshold value). Thus, current when gate voltage VG is 0 V can be reduced and power consumption can be reduced. In addition, since the threshold voltage of the transistor becomes stable, long-term reliability of the semiconductor device can be improved. Furthermore, the transistor in one embodiment of the present invention is suitable for a highly integrated semiconductor device because deterioration of electrical characteristics due to miniaturization is reduced.

Although the variety of films such as the metal films, the semiconductor films, and the inorganic insulating films which are described in this embodiment typically can be formed by a sputtering method or a plasma CVD (chemical vapor deposition) method, such films may be formed by another method, e.g., a thermal CVD method. A metal organic chemical vapor deposition (MOCVD) method or an atomic layer deposition (ALD) method may be employed as an example of a thermal CVD method.

Since plasma is not used for deposition, thermal CVD has an advantage that no defect due to plasma damage is generated.

Deposition by thermal CVD may be performed in such a manner that a source gas and an oxidizer are supplied to the chamber at the same time, the pressure in the chamber is set to an atmospheric pressure or a reduced pressure, and reaction is caused in the vicinity of the substrate or over the substrate.

Deposition by ALD is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and then, the second source gas introduced is adsorbed and reacted. As a result, a second layer is stacked over the first layer, so that a thin film is formed. The sequence of gas introduction is controlled and repeated more than once until desired thickness is obtained, so that a thin film with excellent step coverage can be formed. The thickness of the thin film can be adjusted by the number of repetition times of the sequence of gas introduction; therefore, ALD makes it possible to accurately adjust thickness and thus is suitable for manufacturing a minute FET.

The variety of films such as the metal film, the semiconductor film, and the inorganic insulating film that have been disclosed in the embodiments can be formed by thermal CVD such as MOCVD or ALD. For example, in the case where an In—Ga—Zn—O film is formed, trimethylindium ($In(CH_3)_3$), trimethylgallium ($Ga(CH_3)_3$), and dimethylzinc ($Zn(CH_3)_2$) can be used. Without limitation to the above combination, triethylgallium ($Ga(C_2H_5)_3$) can be used instead of trimethylgallium and diethylzinc ($Zn(C_2H_5)_2$) can be used instead of dimethylzinc.

For example, in the case where a hafnium oxide film is formed by a deposition apparatus using ALD, two kinds of gases, i.e., ozone ($O_3$) as an oxidizer and a source material gas which is obtained by vaporizing liquid containing a solvent and a hafnium precursor (hafnium alkoxide and a hafnium amide such as tetrakis(dimethylamide)hafnium (TDMAH, $Hf[N(CH_3)_2]_4$) and tetrakis(ethylmethylamide) hafnium) are used.

For example, in the case where an aluminum oxide film is formed by a deposition apparatus using ALD, two kinds of gases, i.e., $H_2O$ as an oxidizer and a source gas which is obtained by vaporizing liquid containing a solvent and an aluminum precursor (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus using ALD, hexachlorodisilane is adsorbed on a surface where a film is to be formed, and radicals of an oxidizing gas (e.g., $O_2$ or dinitrogen monoxide) are supplied to react with an adsorbate.

For example, in the case where a tungsten film is formed by a deposition apparatus using ALD, a $WF_6$ gas and a $B_2H_6$ gas are sequentially introduced to form an initial tungsten film, and then a $WF_6$ gas and an $H_2$ gas are sequentially introduced to form a tungsten film. Note that an $SiH_4$ gas may be used instead of a $B_2H_6$ gas.

For example, in the case where an oxide semiconductor film, e.g., an In—Ga—Zn—O film is formed by a deposition apparatus using ALD, an $In(CH_3)_3$ gas and an $O_3$ gas are sequentially introduced to form an In—O layer, a $Ga(CH_3)_3$ gas and an $O_3$ gas are sequentially introduced to form a Ga—O layer, and then a $Zn(CH_3)_2$ gas and an $O_3$ gas are sequentially introduced to form a Zn—O layer. Note that the order of these layers is not limited to this example. A mixed compound layer such as an In—Ga—O layer, an In—Zn—O layer, or a Ga—Zn—O layer may be formed by using these gases. Although an $H_2O$ gas which is obtained by bubbling with an inert gas such as Ar may be used instead of an $O_3$ gas, it is preferable to use an $O_3$ gas, which does not contain H.

A facing-target-type sputtering apparatus can be used for deposition of an oxide semiconductor film. Deposition using the facing-target-type sputtering apparatus can also be referred to as vapor deposition SP (VDSP).

When an oxide semiconductor film is deposited using a facing-target-type sputtering apparatus, plasma damage to the oxide semiconductor film at the time of deposition can be reduced. Thus, oxygen vacancies in a film can be reduced. In addition, the use of the facing-target-type sputtering apparatus enables low-pressure deposition. Accordingly, the concentration of impurities (e.g., hydrogen, a rare gas (e.g., argon), or water) in a deposited oxide semiconductor film can be lowered.

The structure described above in this embodiment can be combined with any of the structures described in the other embodiments as appropriate.

Embodiment 6

In this embodiment, a structure of an oxide semiconductor film which can be used for one embodiment of the present invention is described.

An oxide semiconductor film is classified into, for example, a non-single-crystal oxide semiconductor film and a single crystal oxide semiconductor film or into a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. Examples of a crystalline oxide semiconductor include a single crystal oxide semiconductor, a CAAC-OS, a polycrystalline oxide semiconductor, and a microcrystalline oxide semiconductor.

First, a CAAC-OS film is described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, in the high-resolution TEM image, a boundary between crystal parts, that is, a grain boundary is not clearly observed. Thus, in the CAAC-OS film, a reduction in electron mobility due to the grain boundary is less likely to occur.

From the high-resolution cross-sectional TEM image of the CAAC-OS film observed in a direction substantially parallel to a sample surface, metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged to be parallel to the formation surface or the top surface of the CAAC-OS film.

On the other hand, from the high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. When the CAAC-OS film including an InGaZnO$_4$ crystal is analyzed by an out-of-plane method, for example, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

A microcrystalline oxide semiconductor film has a region where a crystal part is observed in a high resolution TEM image and a region where a crystal part is not clearly observed in a high resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high resolution TEM image of the nc-OS film, a grain boundary cannot be found clearly in the nc-OS film sometimes for example.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the diameter of a crystal part, a peak which shows a crystal plane does not appear. A diffraction pattern like a halo pattern appears in a selected-area electron diffraction pattern of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film; hence, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Further, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. In the high-resolution TEM image, there are a region where a crystal part is clearly observed and a region where a crystal part is not observed. In the amorphous-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal.

The density of an oxide semiconductor film might vary depending on its structure. For example, if the composition of an oxide semiconductor film is determined, the structure of the oxide semiconductor film can be estimated from a comparison between the density of the oxide semiconductor film and the density of a single crystal oxide semiconductor film having the same composition as the oxide semiconductor film. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor film whose density is lower than 78% of the density of the single crystal oxide semiconductor film.

Specific examples of the above description are given. For example, in the case of an oxide semiconductor film with an atomic ratio of In:Ga:Zn=1:1:1, the density of single-crystal $InGaZnO_4$ with a rhombohedral crystal structure is 6.357 $g/cm^3$. Thus, for example, in the case of the oxide semiconductor film with an atomic ratio of In:Ga:Zn=1:1:1, the density of an a-like OS film is higher than or equal to 5.0 $g/cm^3$ and lower than 5.9 $g/cm^3$. In addition, for example, in the case of the oxide semiconductor film with an atomic ratio of In:Ga:Zn=1:1:1, the density of an nc-OS film or a CAAC-OS film is higher than or equal to 5.9 $g/cm^3$ and lower than 6.3 $g/cm^3$.

Note that single crystals with the same composition do not exist in some cases. In such a case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

Embodiment 7

An imaging device in one embodiment of the present invention and a semiconductor device including the imaging device can be used for display devices, personal computers, or image reproducing devices provided with recording media (typically, devices that reproduce the content of recording media such as digital versatile discs (DVD) and have displays for displaying the reproduced images). Furthermore, as electronic devices that can include the imaging device in one embodiment of the present invention and the semiconductor device including the imaging device, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 39A to 39F illustrate specific examples of these electronic devices.

Figure 39A:
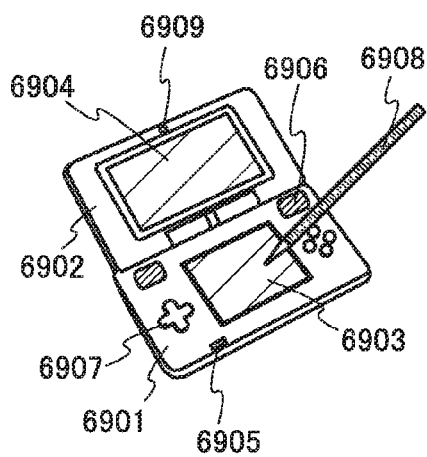
FIGS. 39A to 39F are diagrams each illustrating an electronic device.

FIG. 39A illustrates a portable game machine, which includes housings 6901 and 6902, display portions 6903 and 6904, a microphone 6905, speakers 6906, an operation key 6907, a stylus 6908, a camera 6909, and the like. Although the portable game machine in FIG. 39A includes the two display portions 6903 and 6904, the number of display portions included in the portable game machine is not limited to this. The imaging device in one embodiment of the present invention can be used for the camera 6909.

Figure 39B:
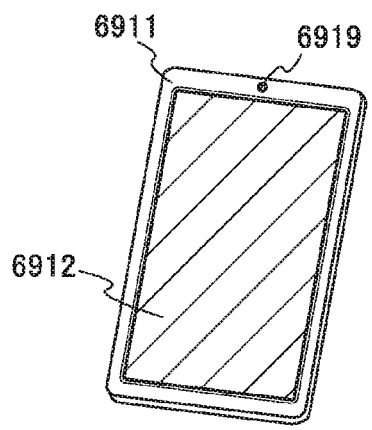

FIG. 39B illustrates a portable data terminal, which includes a first housing 6911, a display portion 6912, a camera 6919, and the like. The touch panel function of the display portion 6912 enables input and output of information. The imaging device in one embodiment of the present invention can be used for the camera 6919.

Figure 39C:
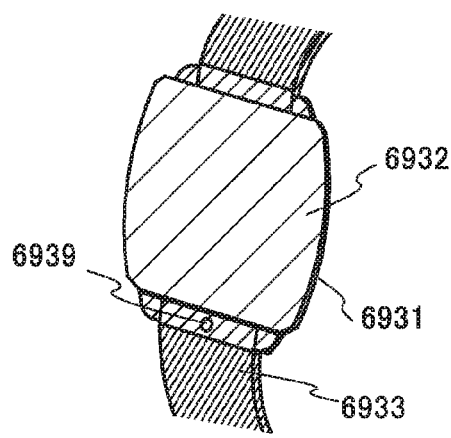

FIG. 39C illustrates a wrist-watch-type information terminal, which includes a housing 6931, a display portion 6932, a wristband 6933, a camera 6939, and the like. The display portion 6932 may be a touch panel. The imaging device in one embodiment of the present invention can be used for the camera 6939.

Figure 39D:
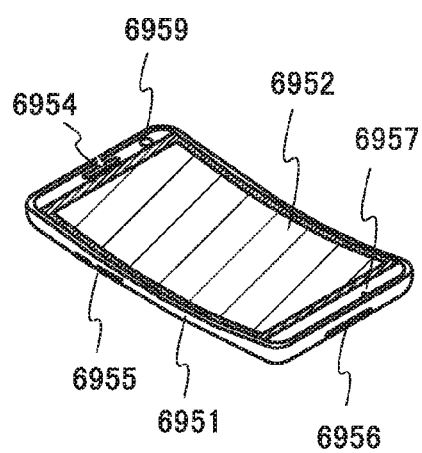

FIG. 39D illustrates a cellular phone, which includes a display portion 6952, a microphone 6957, a speaker 6954, a camera 6959, an input/output terminal 6956, an operation button 6955, and the like in a housing 6951. The imaging device in one embodiment of the present invention can be used for the camera 6959.

Figure 39E:
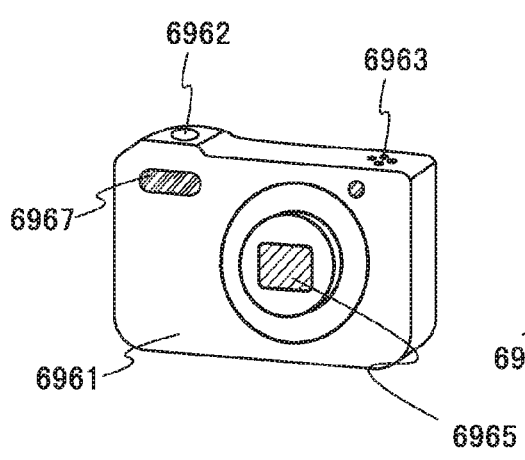

FIG. 39E illustrates a digital camera, which includes a housing 6961, a shutter button 6962, a microphone 6963, a light-emitting portion 6967, a lens 6965, and the like. The imaging device in one embodiment of the present invention can be used provided in a focus of the lens 6965.

Figure 39F:
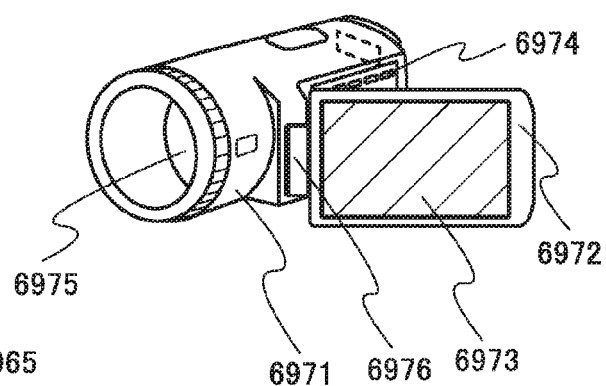

FIG. 39F illustrates a video camera, which includes a first housing 6971, a second housing 6972, a display portion 6973, operation keys 6974, a lens 6975, a joint 6976, and the like. The operation keys 974 and the lens 975 are provided in the first housing 6971, and the display portion 6973 is provided in the second housing 6972. The first housing 6971 and the second housing 6972 are connected to each other with the joint 6976, and an angle between the first housing 6971 and the second housing 6972 can be changed with the joint 6976. An image displayed on the display portion 6973 may be switched in accordance with the angle between the first housing 6971 and the second housing 6972 at the joint 6976. The imaging device in one embodiment of the present invention can be provided in a focus of the lens 6975.

This embodiment can be combined with any of the other embodiments described in this specification as appropriate.

This application is based on Japanese Patent Application serial no. 2015-076420 filed with Japan Patent Office on Apr. 3, 2015, the entire contents of which are hereby incorporated by reference.

What is claimed is:

1. An imaging device comprising a plurality of pixels, each of the plurality of pixels comprising:
   a photodiode;
   a first transistor;
   a second transistor;
   a third transistor; and
   a fourth transistor,
   wherein one electrode of the photodiode is electrically connected to one of a source electrode and a drain electrode of the first transistor,
   wherein the other of the source electrode and the drain electrode of the first transistor is electrically connected to a gate electrode of the second transistor and one of a source electrode and a drain electrode of the third transistor,
   wherein one of a source electrode and a drain electrode of the second transistor is electrically connected to one of a source electrode and a drain electrode of the fourth transistor,
   wherein the first transistor, the second transistor, and the third transistor each comprise a back gate electrode,
   wherein the back gate electrode of the first transistor is electrically connected to a wiring that supplies a potential higher than a source potential of the first transistor and a potential lower than the source potential of the first transistor,
   wherein the back gate electrode of the second transistor is electrically connected to a wiring that supplies a potential higher than a source potential of the second transistor, and
   wherein the back gate electrode of the third transistor is electrically connected to a wiring that supplies a potential higher than a source potential of the third transistor and a potential lower than the source potential of the third transistor.

2. The imaging device according to claim 1,
   wherein the back gate electrodes of the first transistor and the third transistor are electrically connected to a first wiring,
   wherein the back gate electrode of the second transistor is electrically connected to a second wiring,
   wherein the first wiring is shared among the pixels arranged in a same row or column and the pixels arranged in one of the two adjacent rows or columns, and
   wherein the second wiring is shared among the pixels arranged in the same row or column and the pixels arranged in one of the two adjacent rows or columns.

3. The imaging device according to claim 2,
   wherein the first wiring is shared among the pixels arranged in the same row or column and the pixels which are arranged in one of the two adjacent rows or columns and provided on a side which is not interposed between the second transistors when seen from above or below, and
   wherein the second wiring is shared among the pixels arranged in the same row or column and the pixels which are arranged in one of the two adjacent rows or columns and provided on a side which is not interposed between the first transistors and between the third transistors when seen from above or below.

4. The imaging device according to claim 1, further comprising a fifth transistor,
- wherein one of a source electrode and a drain electrode of the fifth transistor is electrically connected to the other of the source electrode and the drain electrode of the second transistor,
- wherein the fifth transistor comprises a back gate electrode, and
- wherein the back gate electrode of the fifth transistor is electrically connected to a wiring that supplies a potential higher than a source potential of the fifth transistor.

5. The imaging device according to claim 1,
- wherein the photodiode comprises a photoelectric conversion film, and
- wherein the photoelectric conversion film comprises selenium.

6. The imaging device according to claim 1, wherein the first transistor, the second transistor, the third transistor, and the fourth transistor each comprises an oxide semiconductor layer.

7. An electronic device comprising:
the imaging device according to claim 1; and
a display device.

8. An imaging device comprising a plurality of pixels, each of the plurality of pixels comprising:
a photodiode;
a first transistor;
a second transistor;
a third transistor; and
a fourth transistor,
- wherein one electrode of the photodiode is electrically connected to one of a source electrode and a drain electrode of the first transistor,
- wherein the other of the source electrode and the drain electrode of the first transistor is electrically connected to a gate electrode of the second transistor and one of a source electrode and a drain electrode of the third transistor,
- wherein one of a source electrode and a drain electrode of the second transistor is electrically connected to one of a source electrode and a drain electrode of the fourth transistor,
- wherein the first transistor, the second transistor, the third transistor, and the fourth transistor each comprise a back gate electrode,
- wherein the back gate electrode of the first transistor is electrically connected to a wiring that supplies a potential higher than a source potential of the first transistor and a potential lower than the source potential of the first transistor,
- wherein the back gate electrode of the second transistor is electrically connected to a wiring that supplies a potential higher than a source potential of the second transistor,
- wherein the back gate electrode of the third transistor is electrically connected to a wiring that supplies a potential higher than a source potential of the third transistor and a potential lower than the source potential of the third transistor, and
- wherein the back gate electrode of the fourth transistor is electrically connected to a wiring that supplies a potential higher than a source potential of the fourth transistor.

9. The imaging device according to claim 8,
- wherein the back gate electrodes of the first transistor and the third transistor are electrically connected to a first wiring,
- wherein the back gate electrodes of the second transistor and the fourth transistor are electrically connected to a second wiring,
- wherein the first wiring is shared among the pixels arranged in a same row or column and the pixels arranged in one of the two adjacent rows or columns, and
- wherein the second wiring is shared among the pixels arranged in the same row or column and the pixels arranged in one of the two adjacent rows or columns.

10. The imaging device according to claim 9,
- wherein the first wiring is shared among the pixels arranged in the same row or column and the pixels which are arranged in one of the two adjacent rows or columns and provided on a side which is not interposed between the second transistors and between the fourth transistors when seen from above or below, and
- wherein the second wiring is shared among the pixels arranged in the same row or column and the pixels which are arranged in one of the two adjacent rows or columns and provided on a side which is not interposed between the first transistors and between the third transistors when seen from above or below.

11. The imaging device according to claim 8,
- wherein the back gate electrodes of the first transistor, the third transistor, and the fourth transistor are electrically connected to a first wiring,
- wherein the back gate electrode of the second transistor is electrically connected to a second wiring,
- wherein the first wiring is shared among the pixels arranged in a same row or column and the pixels arranged in one of the two adjacent rows or columns, and
- wherein the second wiring is shared among the pixels arranged in the same row or column and the pixels arranged in one of the two adjacent rows or columns.

12. The imaging device according to claim 11,
- wherein the first wiring is shared among the pixels arranged in the same row or column and the pixels which are arranged in one of the two adjacent rows or columns and provided on a side which is not interposed between the second transistors when seen from above or below, and
- wherein the second wiring is shared among the pixels arranged in the same row or column and the pixels which are arranged in one of the two adjacent rows or columns and provided on a side which is not interposed between the first transistors, between the third transistors, and between the fourth transistors when seen from above or below.

13. The imaging device according to claim 8, further comprising a fifth transistor,
- wherein one of a source electrode and a drain electrode of the fifth transistor is electrically connected to the other of the source electrode and the drain electrode of the second transistor,
- wherein the fifth transistor comprises a back gate electrode, and
- wherein the back gate electrode of the fifth transistor is electrically connected to a wiring that supplies a potential higher than a source potential of the fifth transistor.

14. The imaging device according to claim 8,
- wherein the photodiode comprises a photoelectric conversion film, and
- wherein the photoelectric conversion film comprises selenium.

15. The imaging device according to claim 8, wherein the first transistor, the second transistor, the third transistor, and the fourth transistor each comprises an oxide semiconductor layer.

16. An electronic device comprising:
the imaging device according to claim 8; and
a display device.

17. An imaging device comprising a plurality of pixels, each of the plurality of pixels comprising:
a photodiode;
a first transistor;
a second transistor;
a third transistor; and
a fourth transistor,
wherein one electrode of the photodiode is electrically connected to one of a source electrode and a drain electrode of the first transistor,
wherein the other of the source electrode and the drain electrode of the first transistor is electrically connected to a gate electrode of the second transistor and one of a source electrode and a drain electrode of the third transistor,
wherein one of a source electrode and a drain electrode of the second transistor is electrically connected to one of a source electrode and a drain electrode of the fourth transistor,
wherein the second transistor comprises a back gate electrode, and
wherein the back gate electrode of the second transistor is electrically connected to a wiring that supplies a potential higher than a source potential of the second transistor.

18. The imaging device according to claim 17, further comprising a fifth transistor,
wherein one of a source electrode and a drain electrode of the fifth transistor is electrically connected to the other of the source electrode and the drain electrode of the second transistor,
wherein the fifth transistor comprises a back gate electrode, and
wherein the back gate electrode of the fifth transistor is electrically connected to a wiring that supplies a potential higher than a source potential of the fifth transistor.

19. The imaging device according to claim 17,
wherein the photodiode comprises a photoelectric conversion film, and
wherein the photoelectric conversion film comprises selenium.

20. The imaging device according to claim 17, wherein the first transistor, the second transistor, the third transistor, and the fourth transistor each comprises an oxide semiconductor layer.

21. An electronic device comprising:
the imaging device according to claim 17; and
a display device.

* * * * *